United States Patent
Lee et al.

(10) Patent No.: US 11,177,403 B2
(45) Date of Patent: Nov. 16, 2021

(54) PEROVSKITE SOLAR CELL

(71) Applicant: KOREA RESEARCH INSTITUTE OF CHEMICAL TECHNOLOGY, Daejeon (KR)

(72) Inventors: Jaemin Lee, Daejeon (KR); Hye Jin Na, Seoul (KR); Nam Joong Jeon, Gwangju (KR); Tae Youl Yang, Daejeon (KR); Jang Won Seo, Seoul (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days.

(21) Appl. No.: 16/627,123

(22) PCT Filed: Jun. 29, 2018

(86) PCT No.: PCT/KR2018/007412
§ 371 (c)(1),
(2) Date: Dec. 27, 2019

(87) PCT Pub. No.: WO2019/004781
PCT Pub. Date: Jan. 3, 2019

(65) Prior Publication Data
US 2020/0119206 A1  Apr. 16, 2020

(30) Foreign Application Priority Data
Jun. 30, 2017 (KR) .......................... 10-2017-0083778

(51) Int. Cl.
*H01L 31/0256* (2006.01)
*H01L 51/00* (2006.01)
*H01L 51/42* (2006.01)
*H01L 51/44* (2006.01)

(52) U.S. Cl.
CPC ...... *H01L 31/0256* (2013.01); *H01L 51/0077* (2013.01); *H01L 51/4226* (2013.01); *H01L 51/441* (2013.01); *H01L 51/447* (2013.01); *H01L 2031/0344* (2013.01)

(58) Field of Classification Search
CPC .................. H01L 51/5048; H01L 51/5056
See application file for complete search history.

(56) References Cited

FOREIGN PATENT DOCUMENTS

| CN | 103589419 A | * | 2/2014 |
| CN | 103589419 A | | 2/2014 |
| CN | 105198792 A | | 12/2015 |
| JP | 2012-023266 A | | 2/2012 |
| JP | 2012023266 A | * | 2/2012 |
| WO | 2014-170839 A2 | | 10/2014 |

OTHER PUBLICATIONS

English machine translation of Kawasaki et al. (JP-2012023266-A) provided by the EPO website. All Pages. 2021. (Year: 2021).*
English machine translation of Zhichao et al. (CN 103589419 A) provided by the EPO website. All Pages. (Year: 2021).*
STN structure search conducted by the Examiner for U.S. Appl. No. 16/627,123, 2021. All Pages. (Year: 2021).*
Ullah et al., "Organic functional materials based buffer layers for efficient perovskite solar cells", Chinese Chemical Letters, vol. 28—10 pages (2017).
International Search Report of corresponding PCT Application No. PCT/KR2018/007412—4 pages (dated Sep. 27, 2018).
Burschka et al., "Sequential deposition as a route to high-performance perovskite-sensitized solar cells", Nature, vol. 499—5 pages (Jul. 18, 2013).

* cited by examiner

*Primary Examiner* — Daniel P Malley, Jr.
(74) *Attorney, Agent, or Firm* — Knobbe Martens Olson & Bear LLP

(57) ABSTRACT

A perovskite solar cell adopts a compound having a specific central backbone having a carbazolylamino group as a substituent, and more particularly, to the perovskite solar cell adopts a compound, as a hole transport material, having a specific central backbone having a carbazolylamino group as a substituent, and a spirobifluorene compound having a carbazolylphenylamino group. The perovskite solar cell has very excellent high-temperature stability while having a high power generation efficiency.

5 Claims, No Drawings

PEROVSKITE SOLAR CELL

TECHNICAL FIELD

The present invention relates to a perovskite solar cell, and more particularly, to a compound used as a hole transport compound of a perovskite solar cell and having one or more carbazolylamino groups as a substituent, and a perovskite solar cell including the same.

BACKGROUND ART

In order to solve the problems of depletion of fossil fuel and global environmental issues due to the use thereof, studies on a recyclable and clean alternative energy source such as solar energy, wind power, and water power, have been actively conducted.

Among them, there is a significantly growing interest in a solar cell that directly converts energy from sunlight to electrical energy. Here, the solar cell refers to a cell that generates current-voltage using a photovoltaic effect in which a cell absorbs sunlight to generate an electron and a hole.

Recently, an n-p diode-type silicon (Si) single crystal-based solar cell having a light energy conversion efficiency higher than 20% may be manufactured and actually has been used in solar power generation, and there is a solar cell using a compound semiconductor such as gallium arsenide (GaAs) which has a better conversion efficiency than the n-p diode-type Si single crystal-based solar cell.

However, in the case of an inorganic semiconductor-based solar cell, since a very highly purified material is required for higher efficiency, much energy is consumed in purification of raw materials, and expensive processing equipment is required for a single crystallization process or a thin film forming process using a raw material and thus, there is a limitation in lowering manufacturing costs of a solar cell, which causes an obstacle to large-scale utilization.

Accordingly, in order to manufacture a solar cell at low cost, costs of a core material in a solar cell or costs for a manufacturing process need to be greatly reduced, and as an alternative to the inorganic semiconductor-based solar cell, studies on a dye-sensitized solar cell and an organic solar cell that may be manufactured by an inexpensive material and process have been actively conducted.

In the case of the organic solar cell, an element manufacturing process is simple as compared with a conventional solar cell due to easy processability, versatility, and low cost of organic materials, thereby realizing a lower manufacturing cost than the conventional solar cell. However, the efficiency of the organic solar cell may be rapidly lowered by deterioration of a structure of BHJ due to moisture or oxygen in the air, that is, there is a big problem in stability of the solar cell. In a case where a complete sealing technique is introduced as a method for solving the problem, the stability may be increased, but the costs therefor may be raised.

Meanwhile, a perovskite solar cell, specifically, a lead halide perovskite solar cell, has been developed for several years, and as a result, the efficiency of the perovskite solar cell has increased to 21% by a photoactive layer made of a perovskite material having excellent characteristics. In order to solve the problems of the organic solar cell as mentioned above, studies for achieving a high efficiency by applying Spiro-OMeTAD to a perovskite solar cell (J. Burschka, N. Pellet, S.-J. Moon, R. Humphry-Baker, P. Gao, M. K. Nazeeruddin and M. Grötzel, *Nature,* 2013, 499, 316-319) have been conducted.

However, satisfactory efficiency that can be commercialized has yet to be obtained, and a high efficiency solar cell is still required.

DISCLOSURE

Technical Problem

An object of the present invention is to provide a high efficiency inorganic/organic hybrid perovskite solar cell including a compound having a carbazolylamino group.

Further, another object of the present invention is to provide a spirobifluorene compound used as a hole transport material of a perovskite solar cell and having a new carbazolylamino group.

Technical Solution

In one general aspect, there is provided a high efficiency inorganic/organic hybrid perovskite solar cell, and more particularly, a perovskite solar cell including a compound represented by the following Formula 1 and having a carbazolylamino group as a substituent.

[Formula 1]

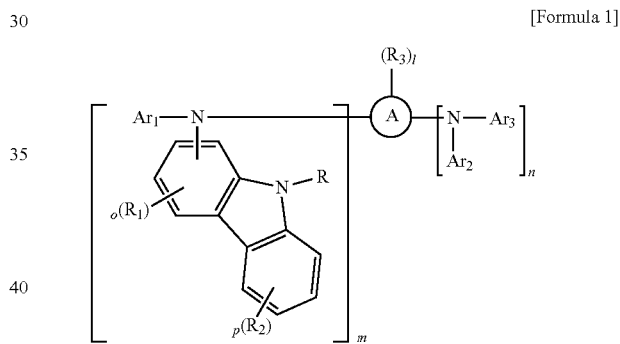

(In Formula 1,
A is a tetravalent functional group selected from the following structural formulas,

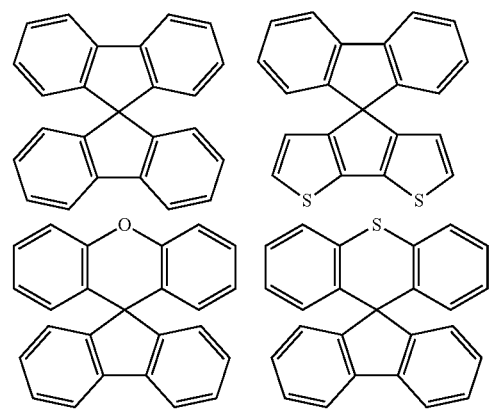

$Ar_1$ to $Ar_3$ are each independently (C6-C20)aryl,
R is hydrogen, (C1-C20)alkyl, or (C6-C20)aryl, $R_1$ and $R_2$ are each independently halogen, (C1-C20)alkyl, (C1-C20)alkoxy, (C6-C20)aryl, (C6-C20)aryloxy, (C6-C20)arylthio, or (C1-C20)alkylthio, $R_3$ is hydrogen, halogen, (C1-C20)alkyl, or (C6-C20)aryl, each aryl of $Ar_1$ to $Ar_3$ may be further substituted with one or more substituents selected from (C1-C20)alkyl, (C1-C20)alkoxy, (C6-C20)aryl, (C6-C20)aryloxy, (C6-C20)arylthio, and (C1-C20)alkylthio, o is an integer of 0 to 3, p is an integer of 0 to 4, and when o and p are 2 or more, $R_1$ and $R_2$ may be each independently the same as or different from each other, l is an integer of 4-m-n, and m is an integer of 1 to 4, n is an integer of 0 or 1 to 3, and n+m is 4.)

Preferably, in Formula 1, $Ar_1$ to $Ar_3$ may be each independently (C6-C12)aryl substituted with one or more selected from (C1-C20)alkoxy, (C6-C20)aryloxy, (C6-C20)arylthio, and (C1-C20)alkylthio.

Preferably, Formula 1 of the present invention may be represented by the following Formula 2.

[Formula 2]

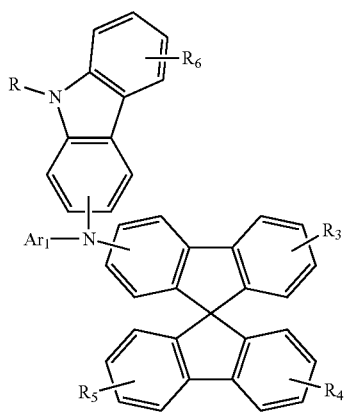

(In Formula 2, $Ar_1$ is (C6-C20)aryl,

R is hydrogen, (C1-C20)alkyl, or (C6-C20)aryl, $R_3$ to $R_5$ are each independently hydrogen, halogen, (C1-C20)alkyl, (C6-C20)aryl, —N($Ar_2$)($Ar_3$), or

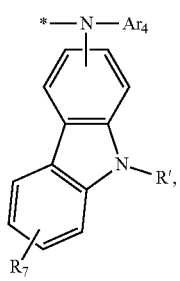

$R_6$ is halogen, (C1-C20)alkyl, (C1-C20)alkoxy, or (C1-C20)alkylthio, $Ar_2$ to $Ar_4$ are each independently (C6-C20)aryl, and R' is hydrogen, (C1-C20)alkyl, or (C6-C20)aryl, and each aryl of $Ar_1$ to $Ar_4$ may be further substituted with one or more substituents selected from (C1-C20)alkyl, (C1-C20)alkoxy, (C6-C20)aryloxy, (C6-C20)arylthio, and (C1-C20)alkylthio.)

Preferably, in Formula 2, $R_3$ to $R_5$ are each independently —N($Ar_2$)($Ar_3$) or

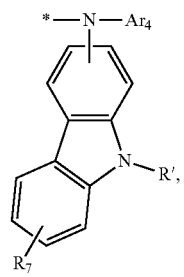

$Ar_2$ to $Ar_4$ are each independently (C6-C12)aryl, and R' is hydrogen, (C1-C10)alkyl, or (C6-C12)aryl, each aryl of $Ar_1$ to $Ar_4$ may be further substituted with one or more substituents selected from (C1-C10)alkoxy, (C6-C12)aryloxy, (C6-C12)arylthio, and (C1-C10)alkylthio, $R_6$ and $R_7$ may be each independently (C1-C10)alkoxy, and more preferably, $Ar_1$ to $Ar_4$ may be each independently phenyl substituted with (C1-C10)alkoxy.

Preferably, Formula 1 of the present invention may be represented by the following Formula 3 or Formula 4.

[Formula 3]

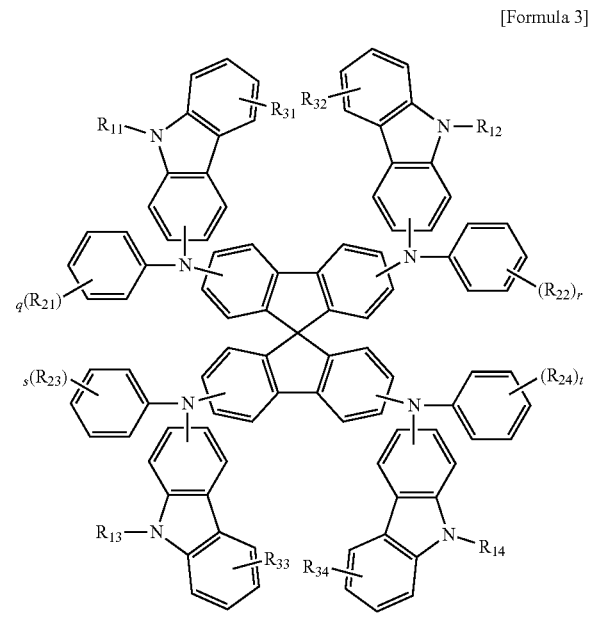

[Formula 4]

[Formula 5]

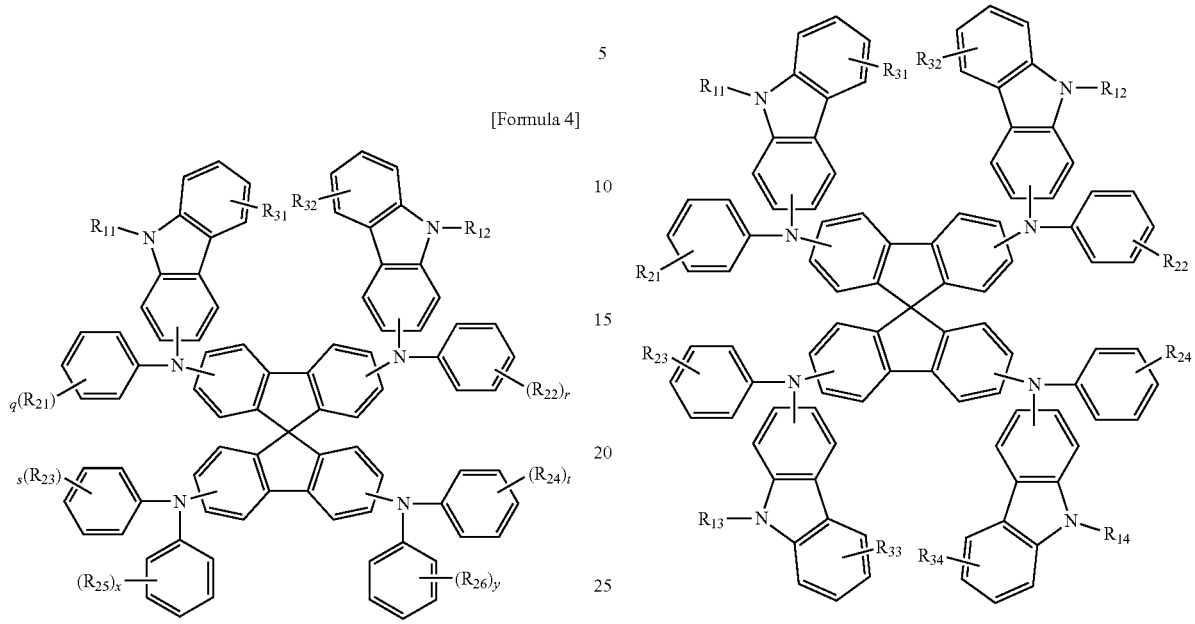

(In Formula 3 and Formula 4, $R_{11}$ to $R_{14}$ are each independently hydrogen, (C1-C10) alkyl, or (C6-C12)aryl;

$R_{21}$ to $R_{26}$ are each independently (C1-C10) alkoxy, (C1-C20)alkylthio, (C6-C12)arylthio, or (C6-C12)aryloxy; q, r, s, t, x, and y are each independently an integer of 1 to 5, and when q, r, s, t, x, and y are 2 or more, $R_{21}$ to $R_{26}$ may be each independently the same as or different from each other; and $R_{31}$ to $R_{34}$ are each independently (C1-C10)alkoxy, (C6-C12)arylthio, (C6-C12)aryloxy, or (C1-C10)alkylthio.)

Preferably, in Formulas 3 and 4, $R_{11}$ to $R_{14}$ are each independently (C1-C5)alkyl or (C6-C12)aryl;

$R_{21}$ to $R_{26}$ are each independently (C1-C5)alkoxy; and q, r, s, t, x, and y may be each independently an integer of 1 or 2.

The compound having a carbazolylamino group as a substituent of the present invention may be used as a hole transport material of a perovskite solar cell.

Specifically, the perovskite solar cell of the present invention may include a first electrode, an electron transport layer formed on the first electrode, a light absorption layer formed on the electron transport layer and including a compound having a perovskite structure, a hole transport layer including a compound represented by Formula 1, and a second electrode formed on the hole transport layer.

In another general aspect, there is provided a new compound that may be used as a hole transport material of a perovskite solar cell, and the new compound of the present invention may be represented by the following Formula 5.

(In Formula 5, $R_{11}$ to $R_{14}$ are each independently hydrogen or (C1-C10) alkyl;

$R_{21}$ to $R_{24}$ are each independently (C1-C10)alkoxy; and $R_{31}$ to $R_{34}$ are each independently hydrogen, (C1-C10) alkyl, (C1-C10)alkoxy, (C6-C12)aryl, (C6-C12)arylthio, (C6-C12)aryloxy, or (C1-C10)arylthio.)

Advantageous Effects

The compound represented by Formula 1 and having a carbazolylamino group as a substituent, in particular, the spirobifluorene compound having a carbazolylamino group as a substituent, is used as the hole transport material of the inorganic/organic hybrid perovskite solar cell, such that the solar cell has a significantly improved efficiency as compared with the case of using a conventional Spiro-OMeTAD.

Furthermore, the compound represented by Formula 1 and having a carbazolylamino group as a substituent of the present invention is a monomolecule and has high purity, and unlike the conventional high molecular hole transport compound, may be prepared by a simple process and easily separated, such that the compound is very easily commercialized, thereby improving efficiency of the perovskite solar cell adopting the compound.

In addition, the inorganic/organic hybrid perovskite-based solar cell including the compound represented by Formula 1 and having a carbazolylamino group as a substituent of the present invention has high-temperature stability while having a high power generation efficiency.

Furthermore, the inorganic/organic hybrid perovskite-based solar cell of the present invention uses the compound having a carbazolylamino group of the present invention as a hole transport material, such that the solar cell may be manufactured by a simple process such as a solution coating method and may be manufactured within a short time at low cost, thereby increasing a commercialization level of a solar cell at low cost.

BEST MODE

Hereinafter, certain specific details are described in order to provide a thorough understanding of various exemplary embodiments of the present invention. However, those skilled in the art will understand that the present invention may be implemented without these details. Unless the context requires otherwise, throughout the present specification and claims, the word "comprise" and variations thereof, for example, "comprises" and "comprising" are to be construed in an open, inclusive sense (that is, as "including, but not limited to").

Reference throughout the present specification to "according to an exemplary embodiment" or "an exemplary embodiment" means that a particular feature, structure, or characteristic described in connection with the exemplary embodiment is included in at least one exemplary embodiment of the present invention. Thus, the appearances of the phrases "according to an exemplary embodiment" or "in an exemplary embodiment" in various places throughout the present specification are not necessarily all referring to the same exemplary embodiment. Furthermore, the particular feature, structure, or characteristic may be combined in any suitable manner in one or more exemplary embodiments.

The terms "alkyl", "alkoxy", and other substituents including an "alkyl" part described in the present invention include all linear and branched forms, and may have 1 to 20 carbon atoms, preferably 1 to 10 carbon atoms, and more preferably 1 to 7 carbon atoms.

In addition, the term "aryl" described in the present invention, which is an organic radical derived from aromatic hydrocarbon by removing one hydrogen atom therefrom, includes a single or fused ring system that contains preferably 4 to 7 ring atoms and preferably 5 or 6 ring atoms in each ring, and even includes a plurality of aryls linked by a single bond. Specific examples of aryl include phenyl, naphthyl, biphenyl, anthryl, indenyl, fluorenyl, and spirobifluorene, but are not limited thereto.

The term "heteroaryl" described in the present invention refers to an aryl group having 1 to 4 heteroatoms selected from B, N, O, S, P($=$O), Si, and P as an aromatic ring backbone atom and having carbon as a remaining aromatic ring backbone atom, includes 5- to 6-membered monocyclic heteroaryl and polycyclic heteroaryl condensed with at least one benzene ring, and may be partially saturated. In addition, heteroaryl in the present invention includes one or more heteroaryls linked by a single bond.

The term "alkenyl" described in the present invention alone or as a part of another group refers to a linear, branched, or cyclic hydrocarbon radical having 2 to 10 carbon atoms and at least one carbon-carbon double bond. A more preferred alkenyl radical is a lower alkenyl radical having 2 to about 6 carbon atoms. The most preferred lower alkenyl radical is a radical having 2 to about 4 carbon atoms. In addition, an alkenyl group may be substituted at any available attachment point. Examples of an alkenyl radical include ethenyl, propenyl, allyl, butenyl, and 4-methylbutenyl. The terms "alkenyl" and "lower alkenyl" include a radical having "cis" and "trans" orientations, or alternatively, "E" and "Z" orientations.

The term "alkynyl" described in the present invention alone or as a part of another group refers to a linear, branched, or cyclic hydrocarbon radical having 2 to 10 carbon atoms and at least one carbon-carbon triple bond. A more preferred alkynyl radical is a lower alkynyl radical having 2 to about 6 carbon atoms. The most preferred alkynyl radical is a lower alkynyl radical having 2 to about 4 carbon atoms. Examples of such a radical include propargyl and butynyl. In addition, an alkynyl group may be substituted at any available attachment point.

The term "alkyl or haloalkyl substituted with halogen" described in the present invention refers to that at least one hydrogen existing in alkyl is substituted with halogen.

The term "cycloalkyl" described in the present invention refers to a non-aromatic monocyclic or multicyclic ring system having 3 to 20 carbon atoms, and the monocyclic ring includes, but is not limited to, cyclopropyl, cyclobutyl, cyclopentyl, and cyclohexyl. Examples of multicyclic cycloalkyl include perhydronaphthyl and perhydroindenyl; and examples of bridged multicyclic cycloalkyl include adamantyl and norbornyl.

The term "heterocycloalkyl" described in the present invention refers to a substituted or unsubstituted non-aromatic 3- to 15-membered ring radical having a carbon atom and 1 to 5 heteroatoms selected from nitrogen, phosphorus, oxygen, and sulfur. The heterocycloalkyl radical may be a monocyclic, bicyclic, or tricyclic ring system that may be fused or bridged, or may include a spiro ring system. In addition, a nitrogen, phosphorus, carbon, oxygen, or sulfur atom in the heterocyclic ring radical may be optionally oxidized to various oxidation states. In addition, a nitrogen atom may be optionally quaternized.

The term "thioalkyl" described in the present invention refers to a radical of the formula —$SR_a$, where $R_a$ is an alkyl radical as defined above, the alkyl radical having 1 to 20 carbon atoms, at least 1 to 10 carbon atoms, at least 1 to 8 carbon atoms, at least 1 to 6 carbon atoms, or at least 1 to 4 carbon atoms.

The term "halogen" described in the present invention refers to bromo (bromine), chloro (chlorine), fluoro (fluorine), or iodo (iodine).

The term "carbazolylamino group" described in the present invention refers to an amino group substituted with and a carbazolyl group and a radical of —N(carbazolyl)$R_b$. $R_b$ is hydrogen or hydrocarbyl, and for example, may be alkyl having 1 to 20 carbon atoms, aryl having 6 to 20 carbon atoms, and preferably aryl. Hydrocarbyl of $R_b$, as a specific example, alkyl or aryl may be further substituted with one or more substituents selected from halogen, (C1-C20)alkyl, (C1-C20)alkoxy or (C1-C20)alkylthio, (C6-C20)aryloxy, and (C6-C20)arylthio.

The number of carbon atoms in alkyl, alkoxy, or the like described in the present invention does not include the number of carbon atoms of a substituent. As an example, (C1-C10)alkyl refers to alkyl having 1 to 10 carbon atoms not including the number of carbon atoms of a substituent of alkyl, and as a specific example, in the description of (C6-C12)aryl substituted with one or more selected from (C1-C20)alkoxy, (C6-C20)aryloxy, (C6-C20)arylthio, and (C1-C20)alkylthio, C6-C12 which is the number of carbon atoms of aryl does not include the number of carbon atoms of a substituent substituted for aryl.

Hereinafter, a perovskite solar cell adopting a compound, as a hole transport material, having a carbazolylamino group as a substituent, and a compound having a carbazolylamino group as a substituent are described in detail. Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

The present invention provides a perovskite solar cell including a compound represented by the following Formula 1 and having a carbazolylamino group as a substituent.

[Formula 1]

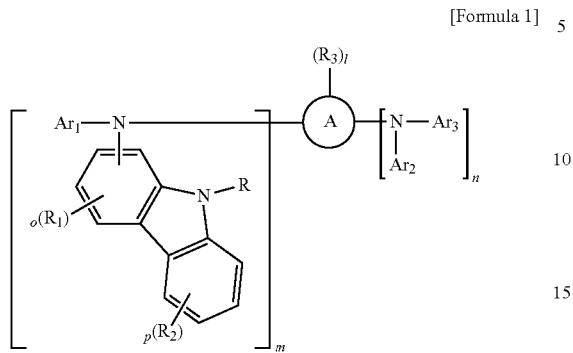

(In Formula 1,
A is a tetravalent functional group selected from the following structural formulas,

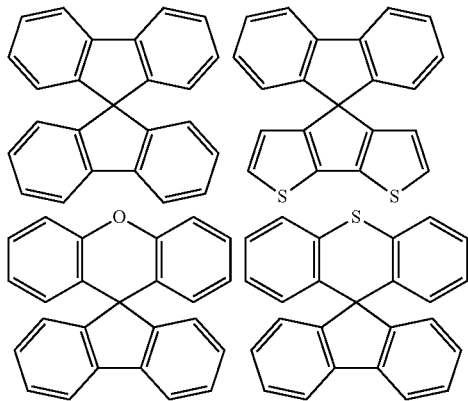

Ar$_1$ to Ar$_3$ are each independently (C6-C20)aryl,
R is hydrogen, (C1-C20)alkyl, or (C6-C20)aryl,
R$_1$ and R$_2$ are each independently halogen, (C1-C20)alkyl, (C1-C20)alkoxy, (C6-C20)aryl, (C6-C20)aryloxy, (C6-C20)arylthio, or (C1-C20)alkylthio,
R$_3$ is hydrogen, halogen, (C1-C20)alkyl, or (C6-C20)aryl, each aryl of Ar$_1$ to Ar$_3$ may be further substituted with one or more substituents selected from (C1-C20)alkyl, (C1-C20)alkoxy, (C6-C20)aryl, (C6-C20)aryloxy, (C6-C20)arylthio, and (C1-C20)alkylthio,
o is an integer of 0 to 3, p is an integer of 0 to 4, and when o and p are 2 or more, R$_1$ and R$_2$ may be each independently the same as or different from each other,
l is an integer of 4-m-n, and
m is an integer of 1 to 4, n is an integer of 0 or 1 to 3, and n+m is 4.)

The compound represented by Formula 1 and having a carbazolylamino group as a substituent is used as a hole transport material of a perovskite solar cell to remarkably improve the efficiency of the perovskite solar cell adopting the compound.

Specifically, the compound represented by Formula 1 and having a carbazolylamino group as a substituent of the present invention has a specific central backbone selected from the following structural formulas and the central backbone has a substituent having one or more carbazolylamino groups, such that efficiency and high-temperature stability of a perovskite solar cell adopting the compound are improved.

[Central backbone]

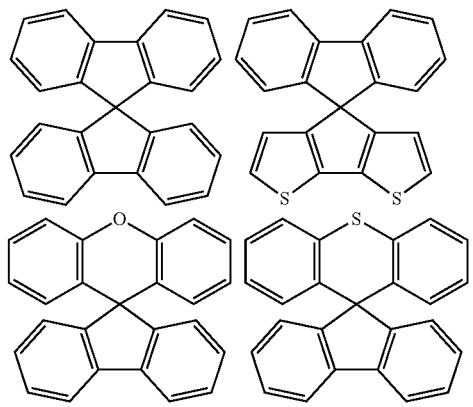

Specifically, a conventional Spiro-OMeTAD described below has all amino groups substituted with phenyl groups in spirobifluorene, which is a central backbone. On the other hand, the compound having a carbazolylamino group as a substituent of the present invention introduces one or more carbazolylamino groups as a substituent at

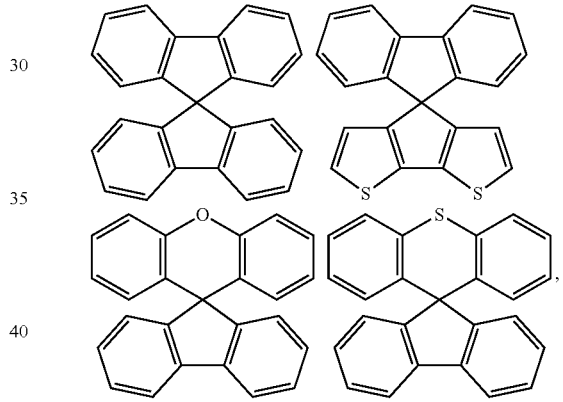

which is a specific central backbone, such that efficiency and high-temperature stability of a perovskite solar cell adopting the compound are improved.

[Spiro-OMeTAD]

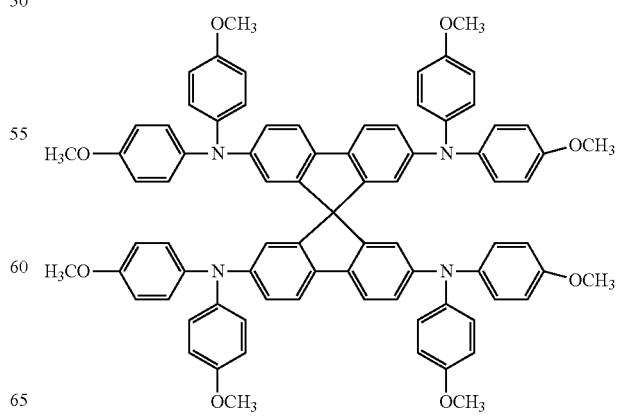

In particular, the perovskite solar cell adopting the compound having a carbazolylamino group as a substituent of the present invention has an excellent stability and durability and a high photoelectric conversion efficiency as compared with the case of using the conventional Spiro-OMeTAD.

In addition, since the compound having a carbazolylamino group as a substituent of the present invention is a monomolecule, the synthesis and separation is easily performed and a yield is high, which is very advantageous in commercialization, as compared to a conventional high molecular hole transport compound. Furthermore, the compound also has a high purity, which further improves efficiency of a perovskite solar cell adopting the compound.

Preferably, in Formula 1 of the present invention, $Ar_1$ to $Ar_3$ may be each independently (C6-C12)aryl substituted with one or more selected from (C1-C20)alkoxy, (C6-C20)aryloxy, (C6-C20)arylthio, and (C1-C20)alkylthio, more preferably, $Ar_1$ to $Ar_3$ may be each independently (C6-C12) aryl substituted with one or more (C1-C10)alkoxys, and still more preferably, $Ar_1$ to $Ar_3$ may be each independently phenyl substituted with one or two (C1-C10)alkoxys, or fluorenyl substituted with (C1-C10)alkyl.

Preferably, Formula 1 of the present invention may be represented by the following Formula 2 in terms of efficiency.

[Formula 2]

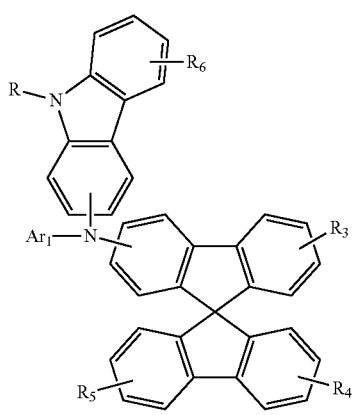

(In Formula 2,
$Ar_1$ is (C6-C20)aryl,
R is hydrogen, (C1-C20)alkyl, or (C6-C20)aryl,
$R_3$ to $R_5$ are each independently hydrogen, halogen, (C1-C20)alkyl, (C6-C20)aryl, —N($Ar_2$)($Ar_3$), or

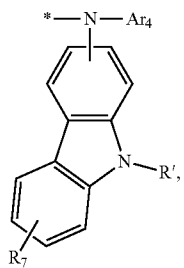

$R_6$ and $R_7$ are each independently halogen, (C1-C20)alkyl, (C1-C20)alkoxy, or (C1-C20)alkylthio,
$Ar_2$ to $Ar_4$ are each independently (C6-C20)aryl, and R' is hydrogen, (C1-C20)alkyl, or (C6-C20)aryl, and each aryl of $Ar_1$ to $Ar_4$ may be further substituted with one or more substituents selected from (C1-C20)alkyl, (C1-C20)alkoxy, (C6-C20)aryloxy, (C6-C20)arylthio, and (C1-C20)alkylthio.)

Preferably, in Formula 2, $R_3$ to $R_5$ are each independently —N($Ar_2$)($Ar_3$) or

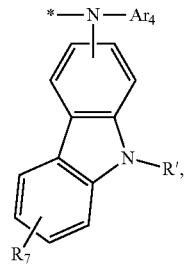

$Ar_2$ to $Ar_4$ are each independently (C6-C12)aryl, and R' is hydrogen, (C1-C10)alkyl, or (C6-C12)aryl, each aryl of $Ar_1$ to $Ar_4$ may be further substituted with one or more substituents selected from (C1-C10)alkoxy, (C6-C12)aryloxy, (C6-C12)arylthio, and (C1-C10)alkylthio, $R_6$ and $R_7$ may be each independently (C1-C10)alkoxy, and more preferably, and $Ar_1$ to $Ar_4$ may be each independently phenyl substituted with (C1-C10)alkoxy in terms of efficiency and stability.

Preferably, Formula 1 according to an exemplary embodiment of the present invention may be represented by the following Formula 3 or Formula 4 in terms of the efficiency and stability.

[Formula 3]

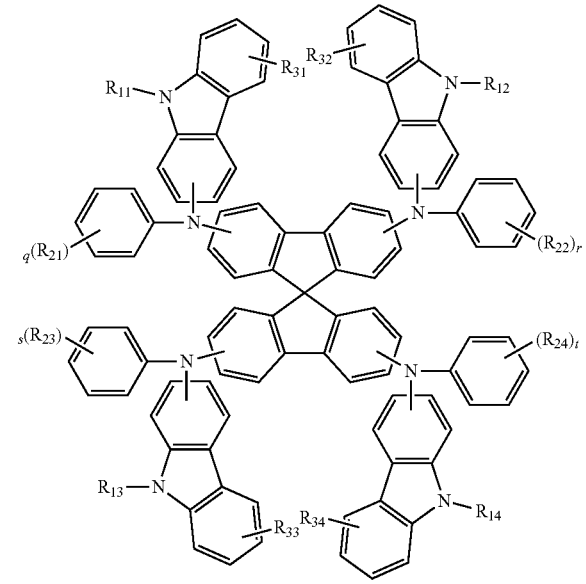

-continued

[Formula 4]

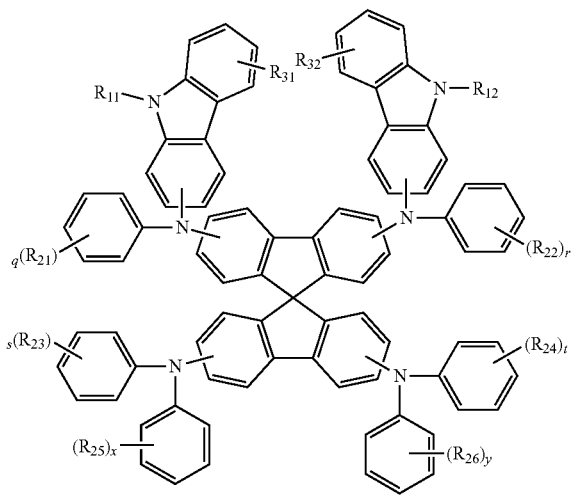

(In Formula 3 and Formula 4,
$R_{11}$ to $R_{14}$ are each independently hydrogen, (C1-C10) alkyl, or (C6-C12)aryl;

$R_{21}$ to $R_{26}$ are each independently (C1-C10)alkoxy, (C1-C20)alkylthio, (C6-C12)arylthio, or (C6-C12)aryloxy; q, r, s, t, x, and y are each independently an integer of 1 to 5, and when q, r, s, t, x, and y are 2 or more, $R_{21}$ to $R_{26}$ may be each independently the same as or different from each other; and $R_{31}$ to $R_{34}$ are each independently (C1-C10)alkoxy, (C6-C12)arylthio, (C6-C12)aryloxy, or (C1-C10)alkylthio.)

Preferably, $R_{11}$ to $R_{14}$ are each independently (C1-C5) alkyl or (C6-C12)aryl; $R_{21}$ to $R_{26}$ are each independently (C1-C5)alkoxy; and q, r, s, t, x, and y may be each independently an integer of 1 or 2.

The compound having a carbazolylamino group as a substituent of the present invention is preferably Formula 3 in terms of photoelectric conversion efficiency and stability. In Formula 3, Rn to $R_{14}$ are each independently hydrogen or (C1-C10)alkyl, and in a case where $R_{21}$ to $R_{26}$ are each independently (C1-C10)alkoxy, all of the stability, durability, and photoelectric conversion efficiency are satisfactory, which is more preferable.

Specifically, the compound having a carbazolylamino group as a substituent of the present invention may be selected from the following compounds, but is not limited thereto.

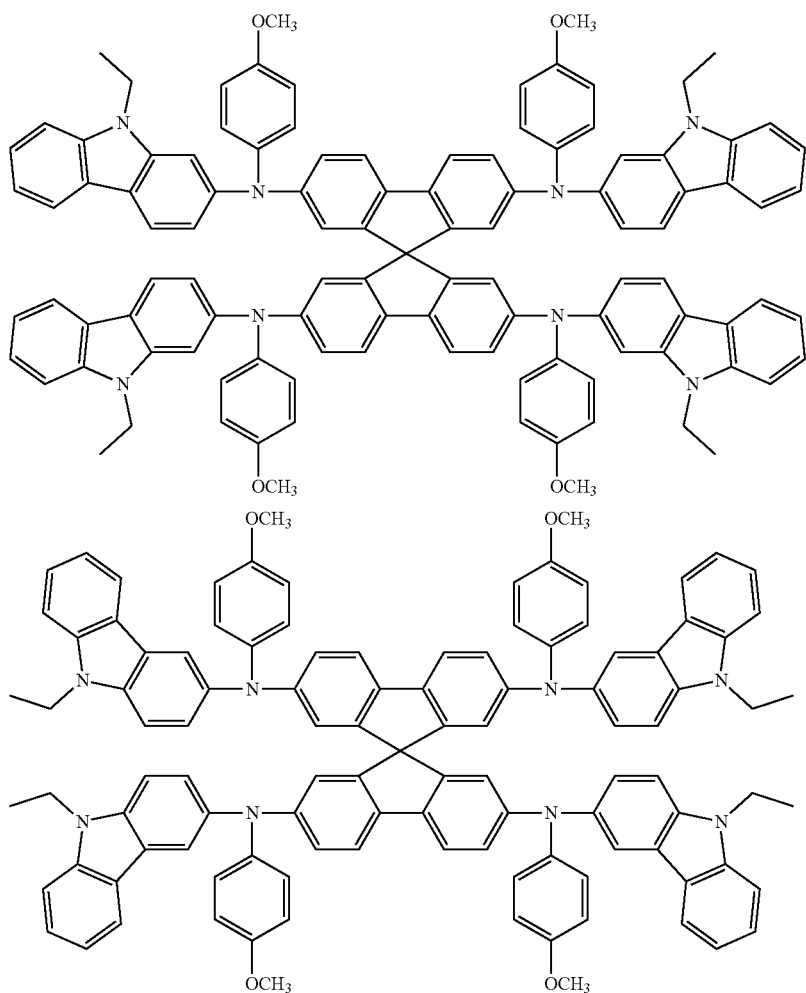

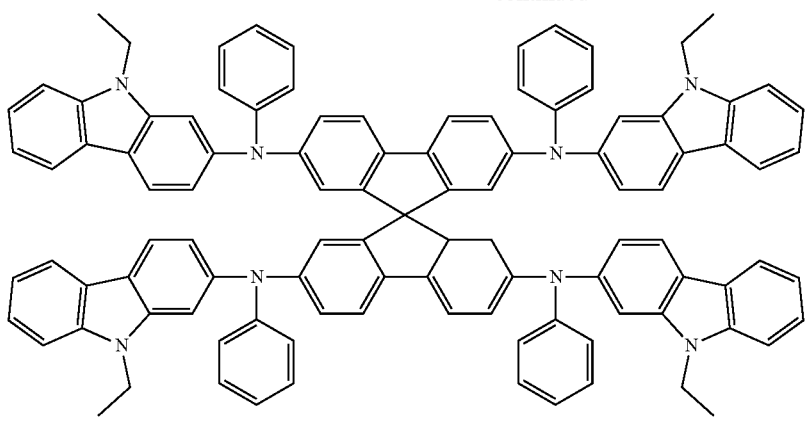
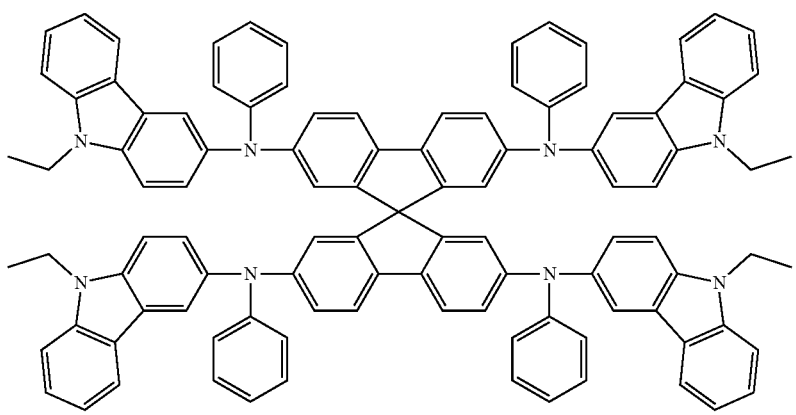
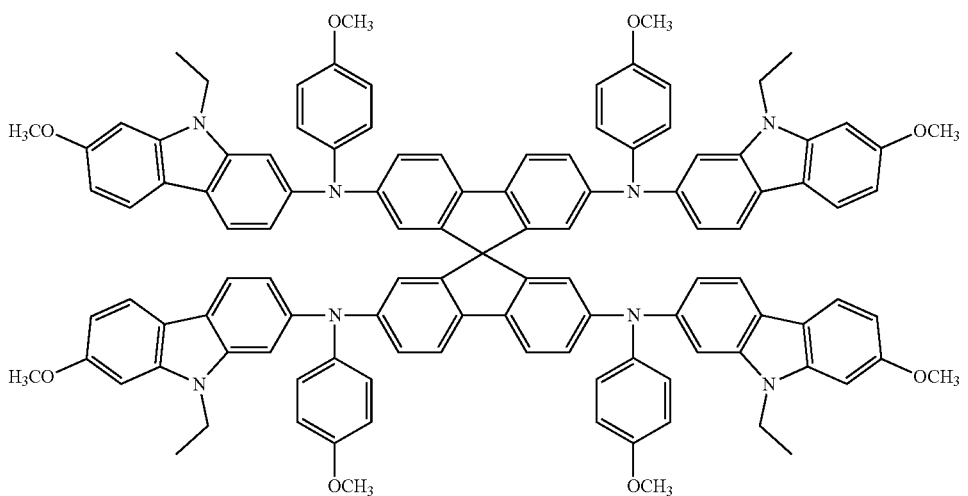

-continued
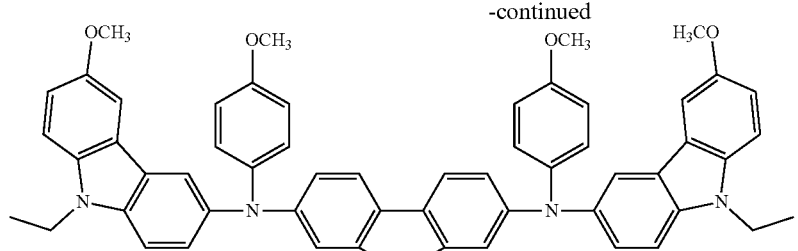
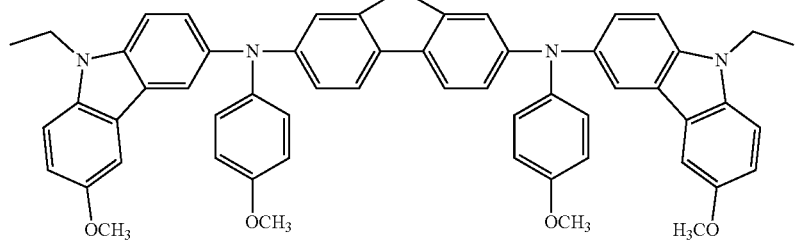
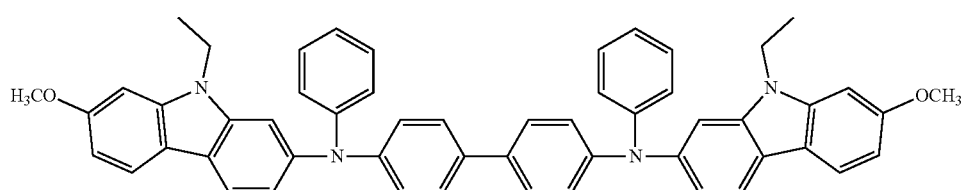
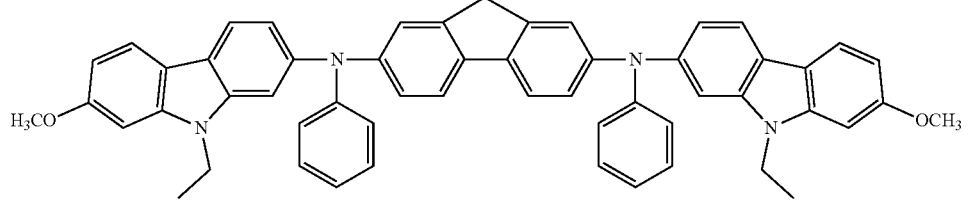
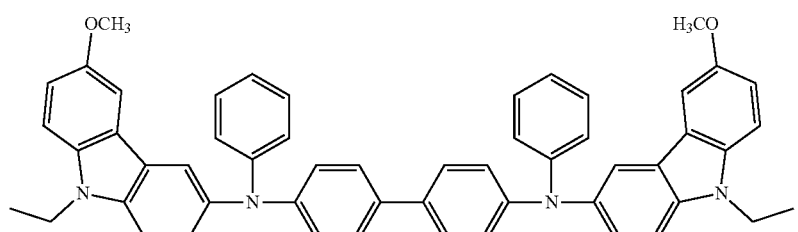
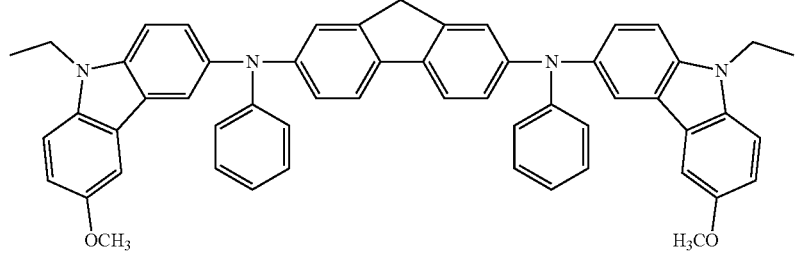

-continued
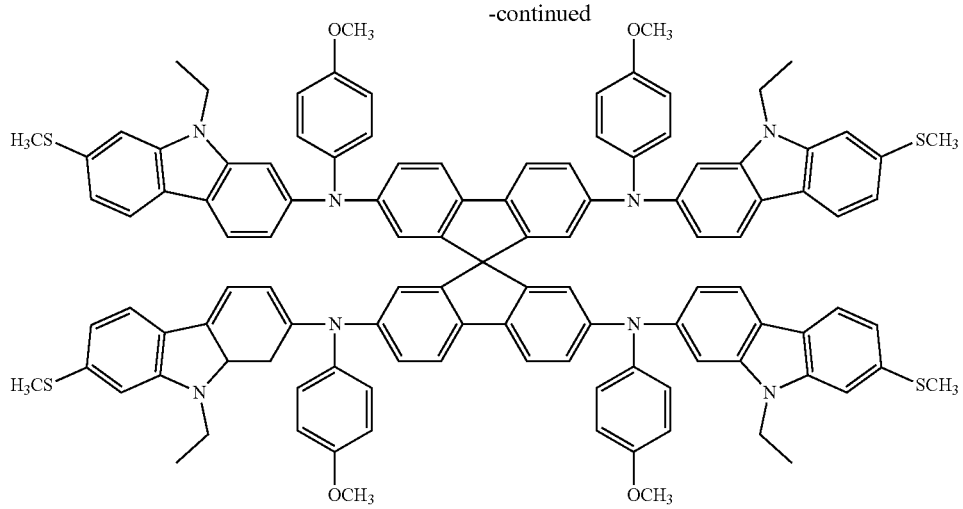
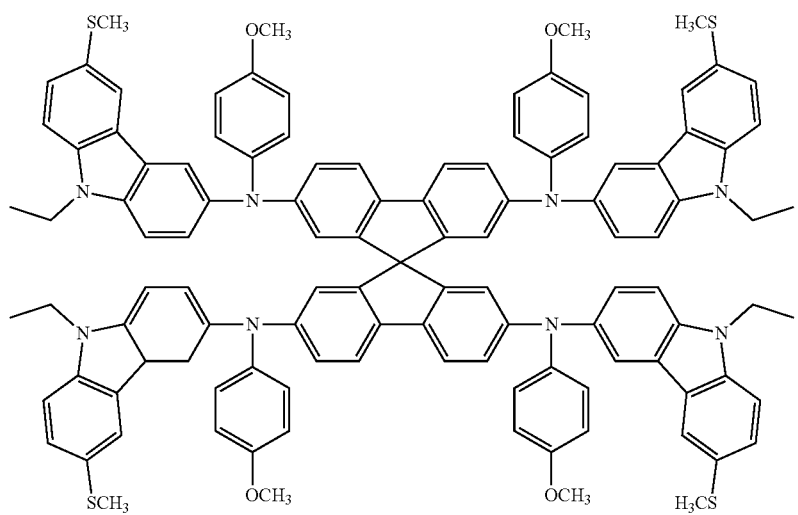
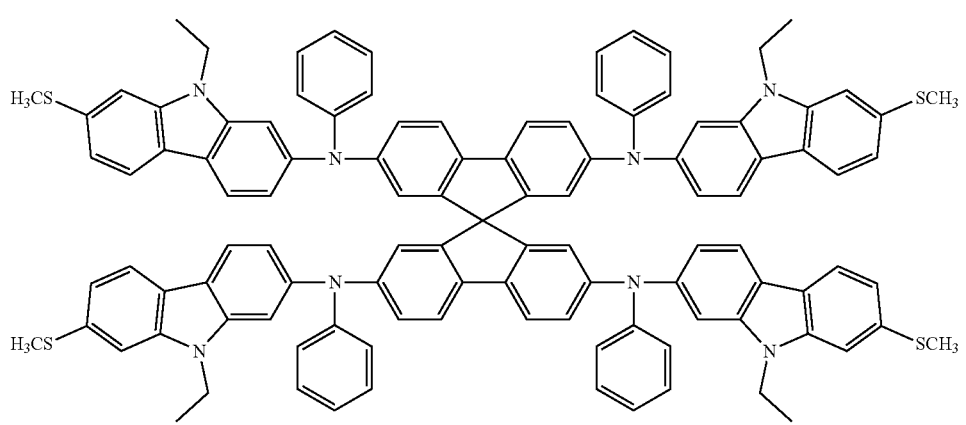

-continued
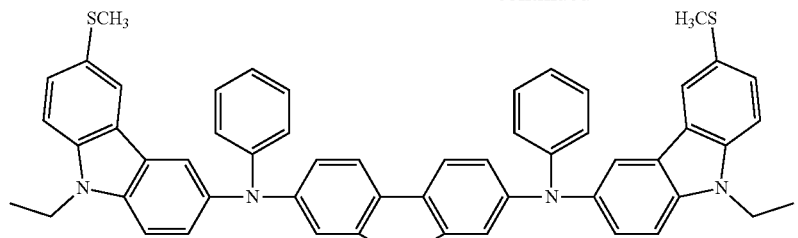
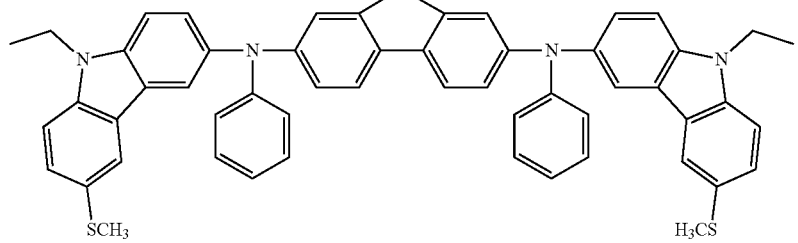
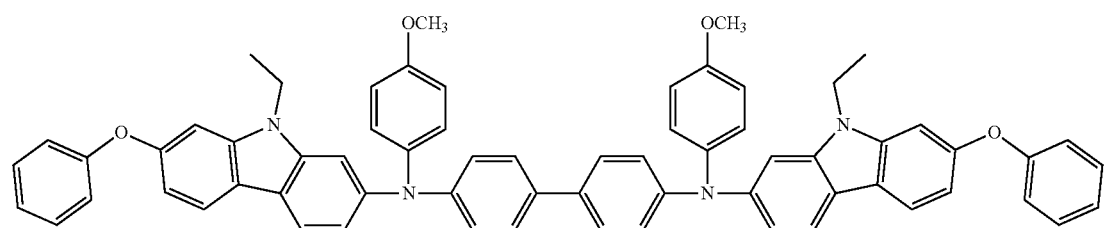
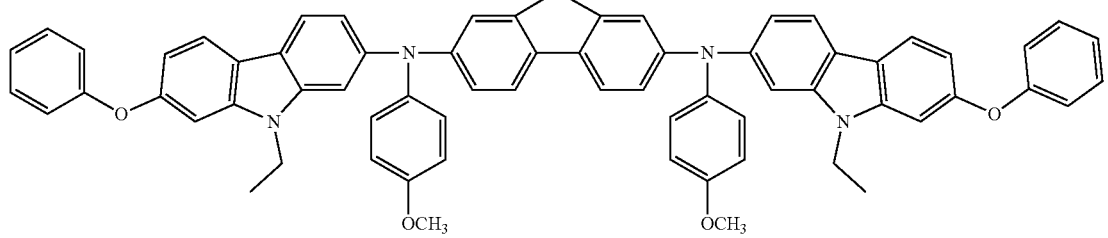
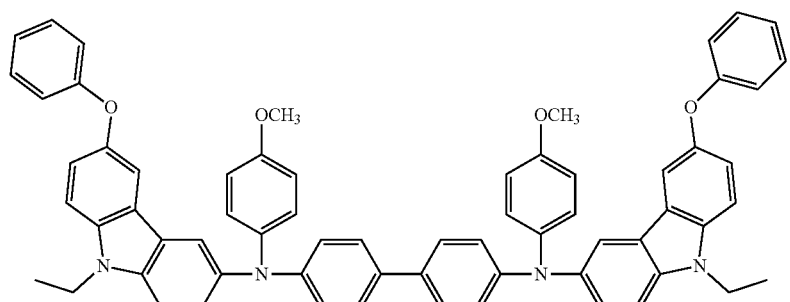
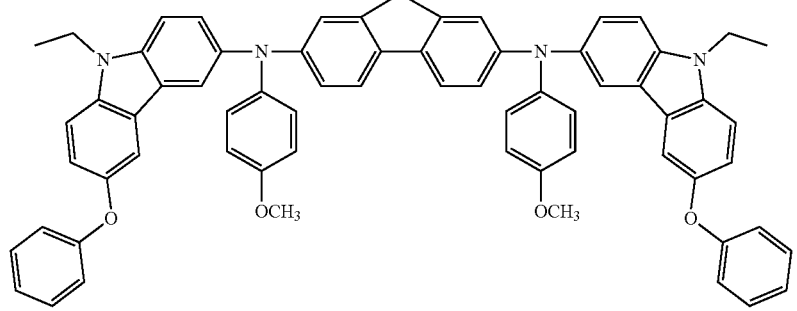

-continued
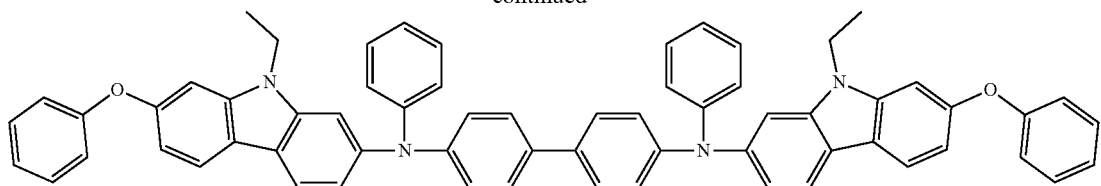
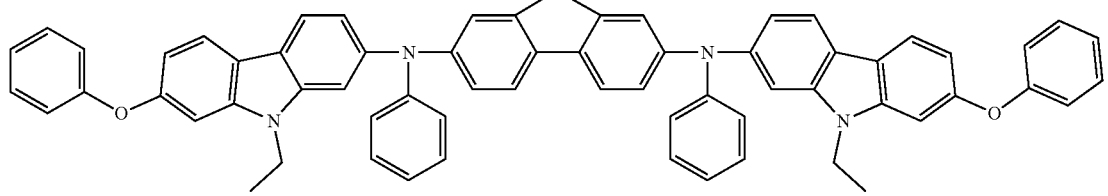
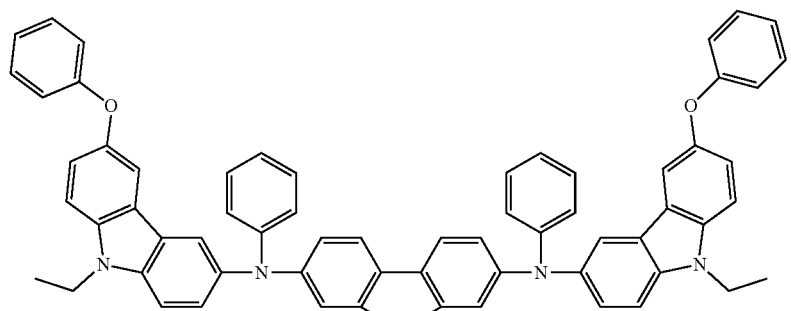
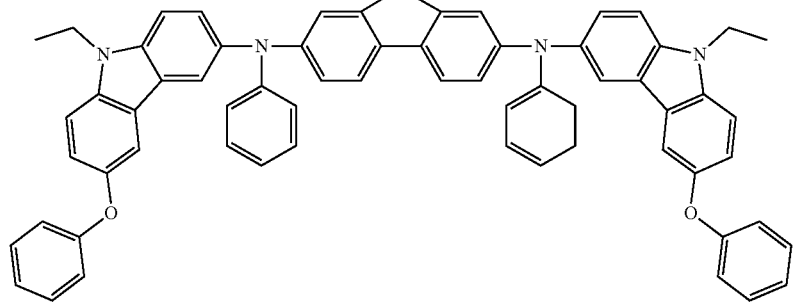
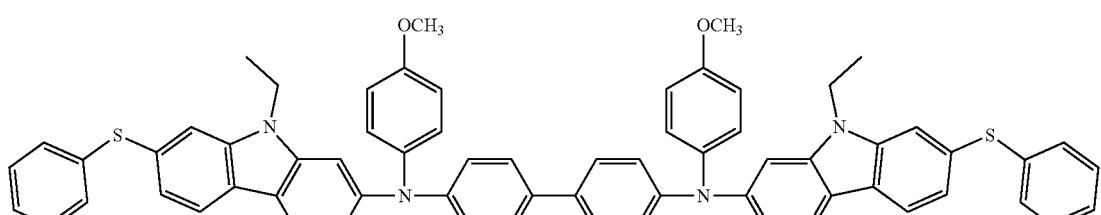
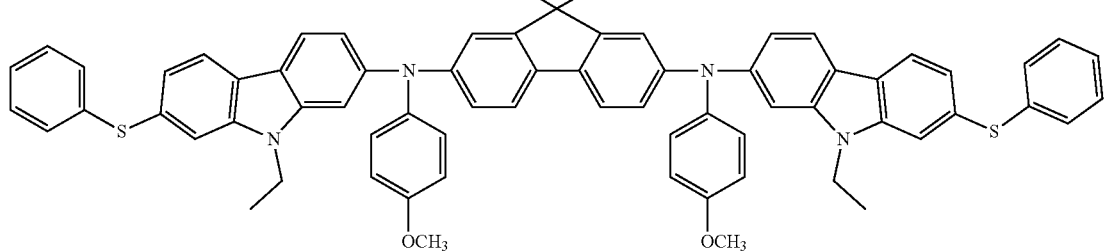

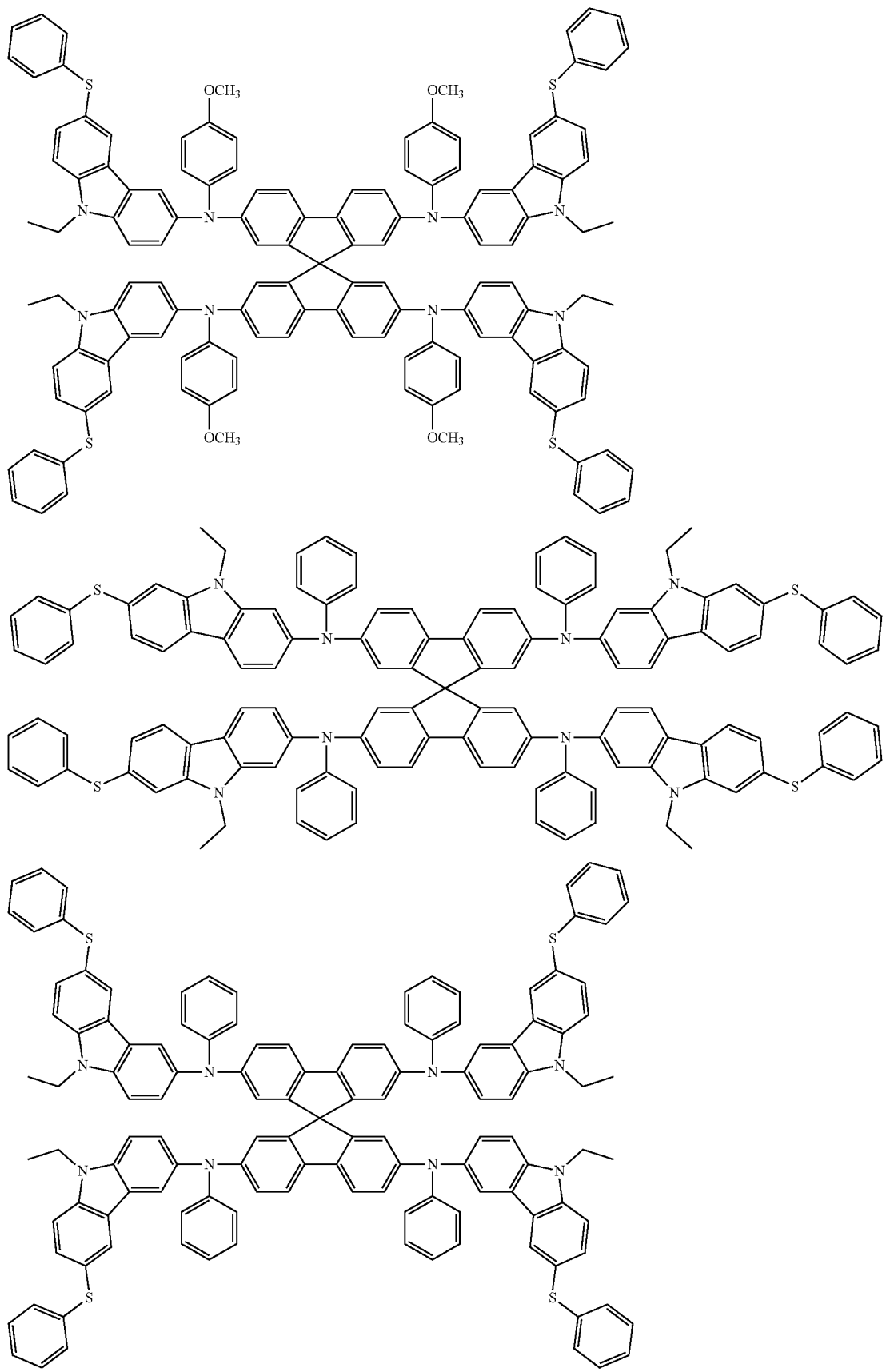

-continued
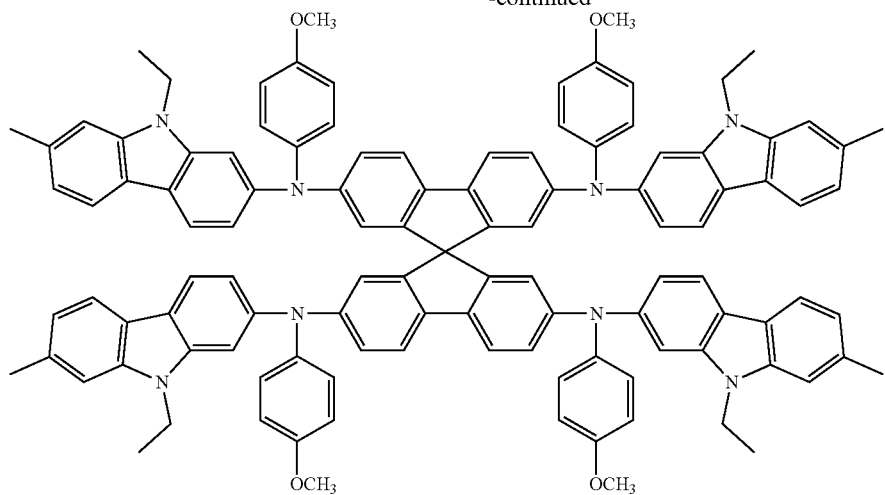
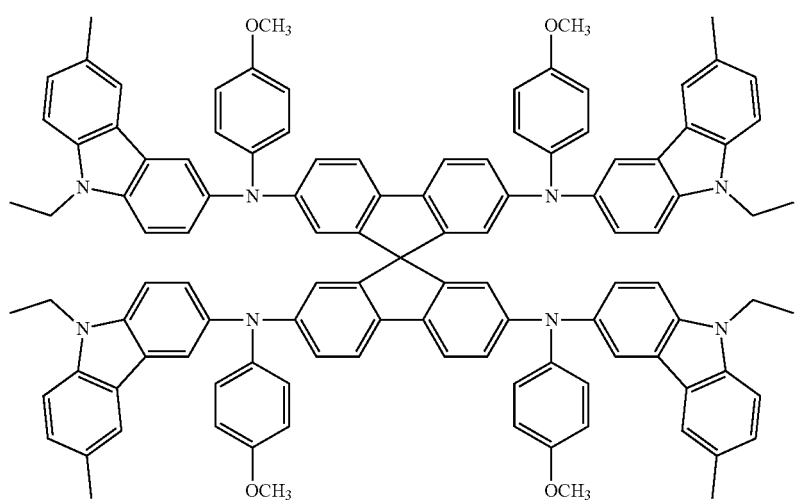
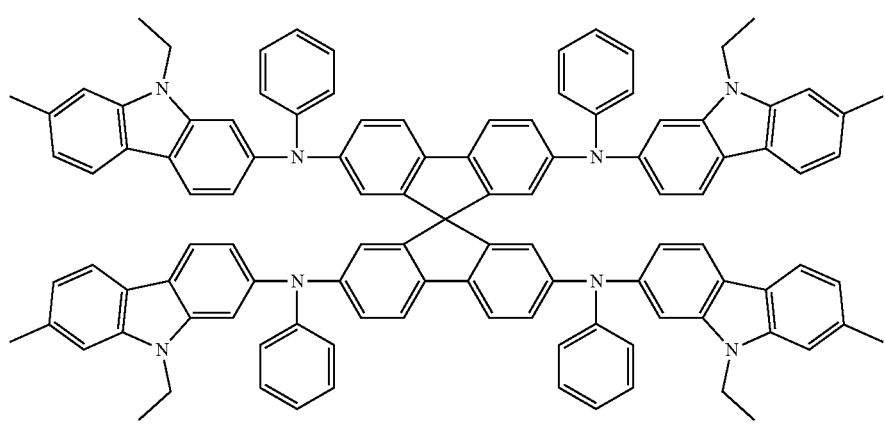

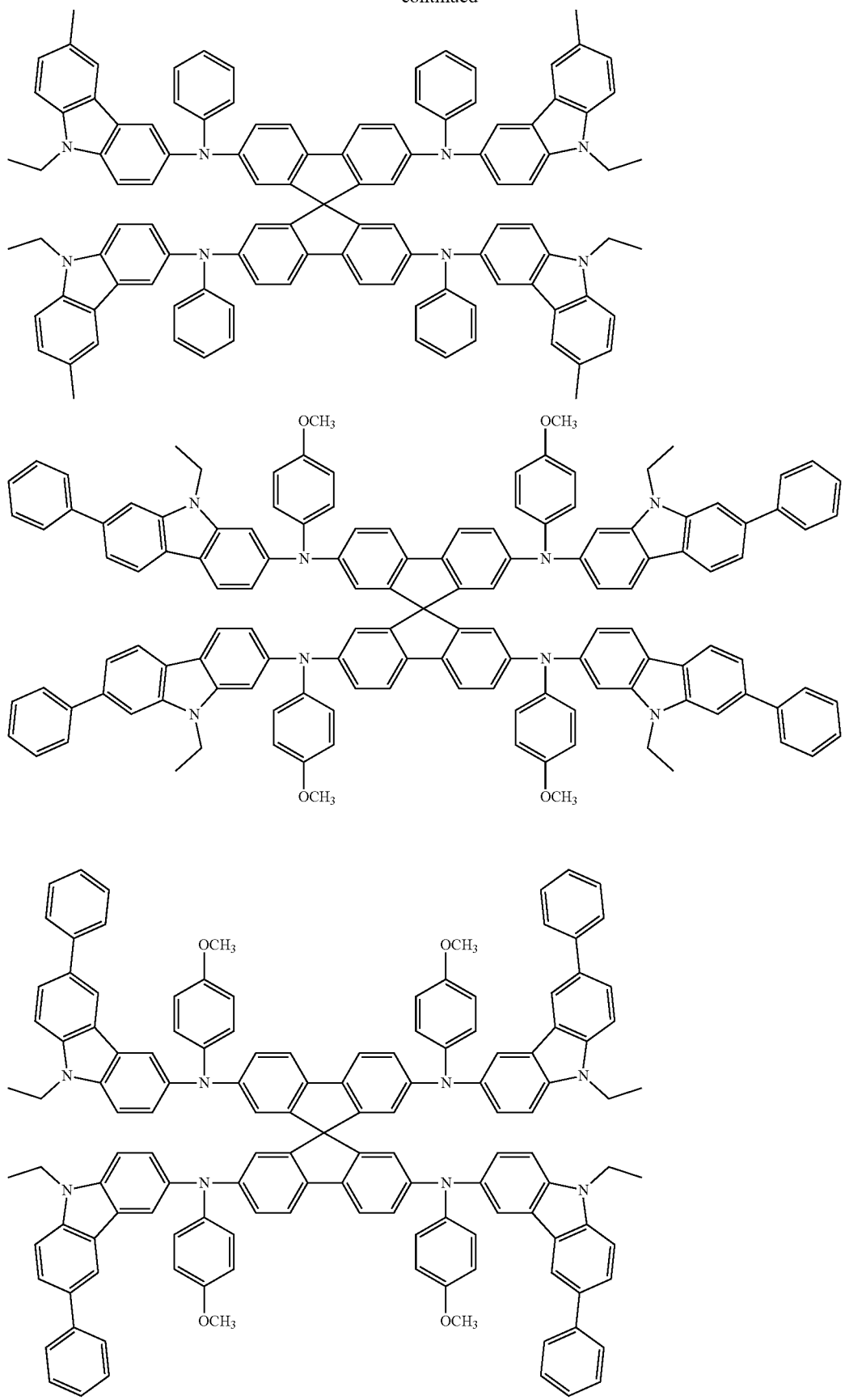

-continued
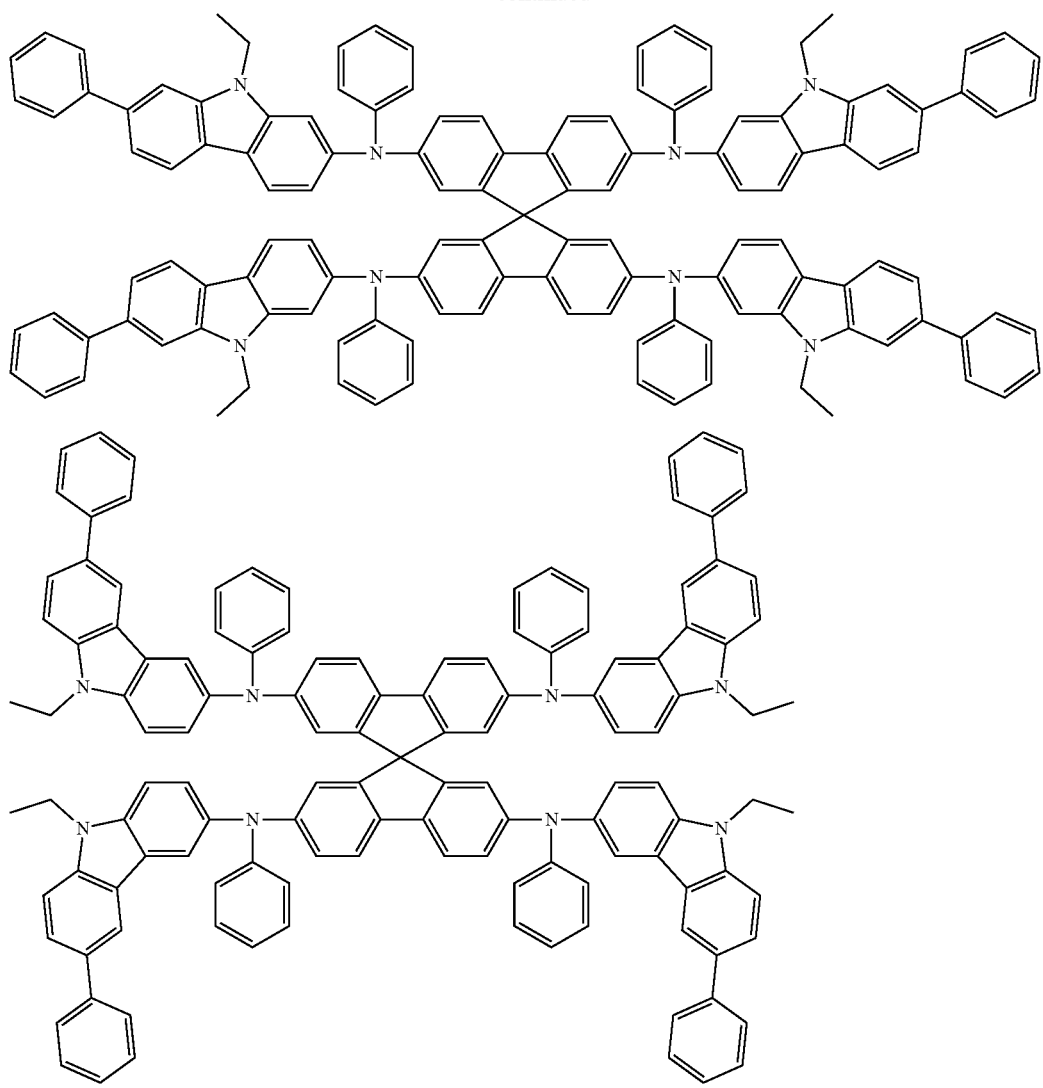
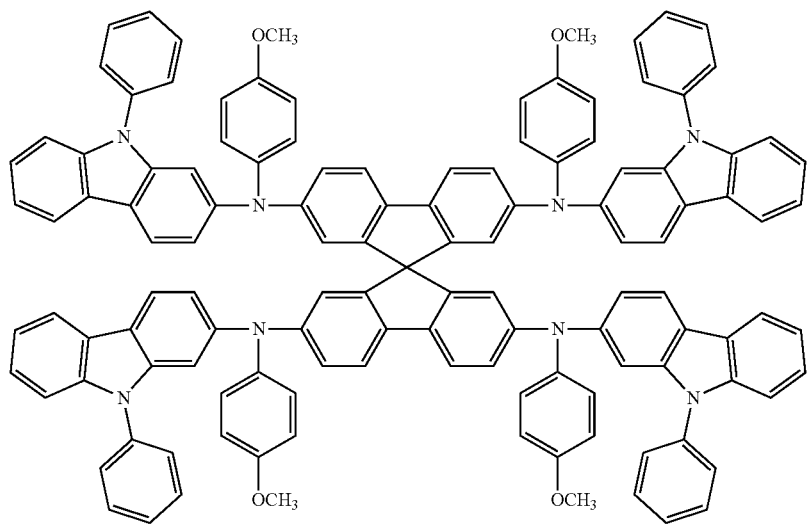

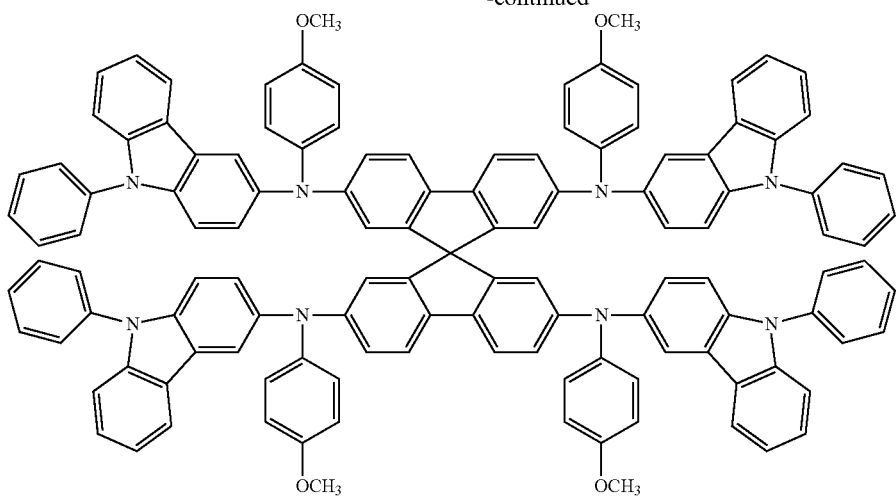
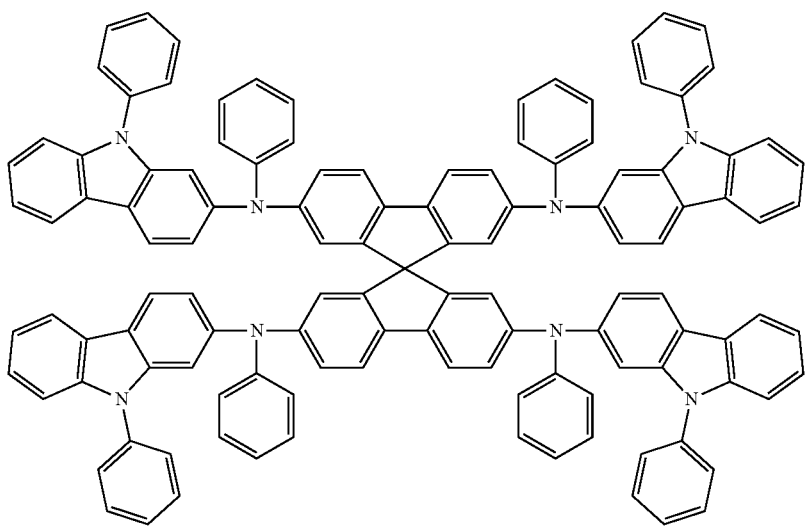
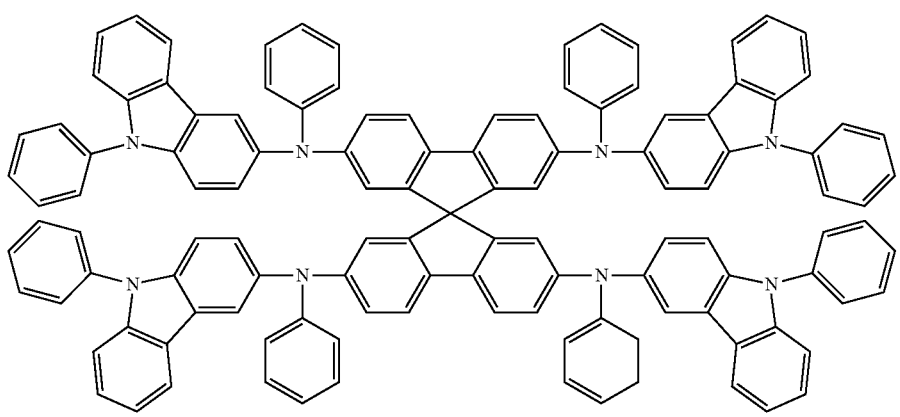

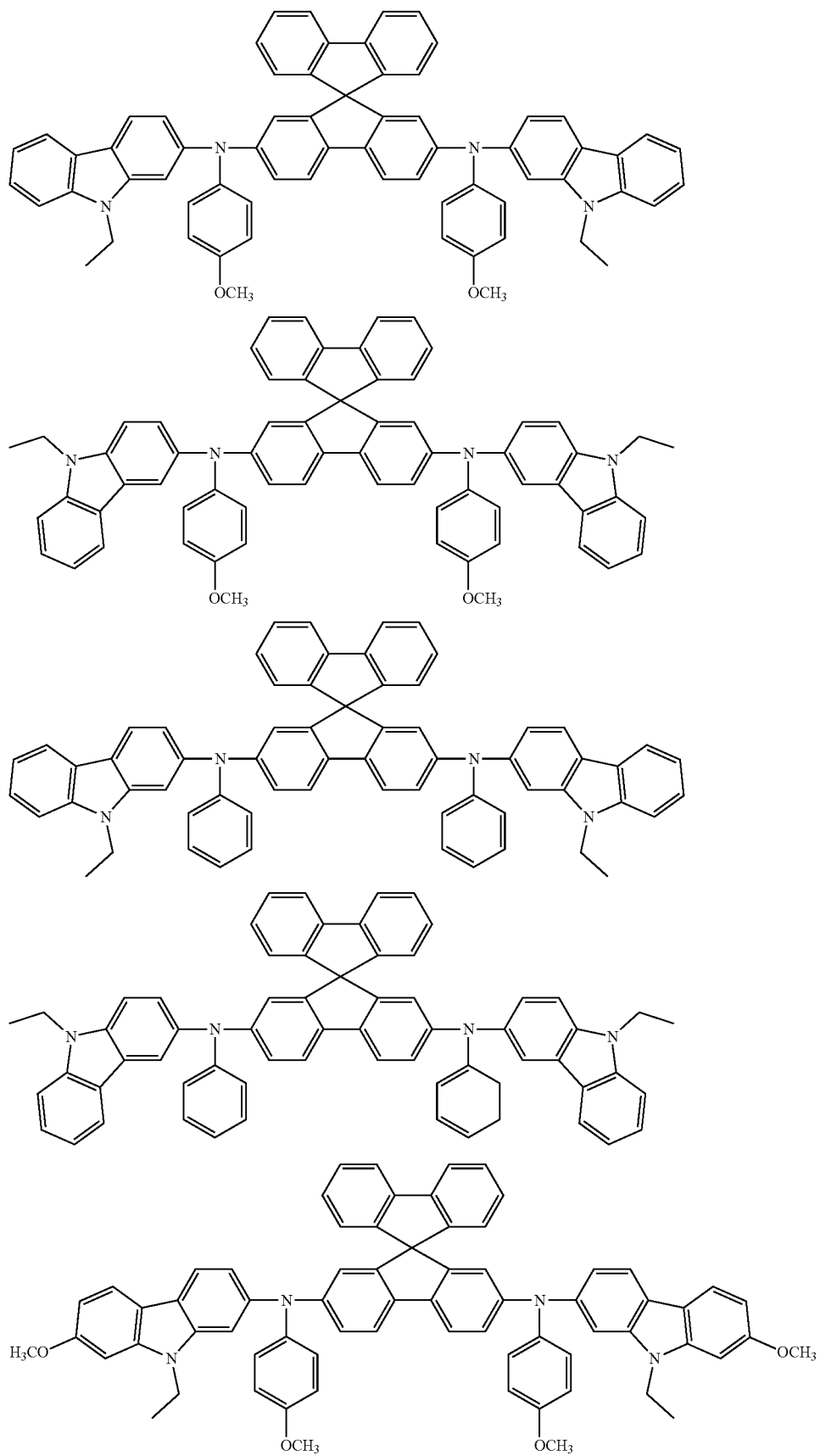

-continued
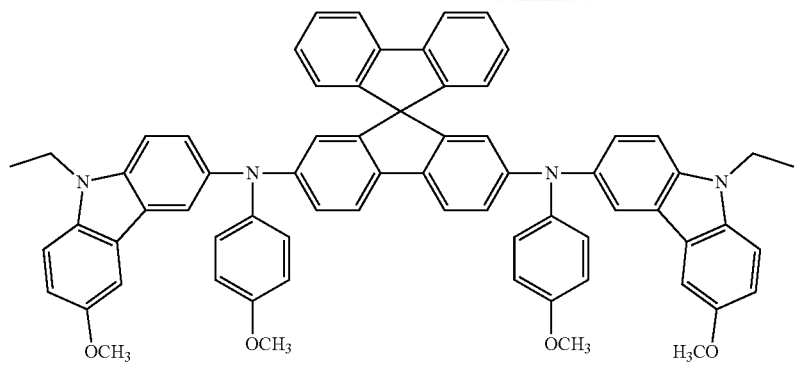
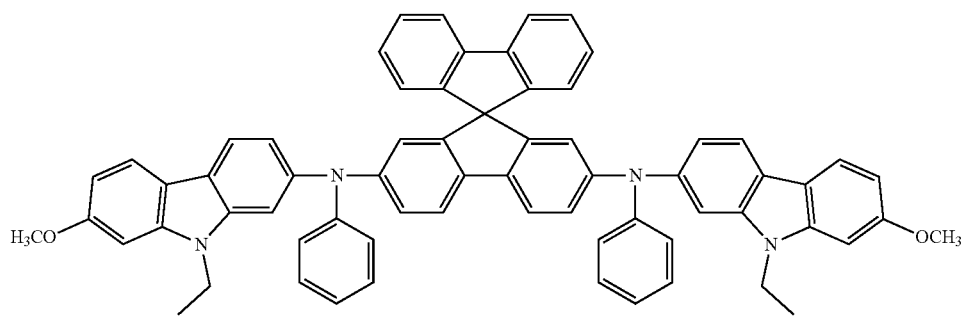
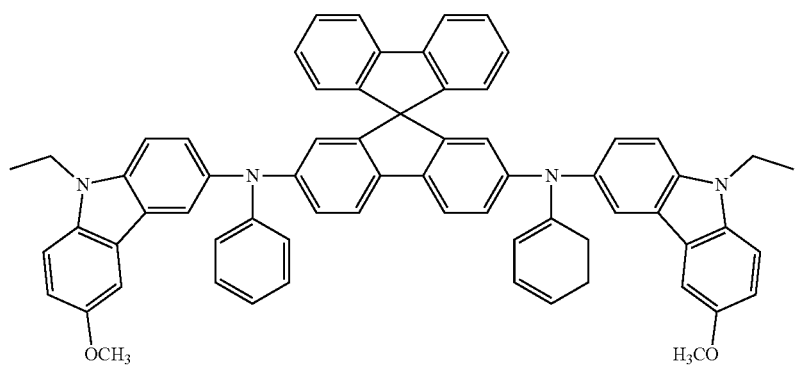
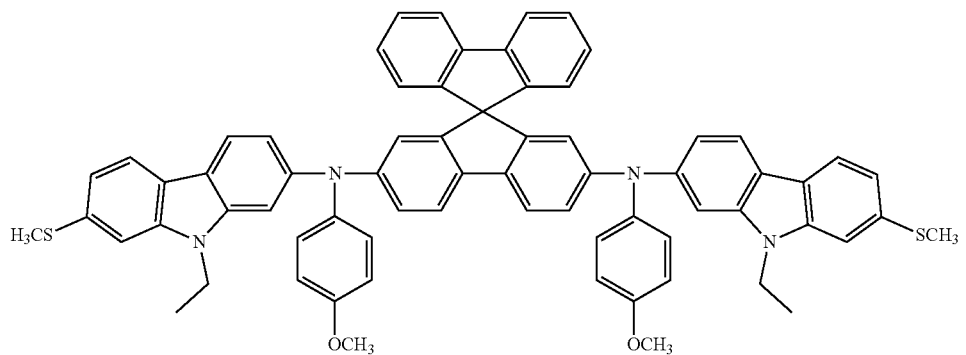

-continued
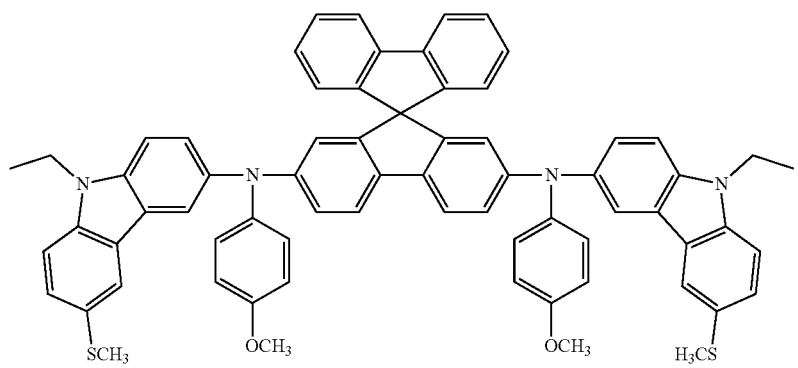
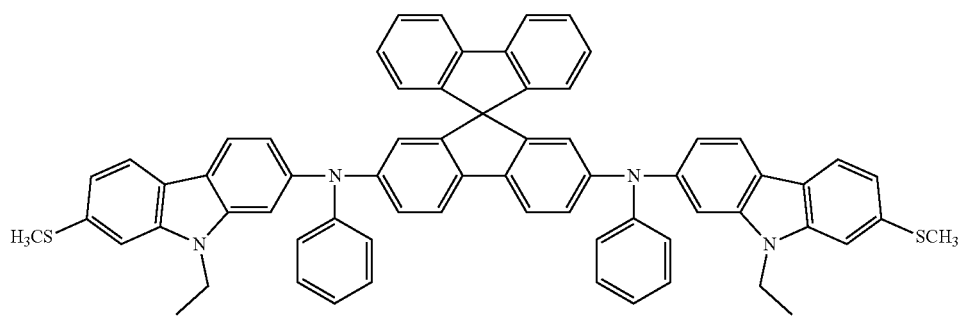
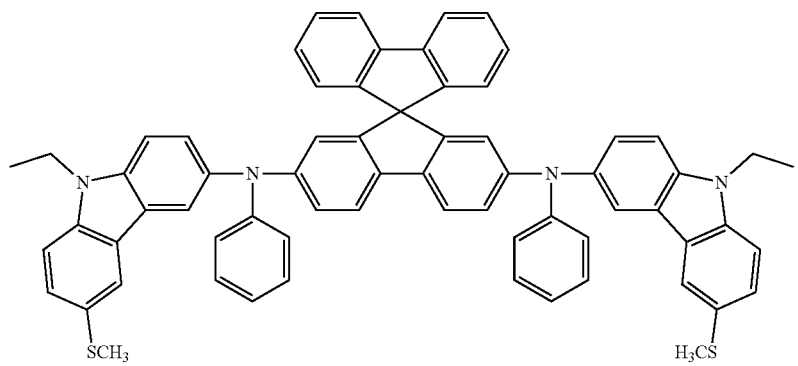
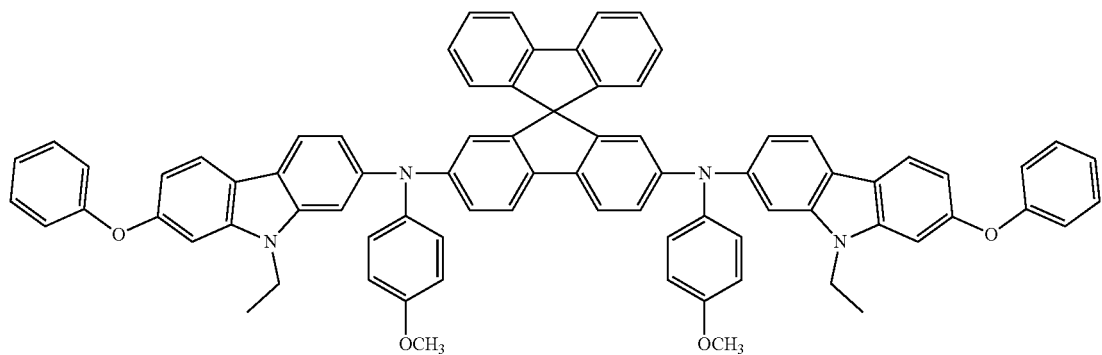

-continued
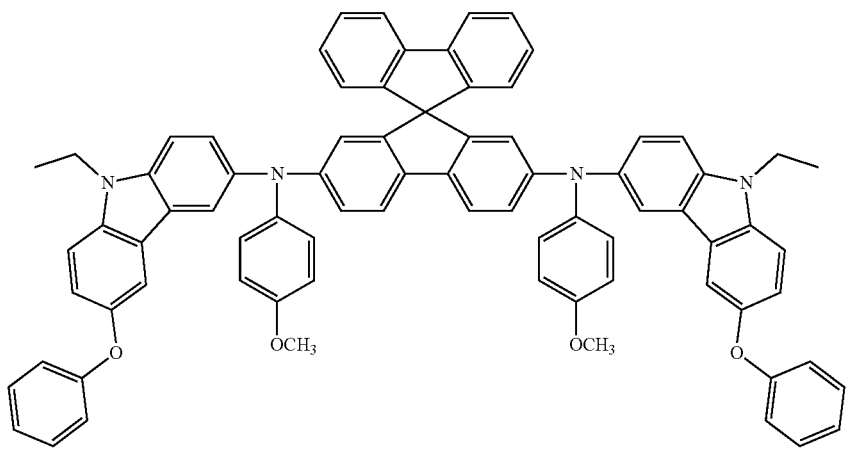
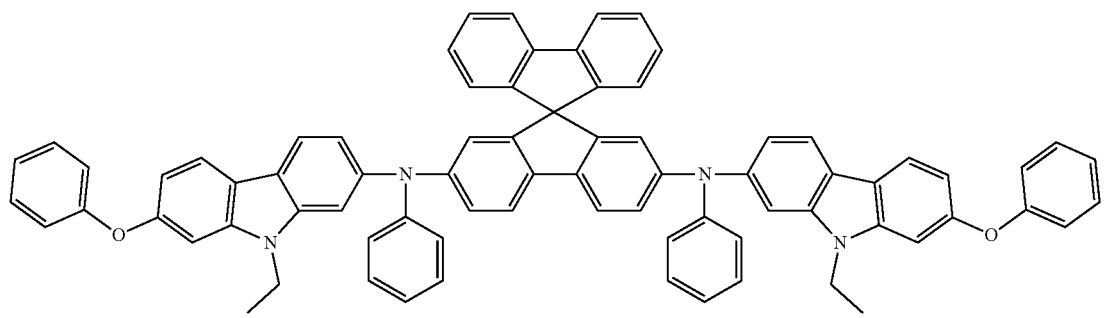
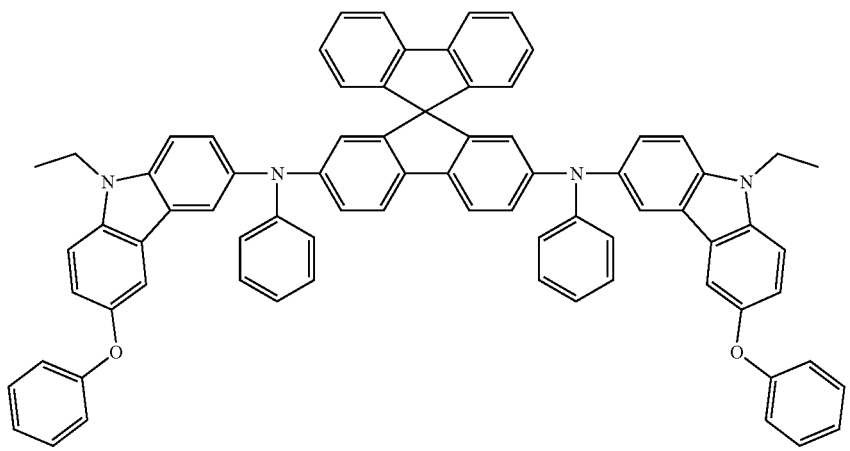
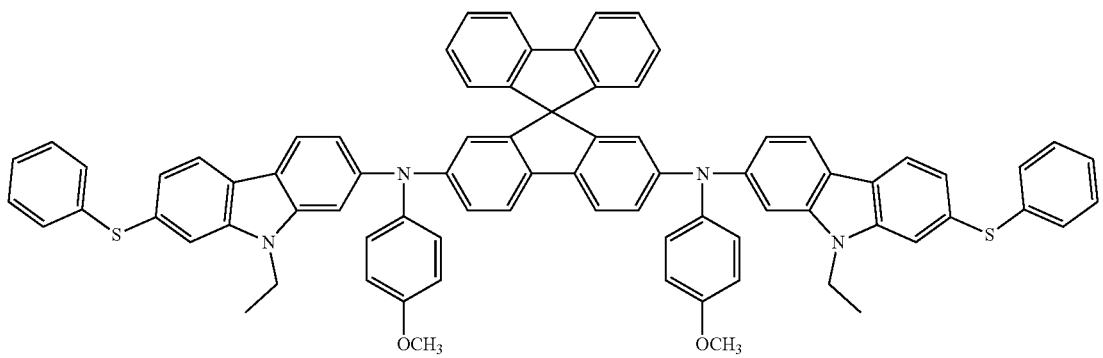

-continued
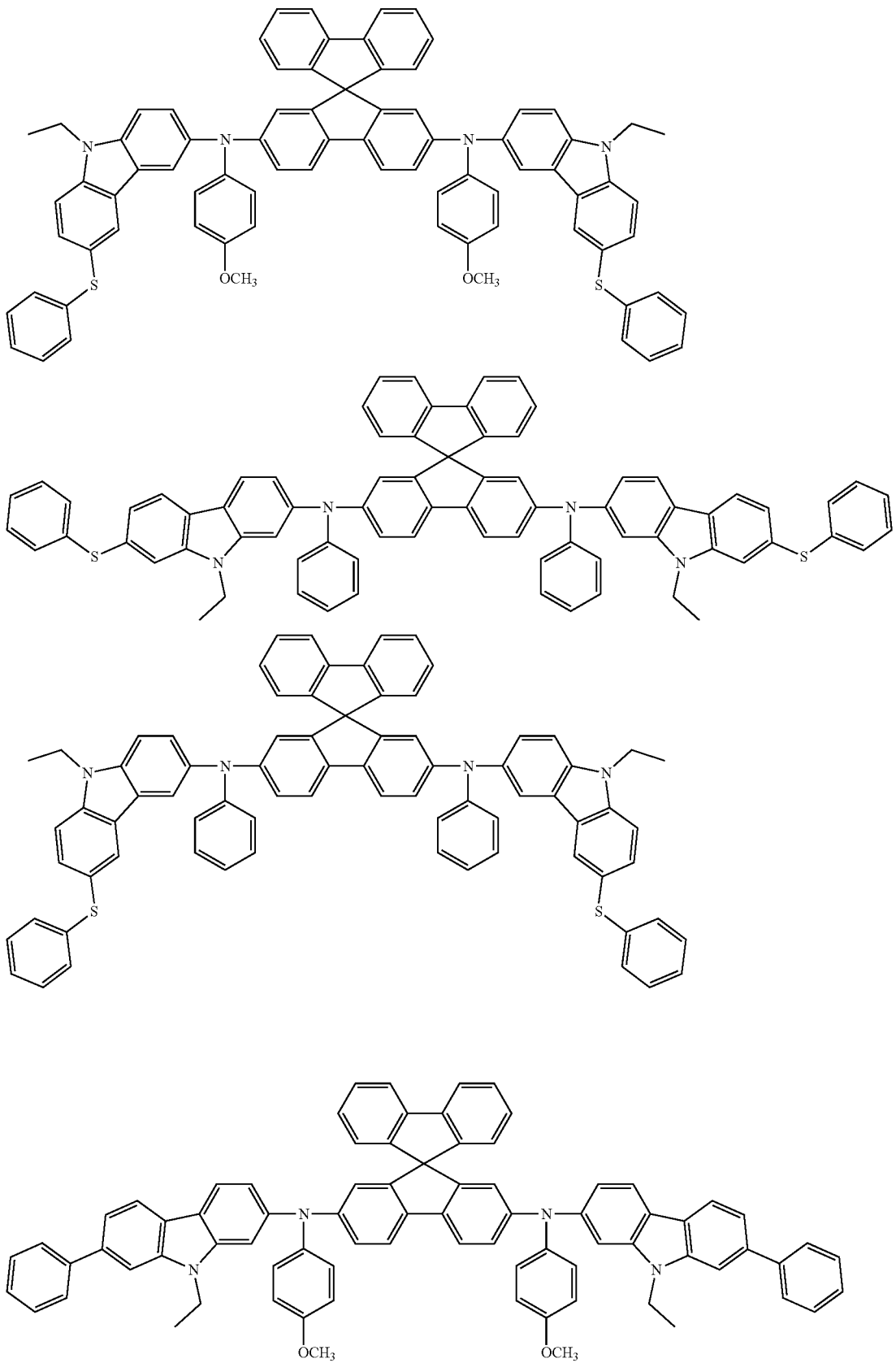

-continued
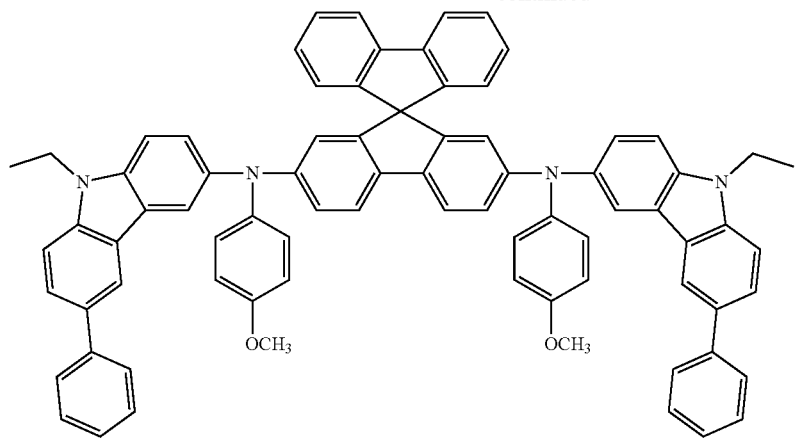
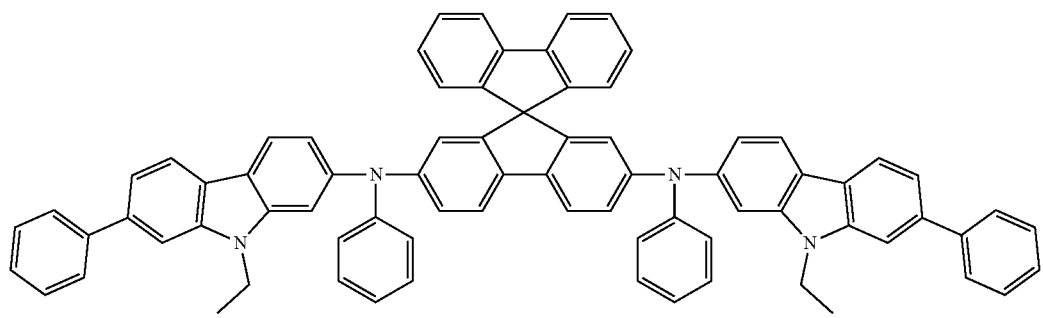
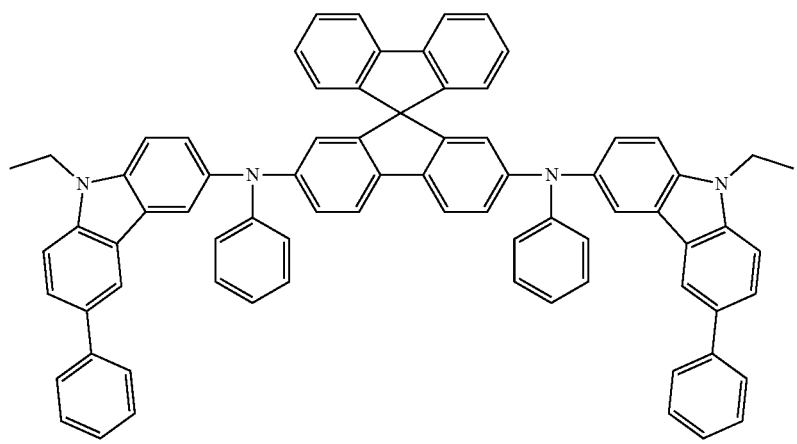
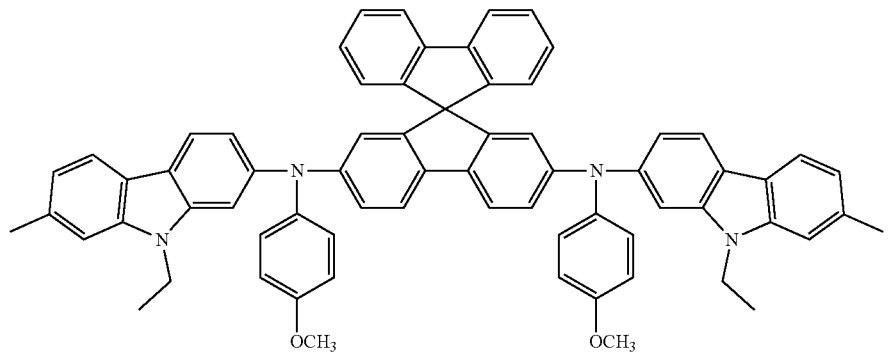

-continued
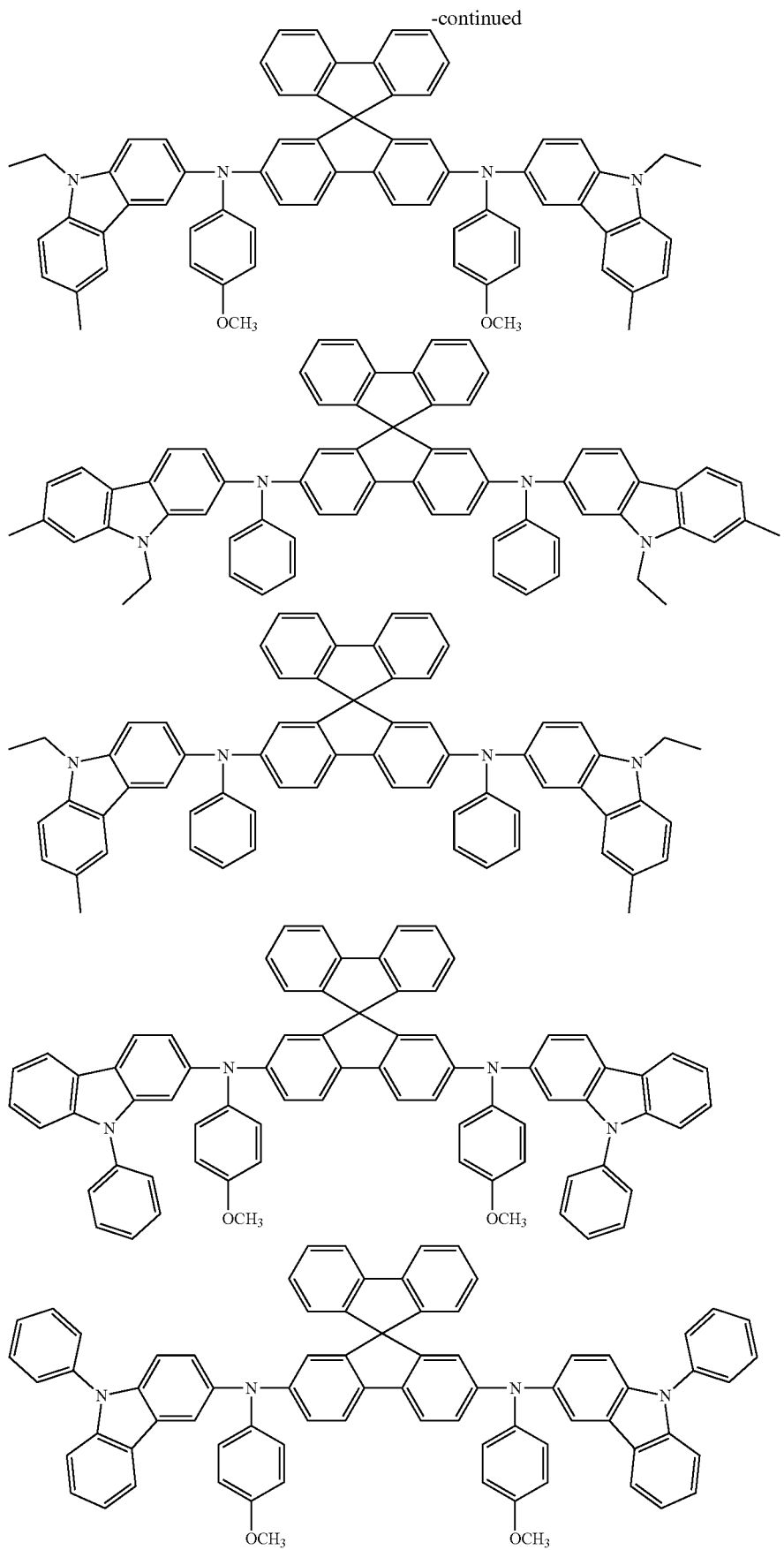

-continued
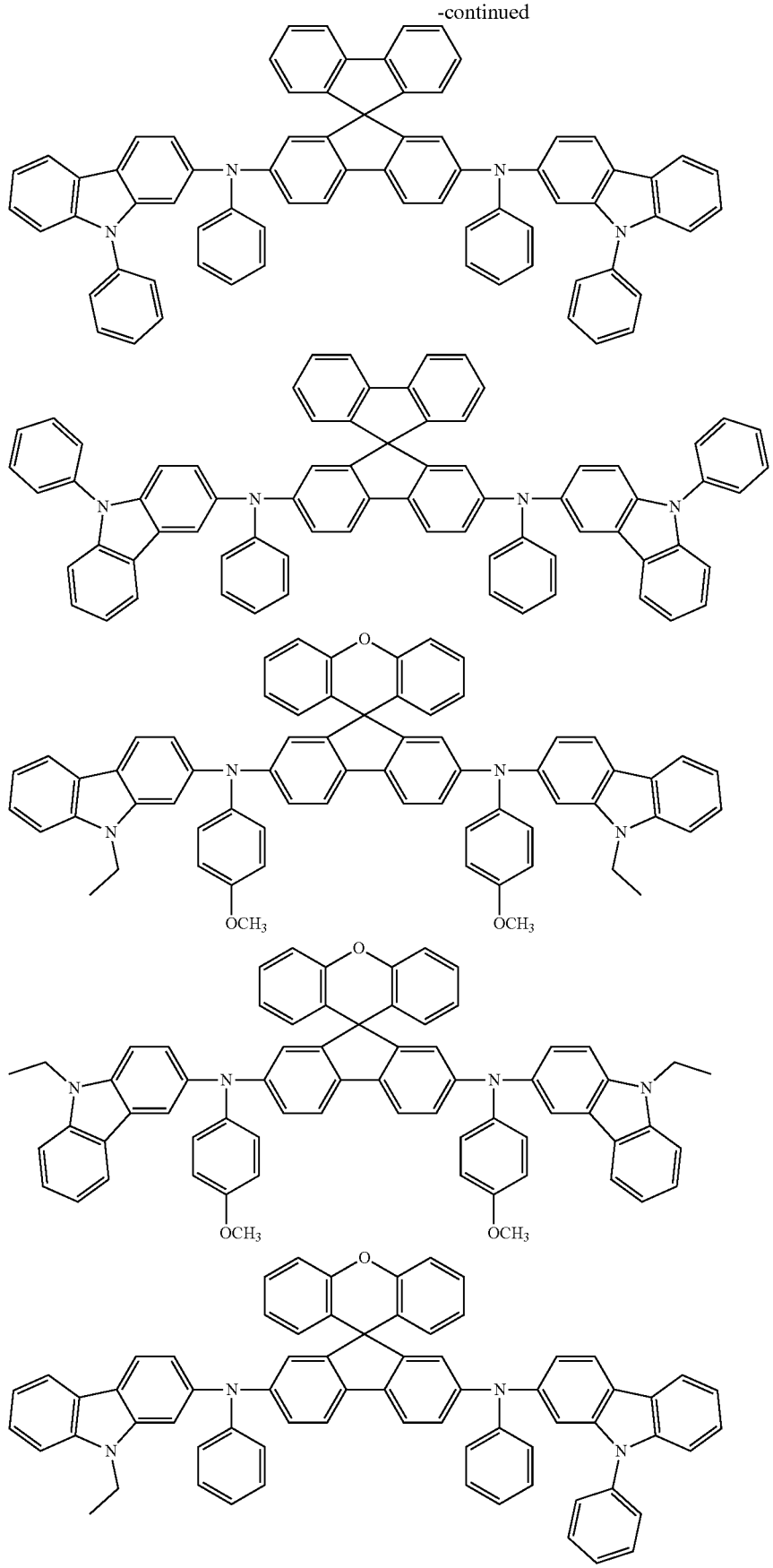

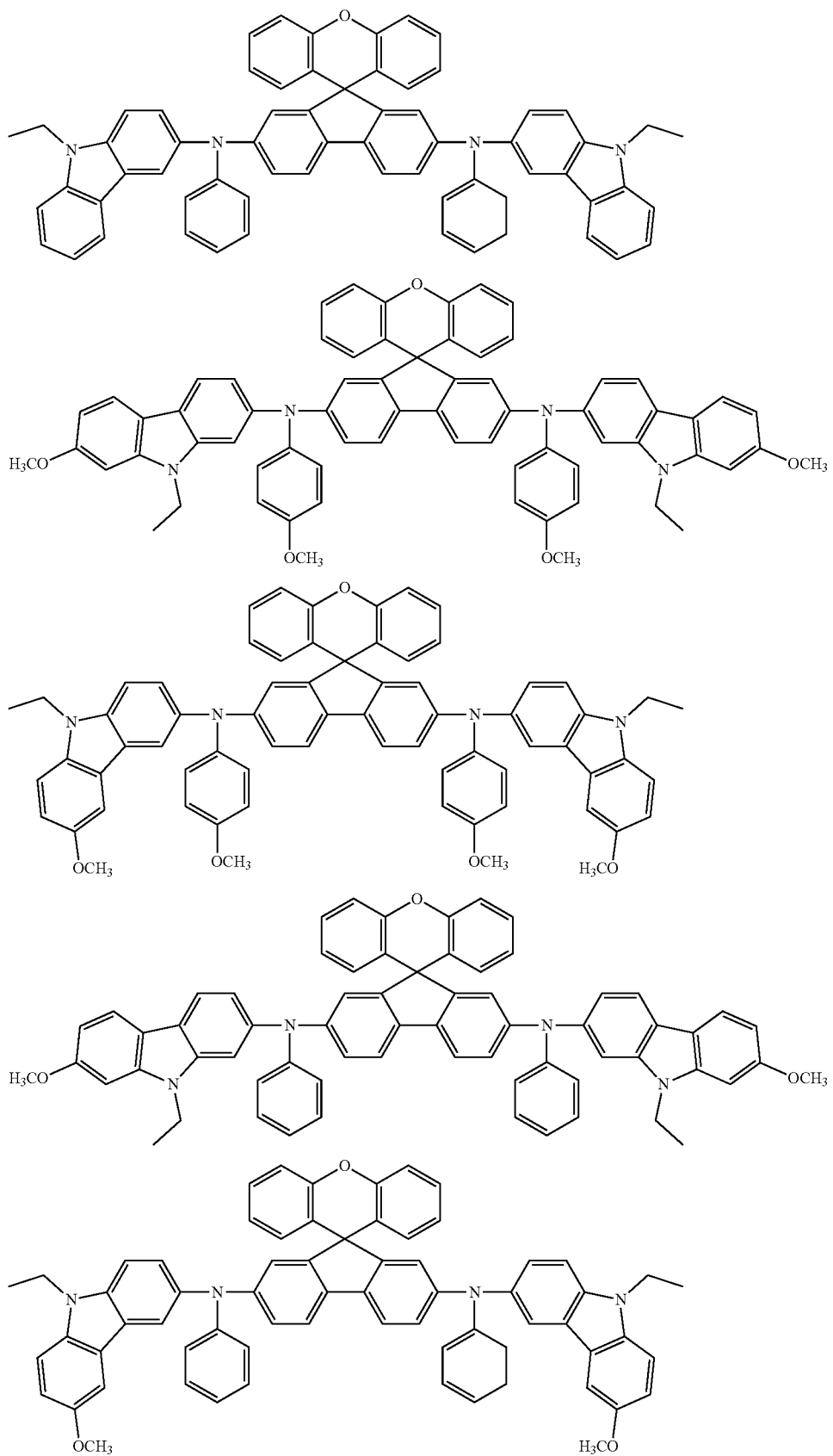

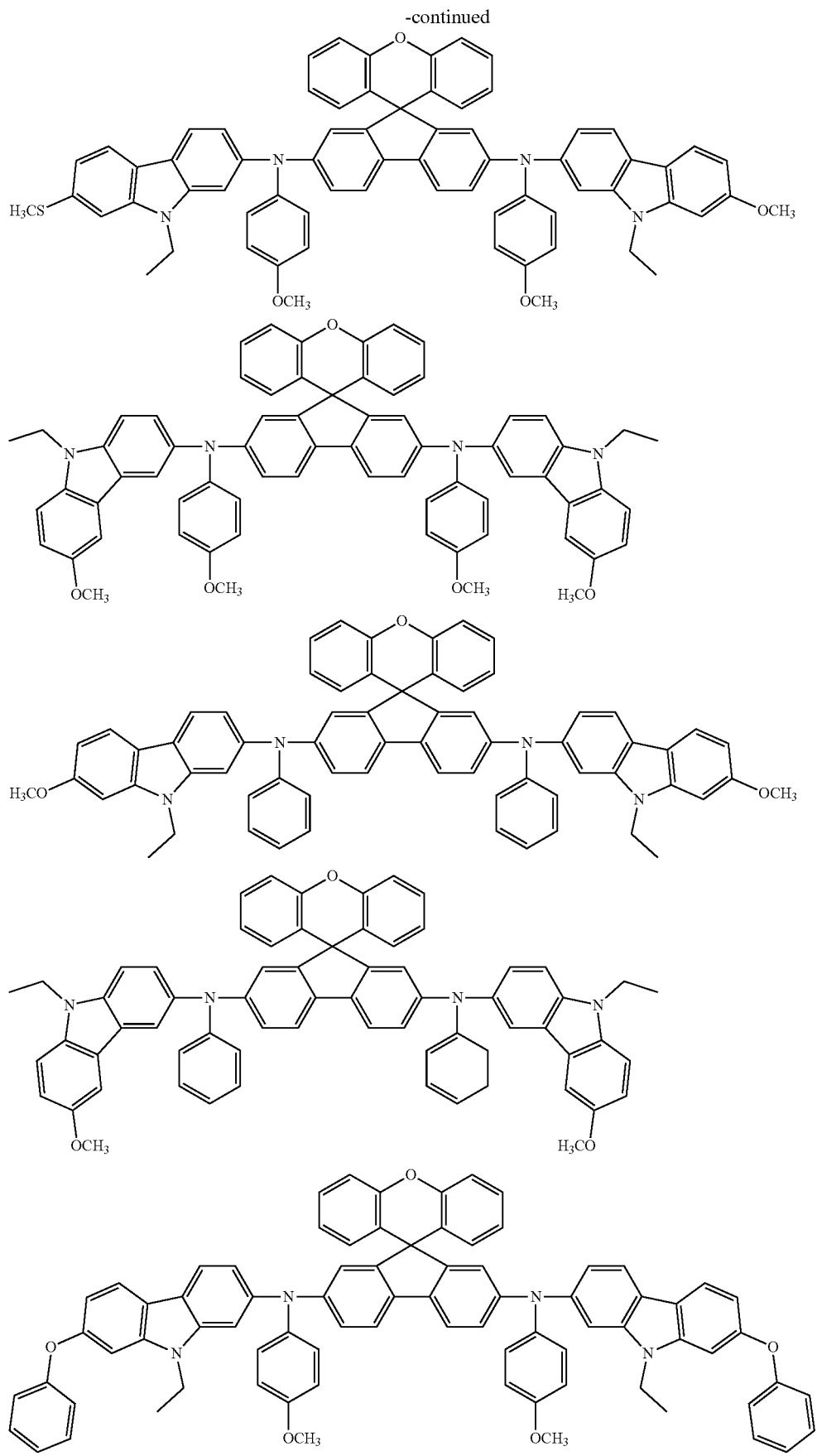

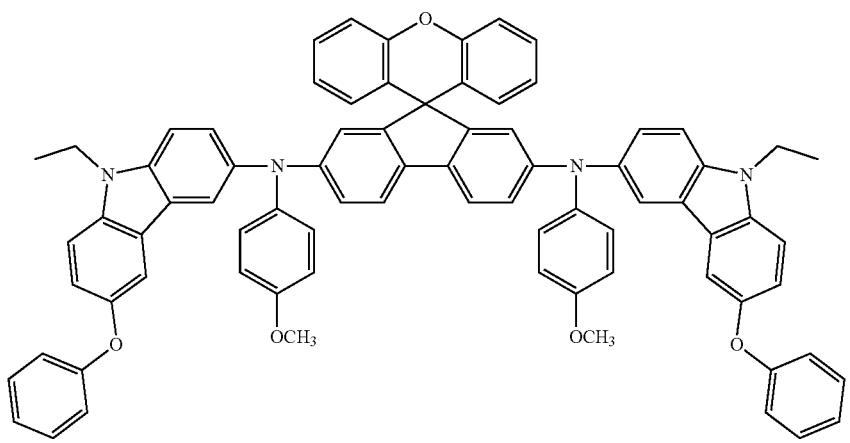
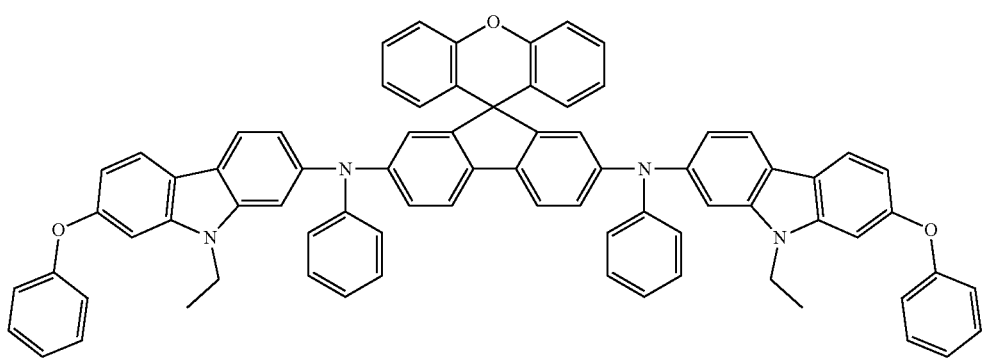
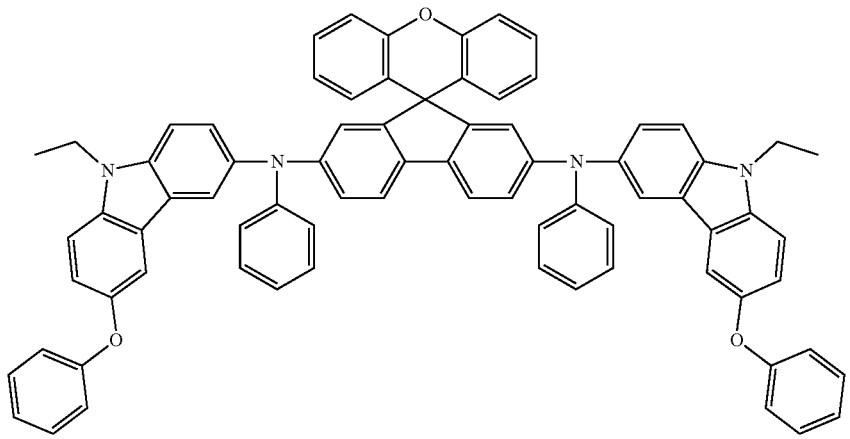
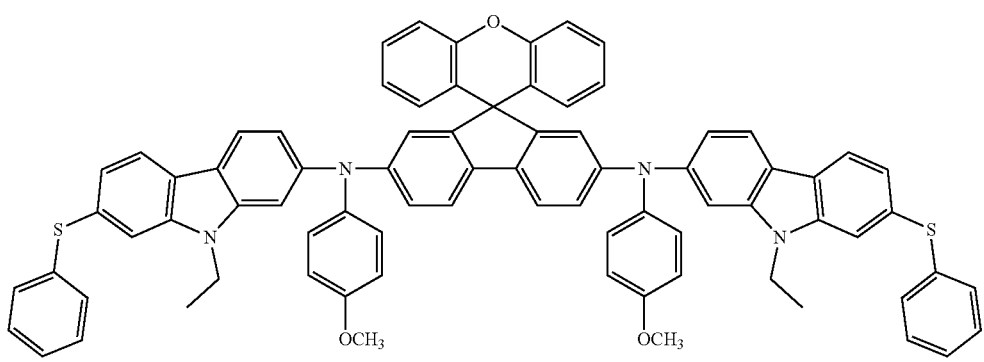

-continued
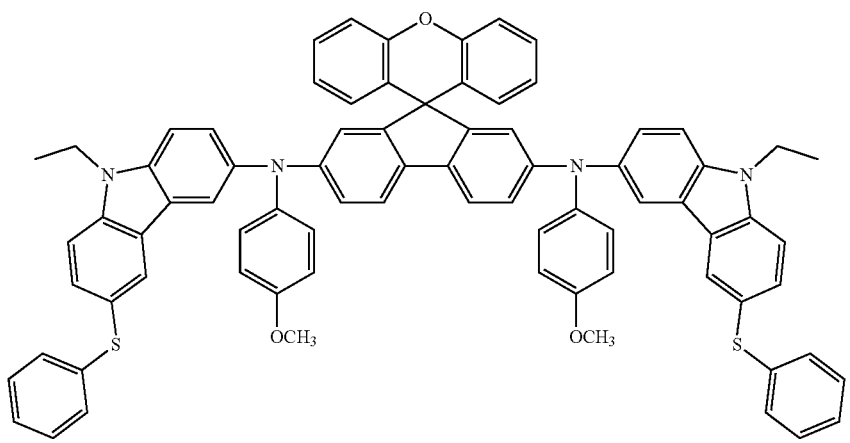
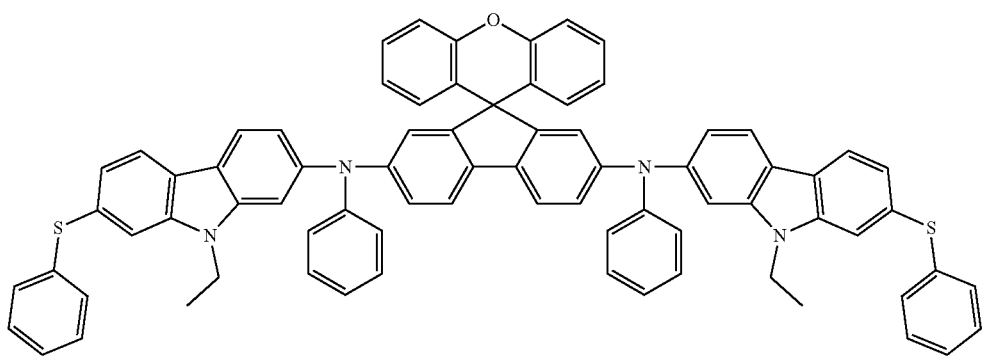
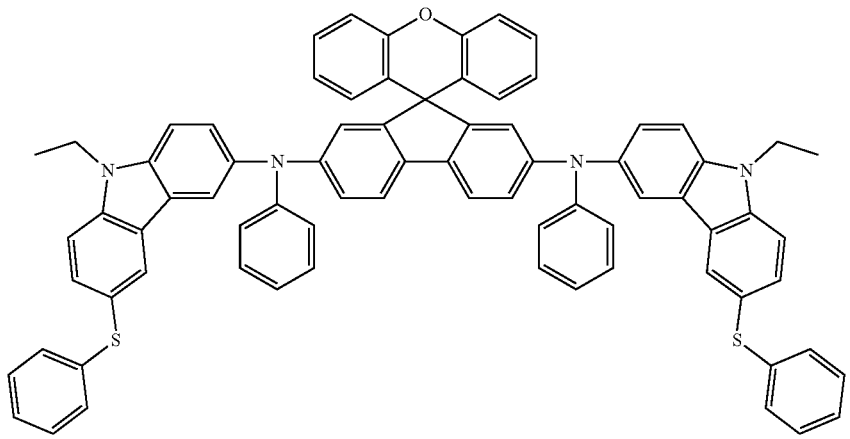
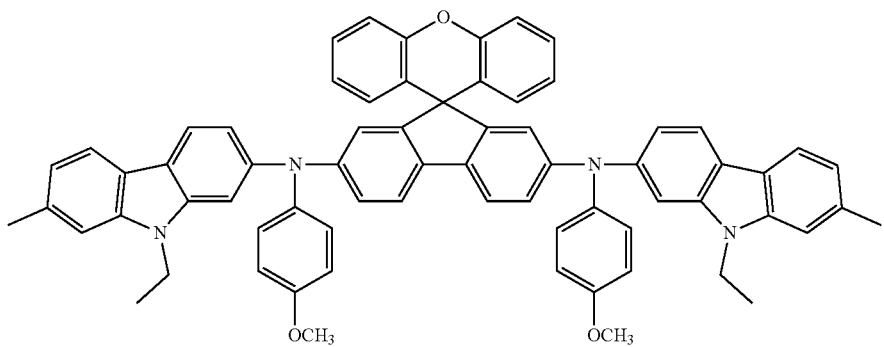

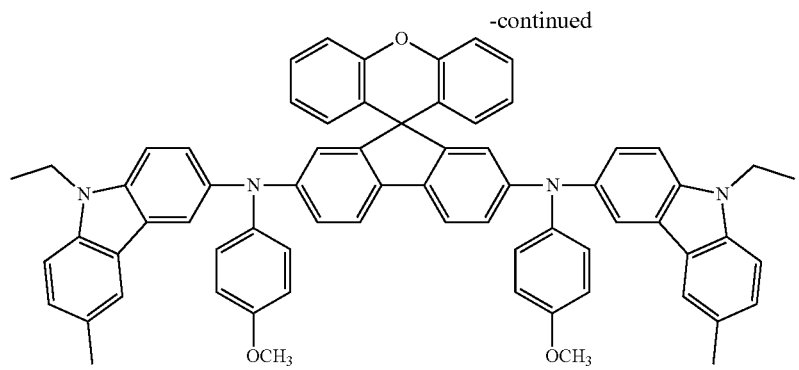
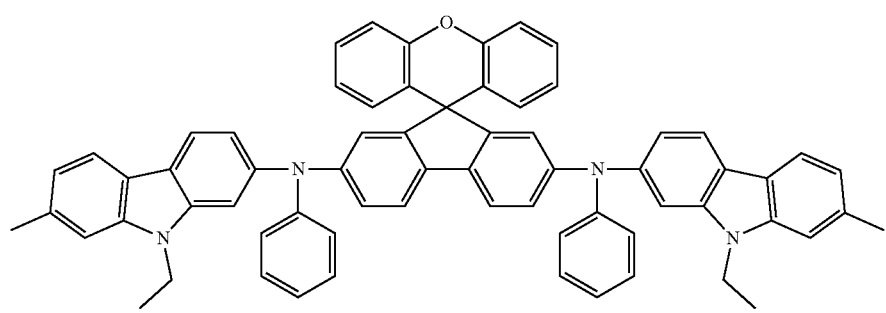
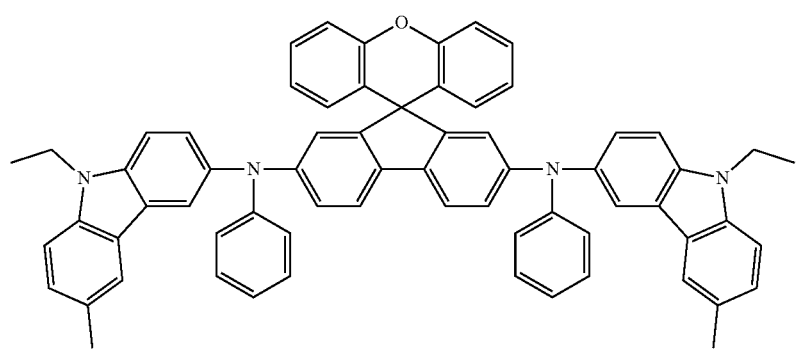
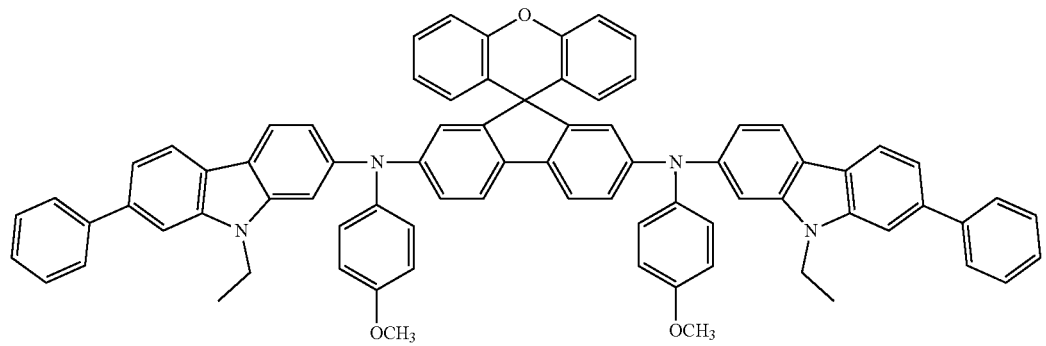

-continued
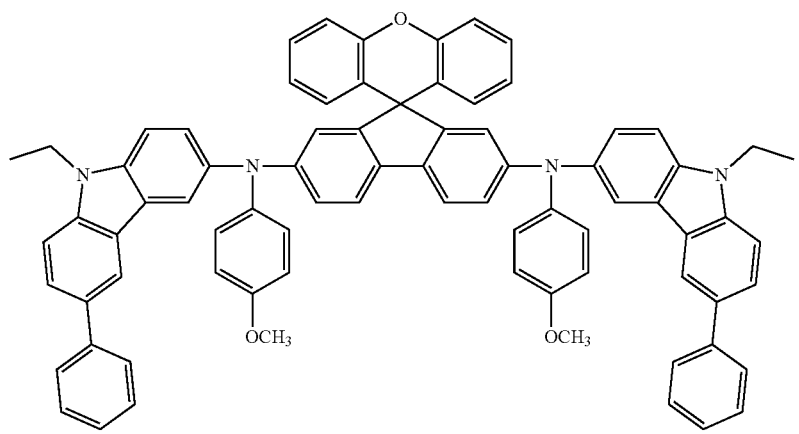
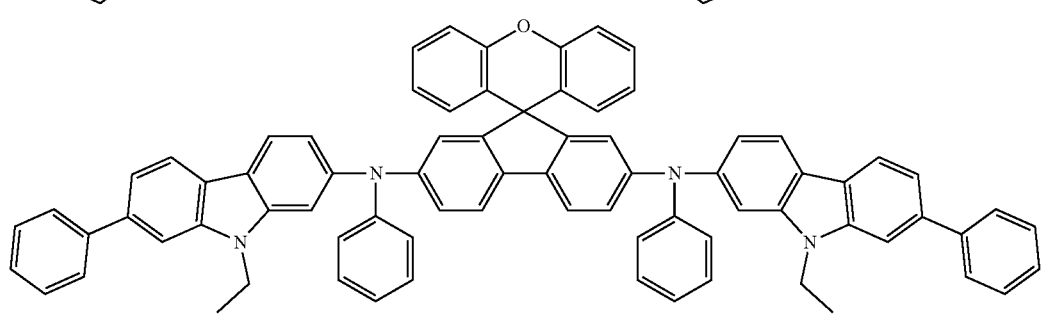
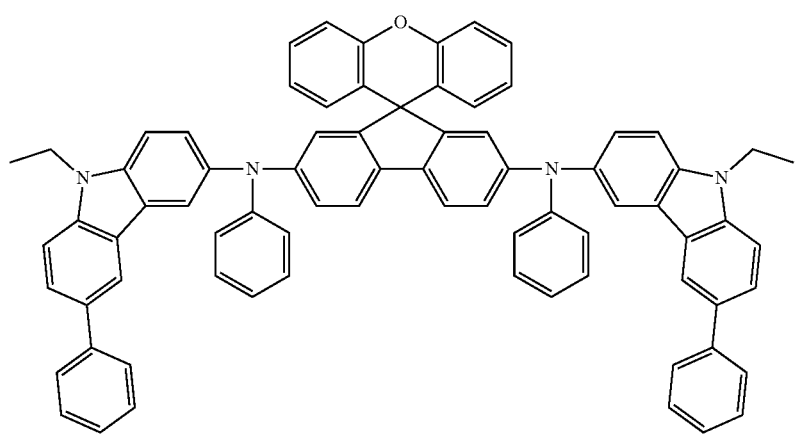
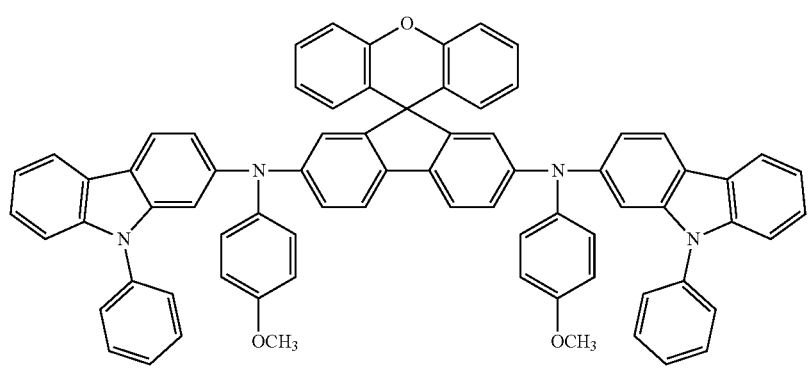

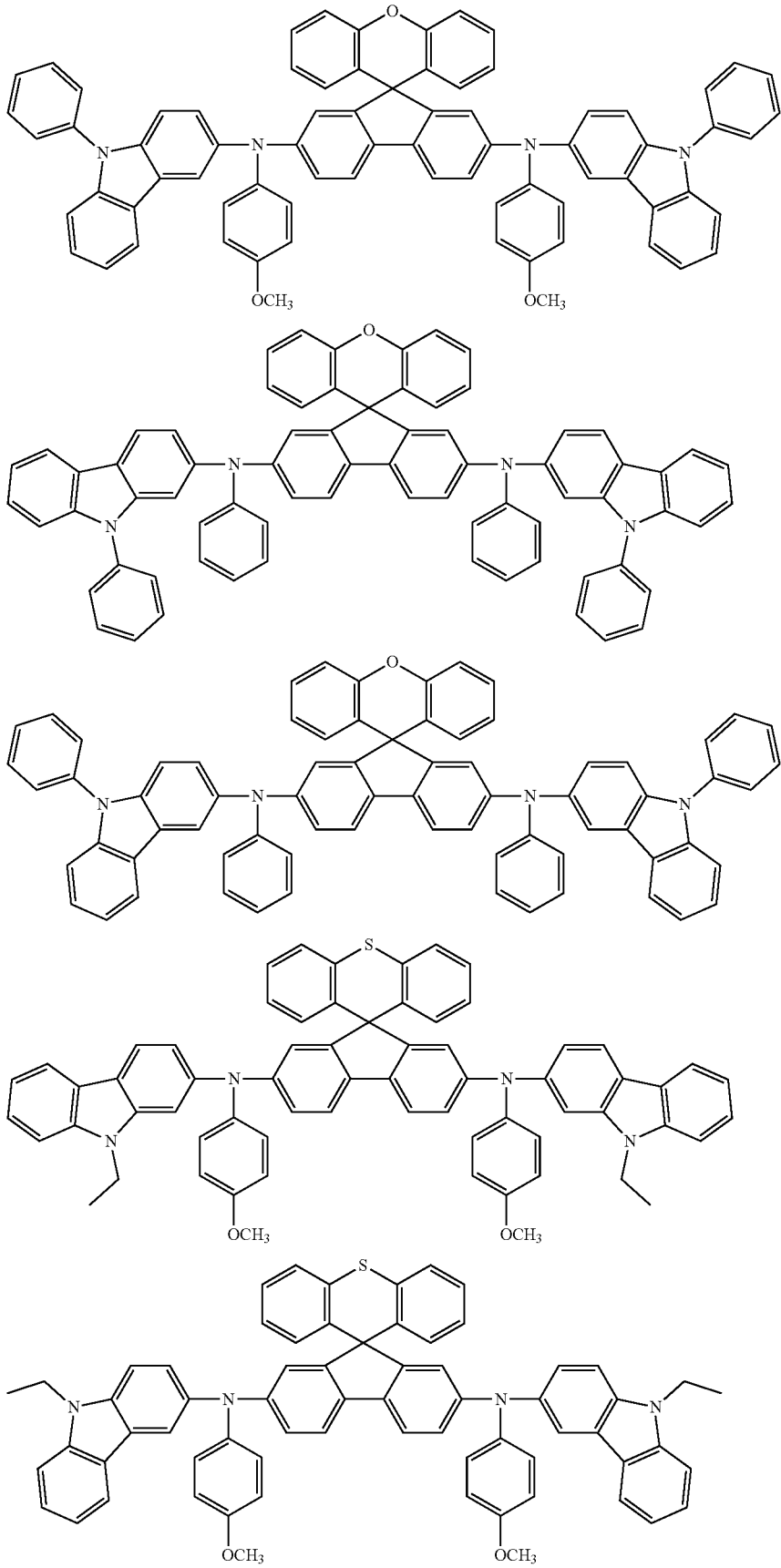

-continued
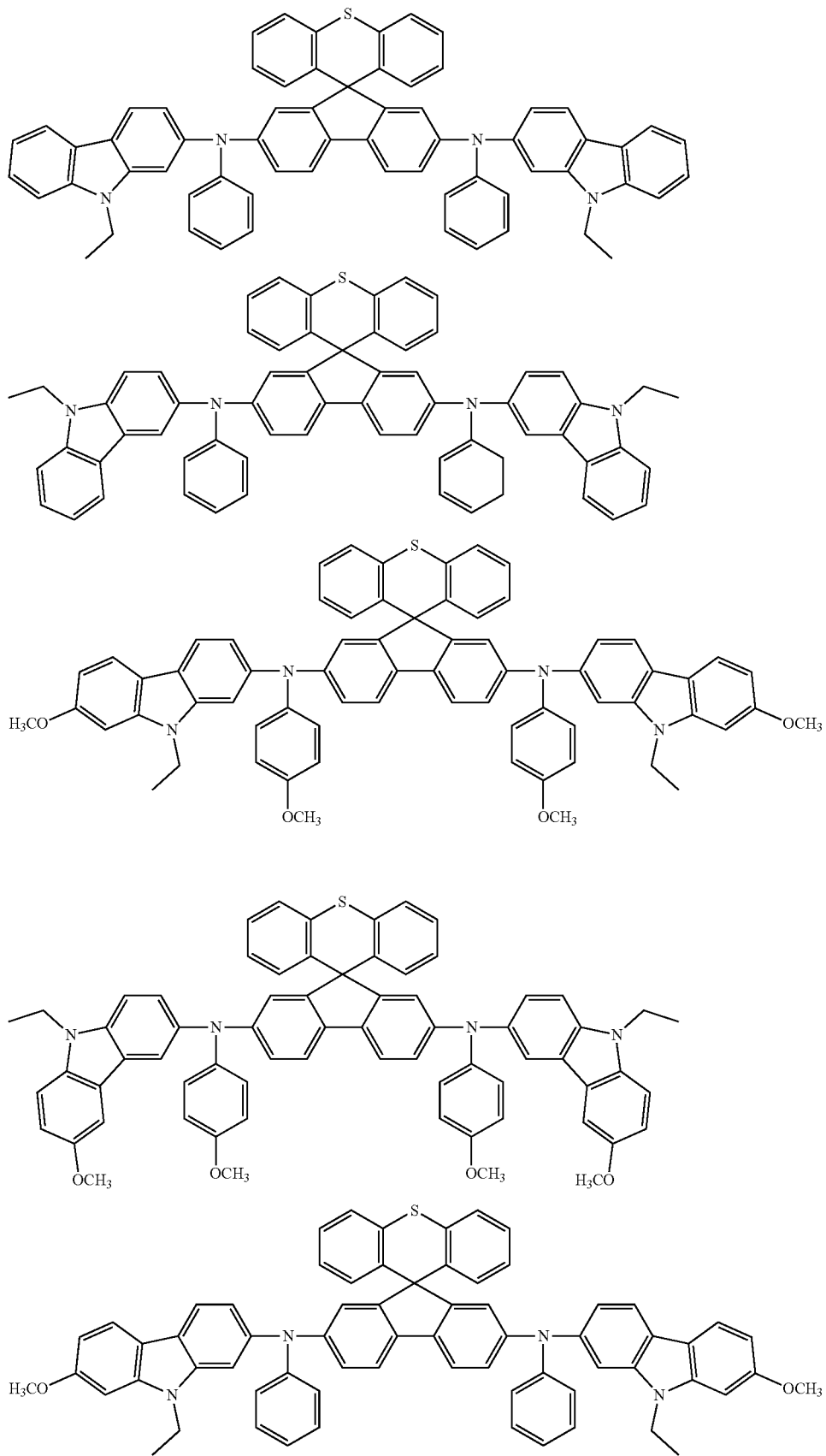

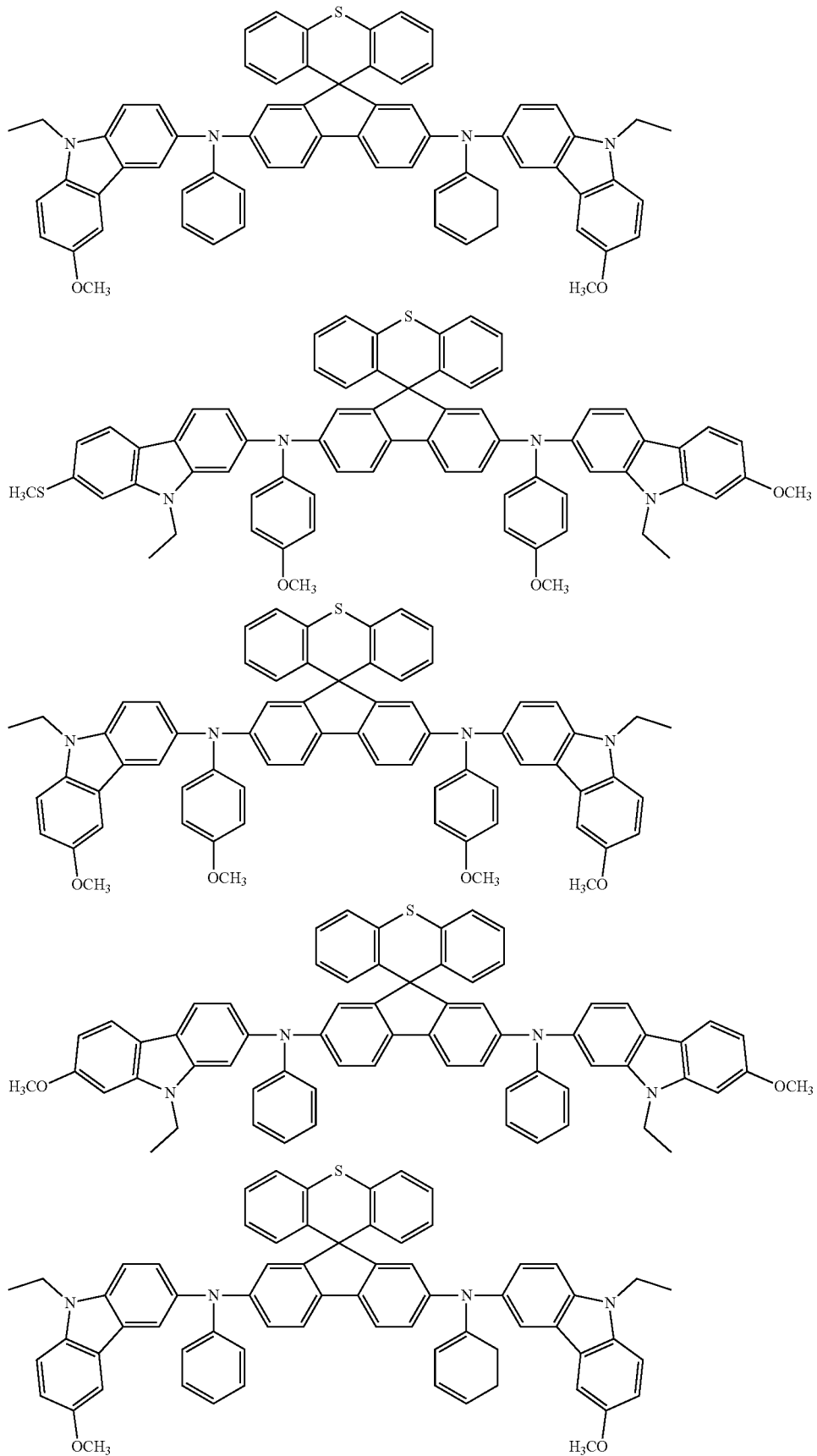

-continued
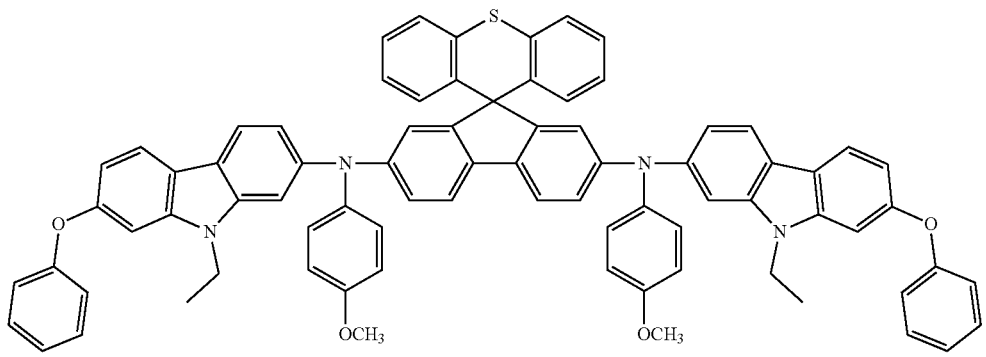
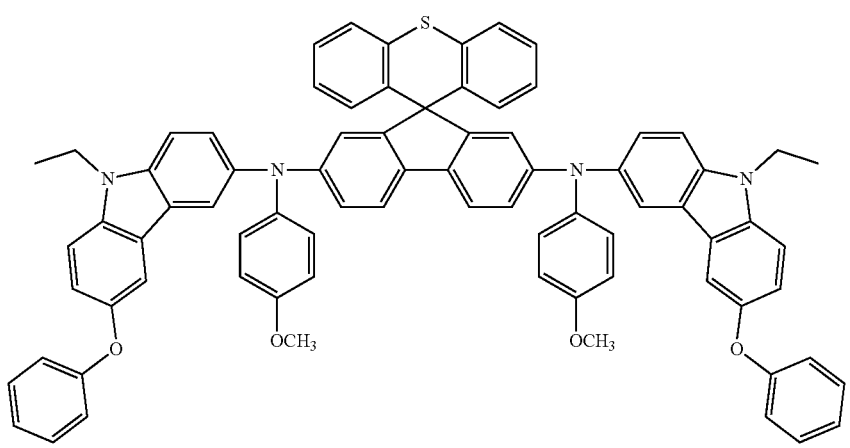
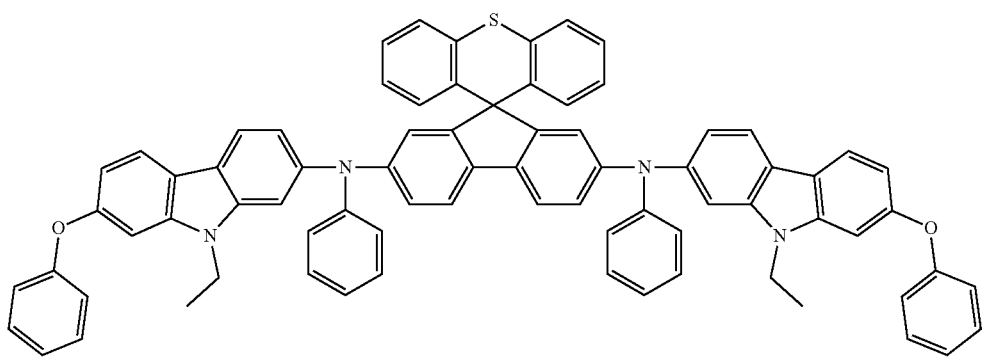
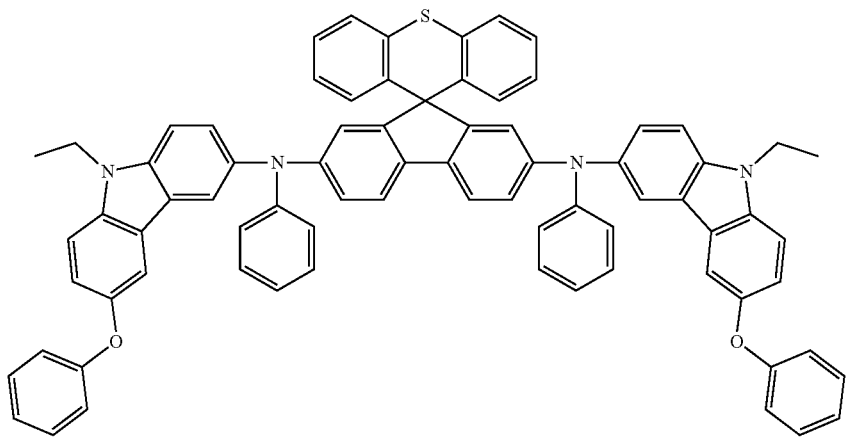

-continued
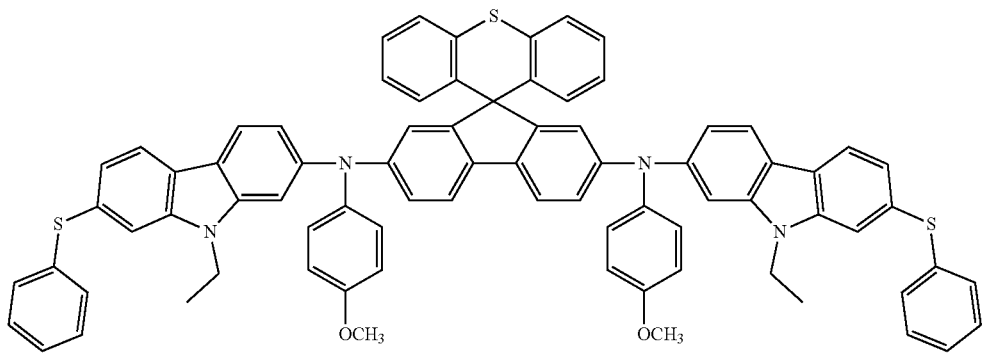
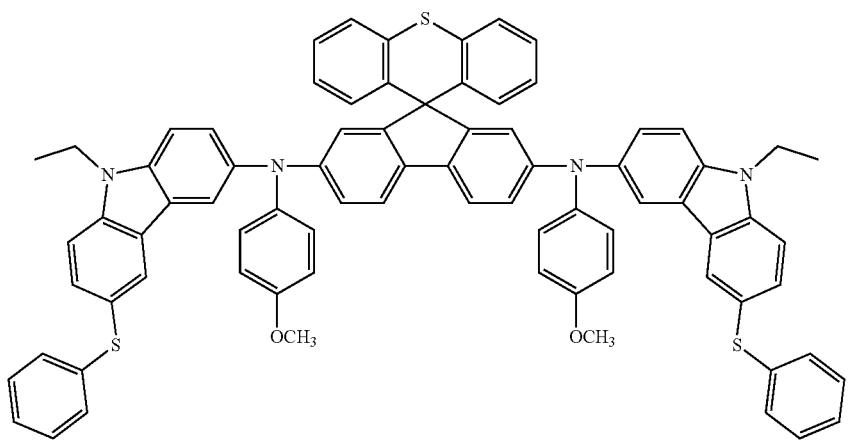
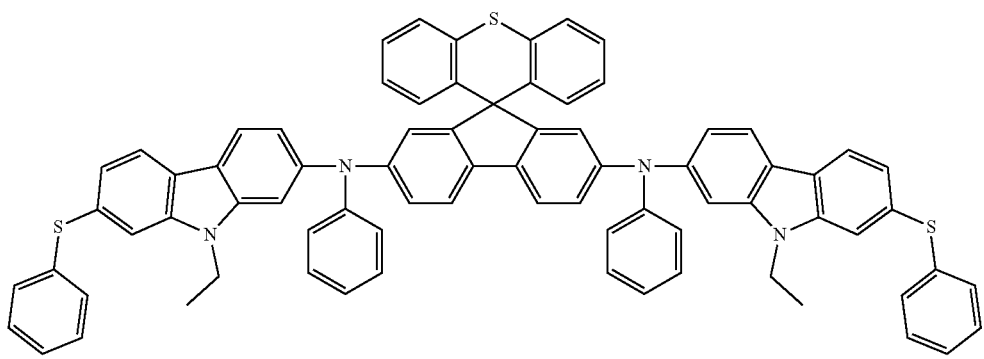
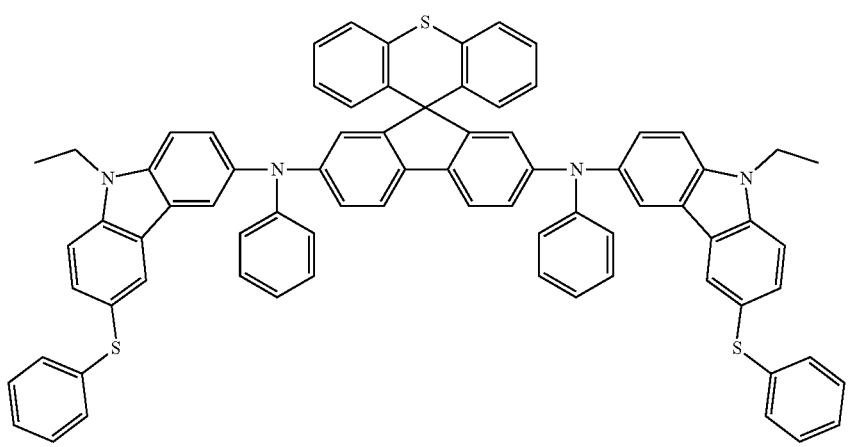

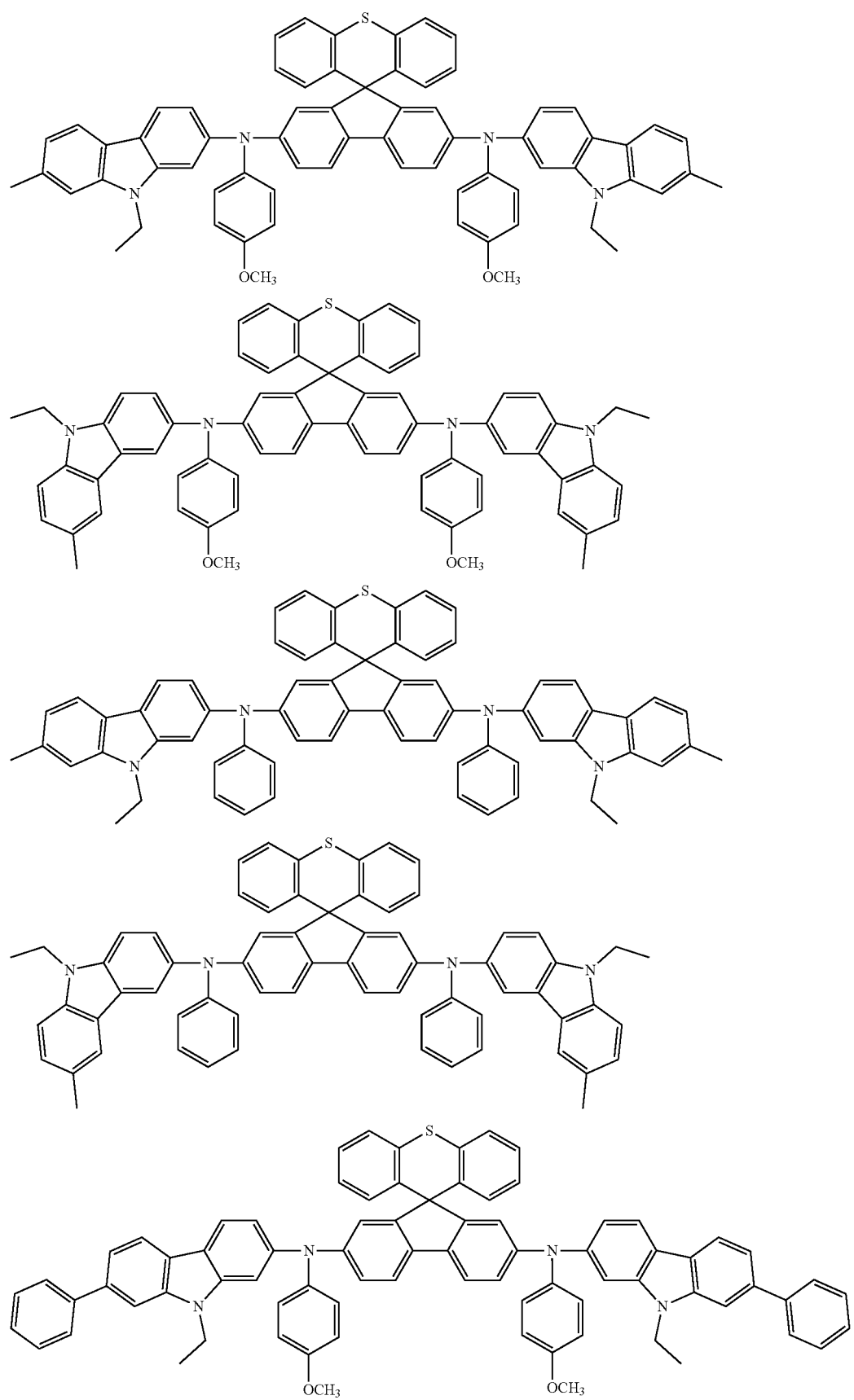

-continued
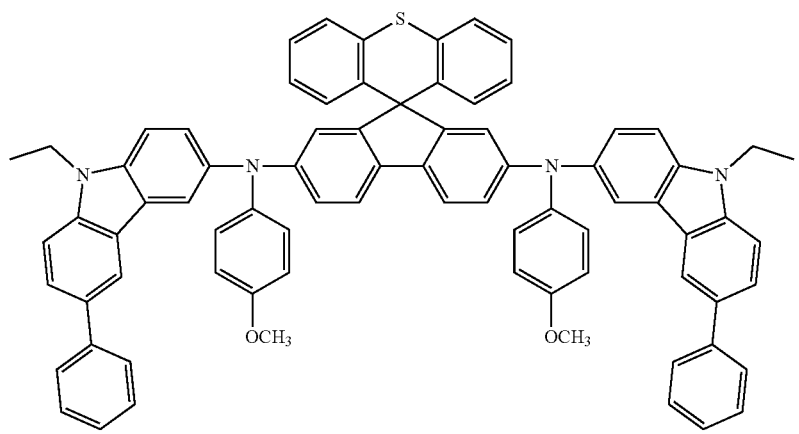
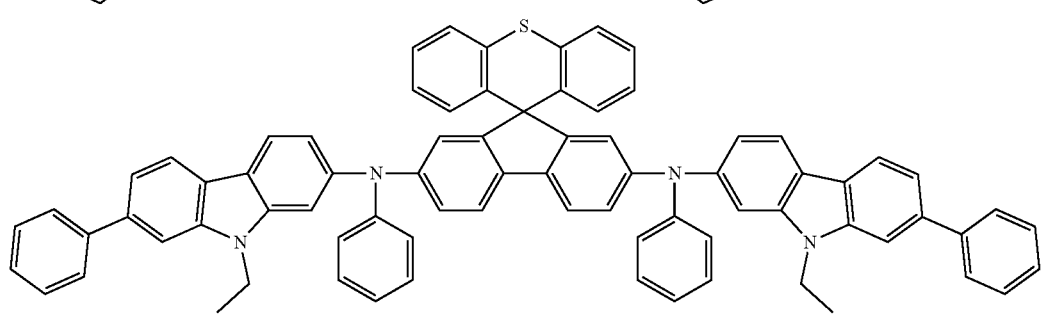
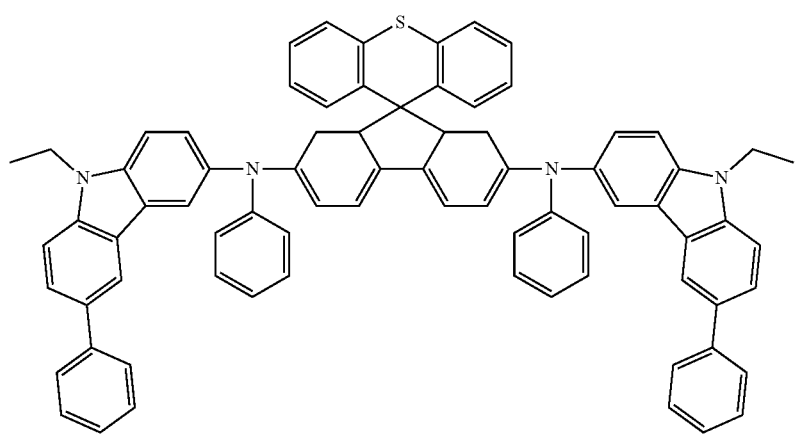
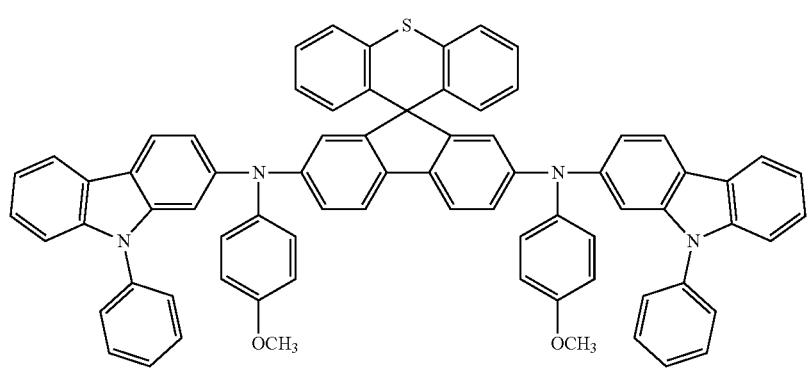

-continued
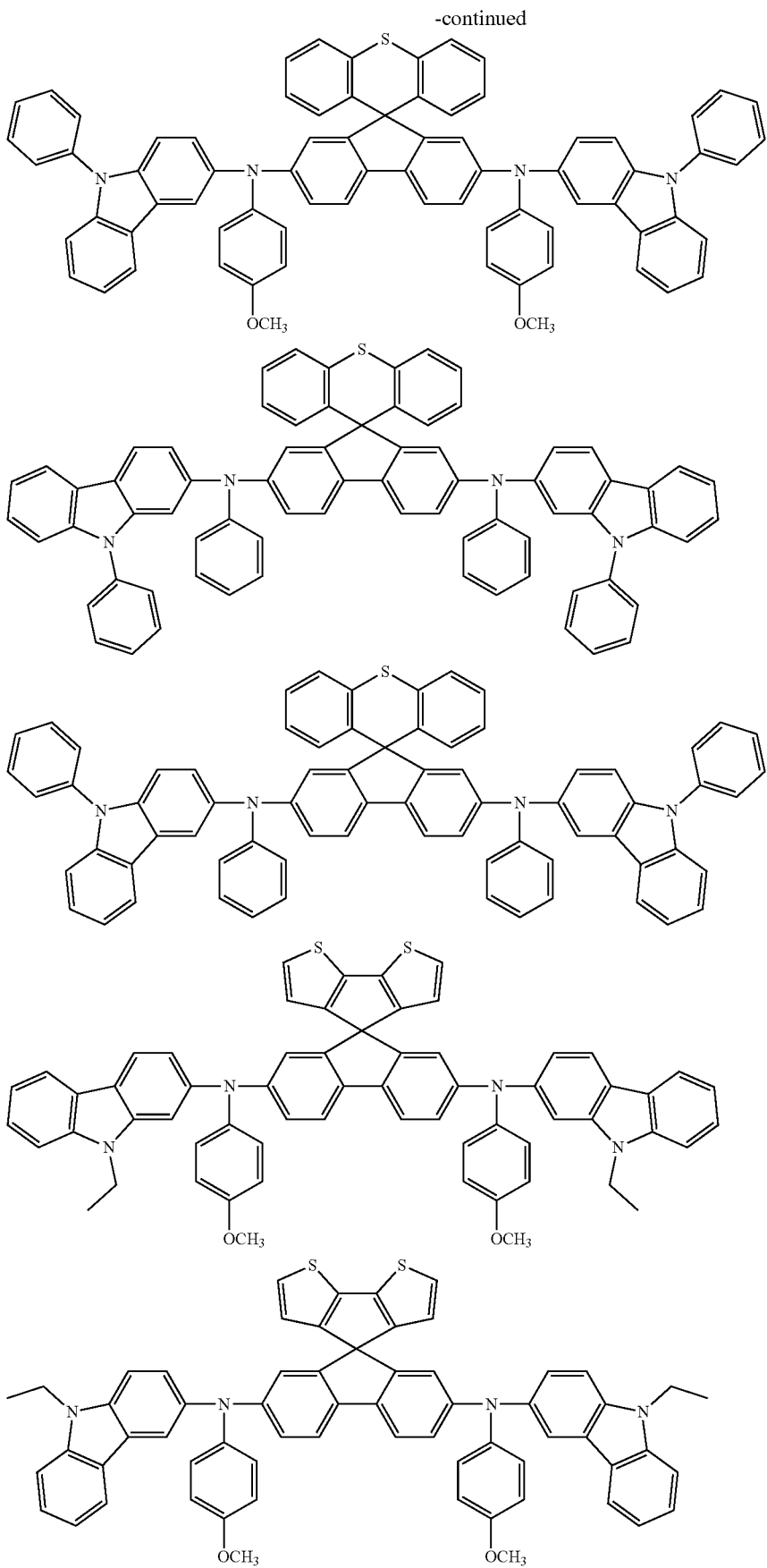

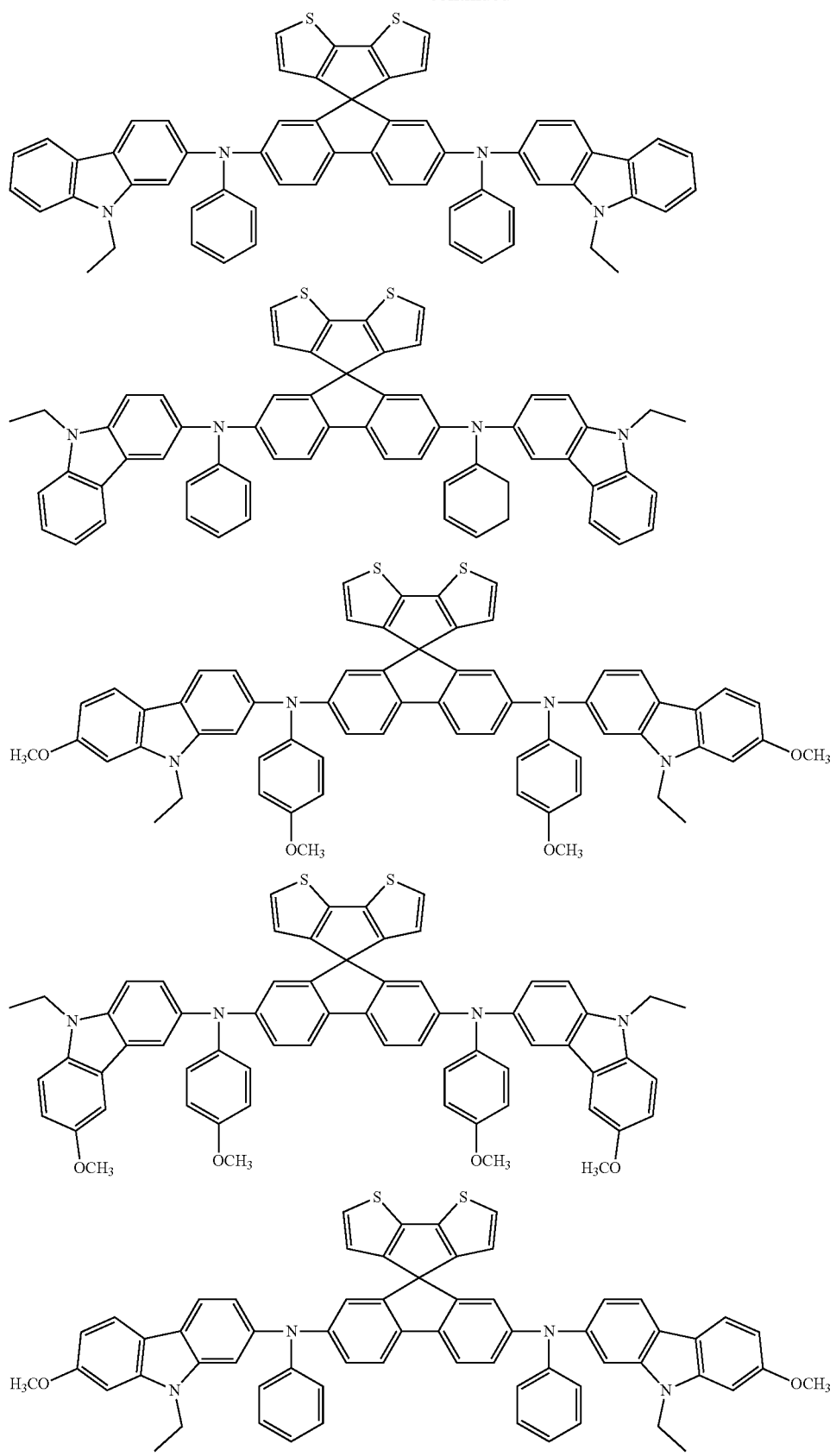

-continued
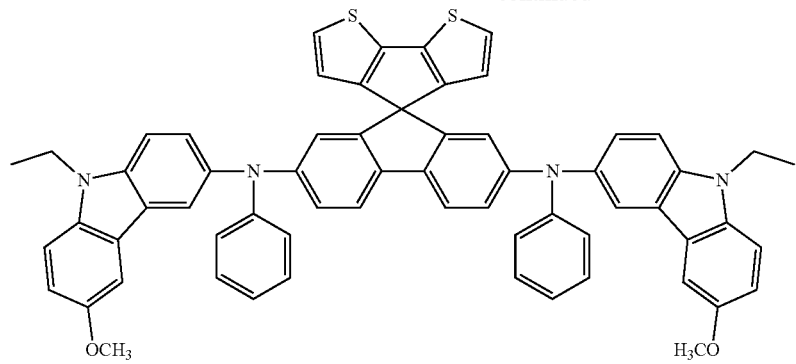
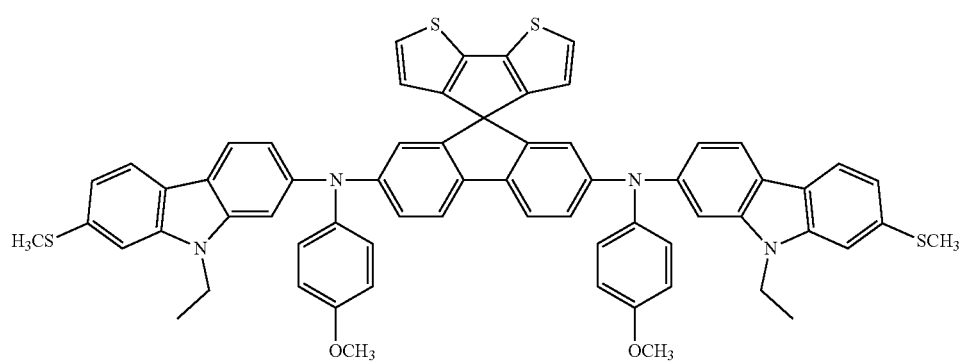
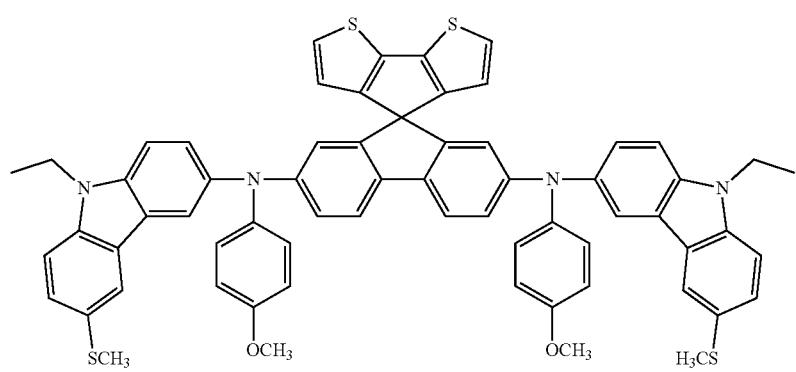
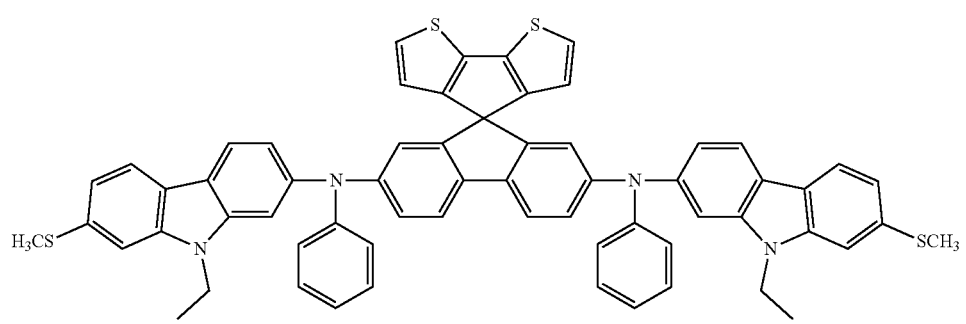

-continued
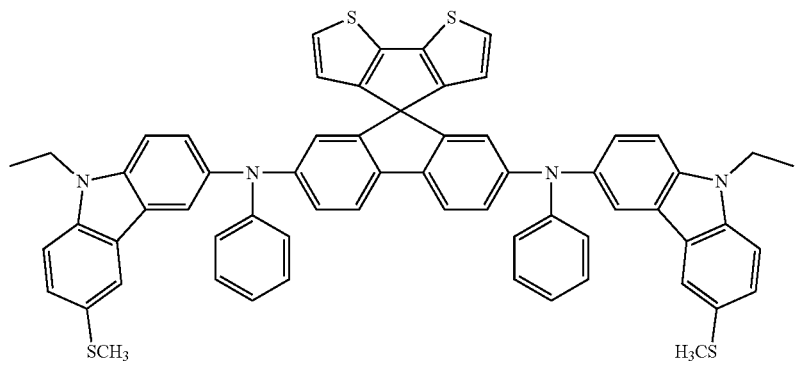
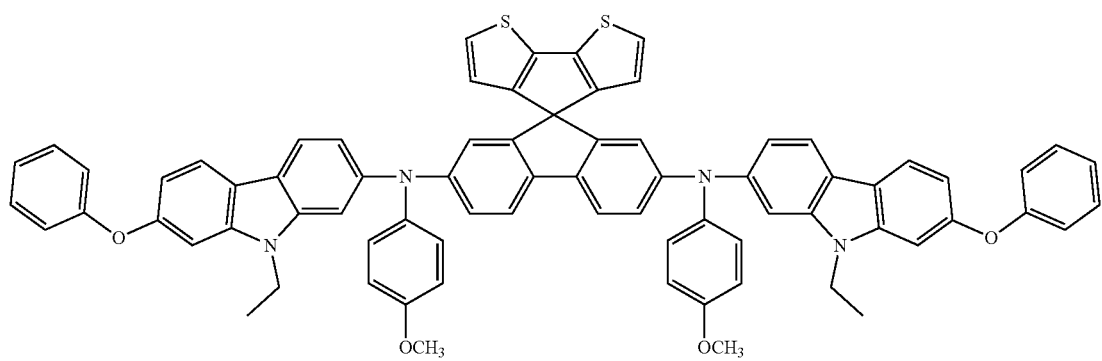
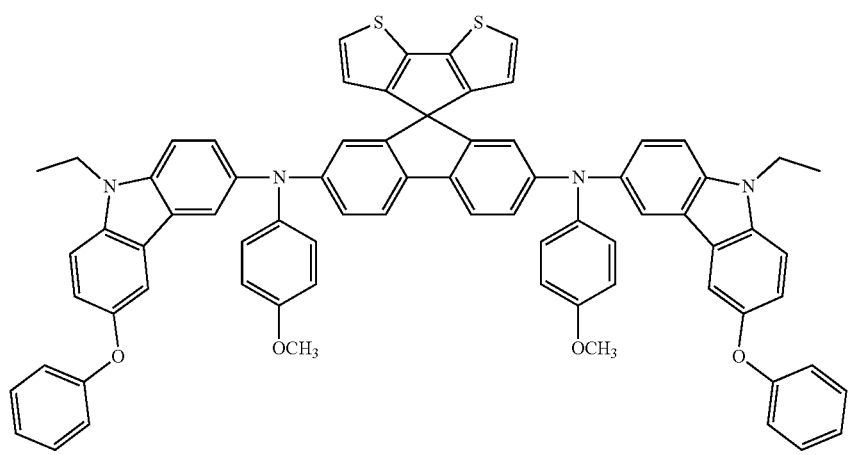
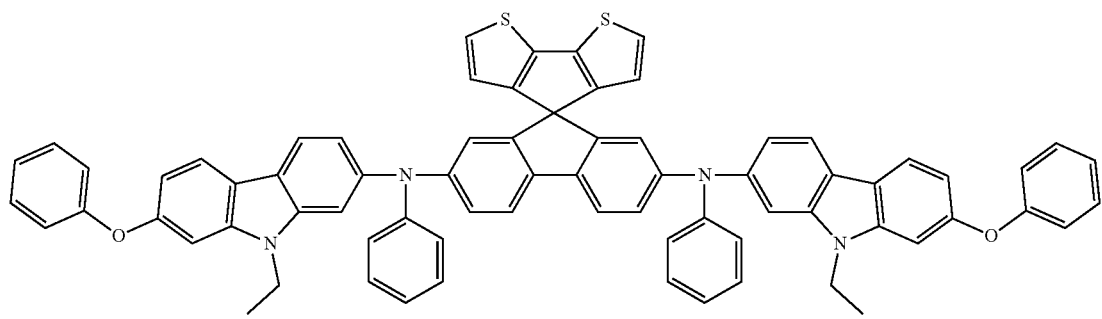

-continued
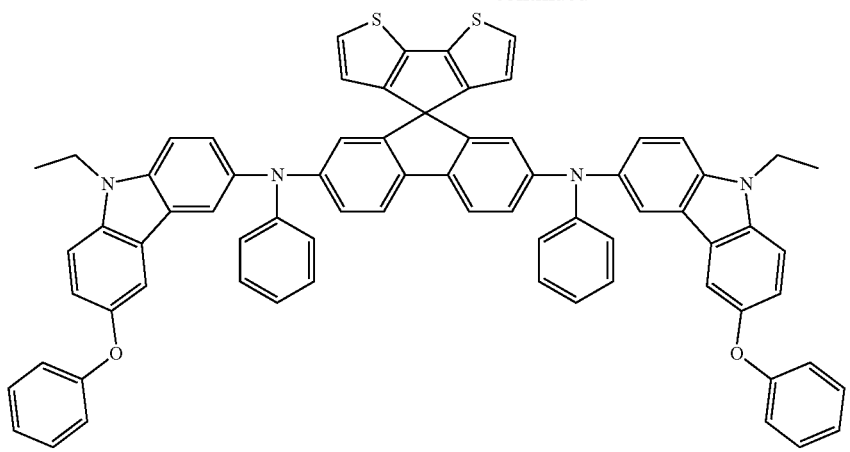
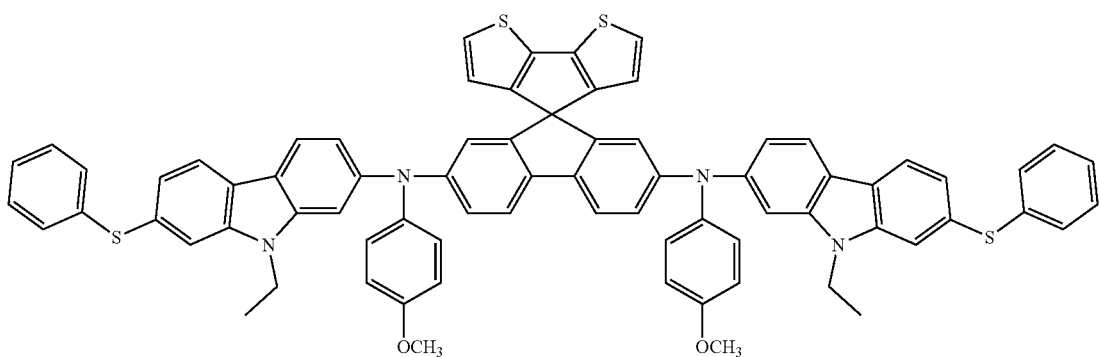
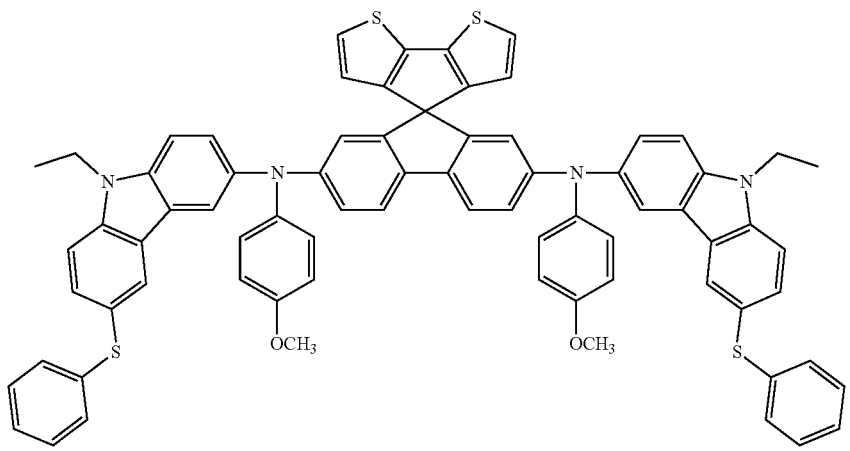
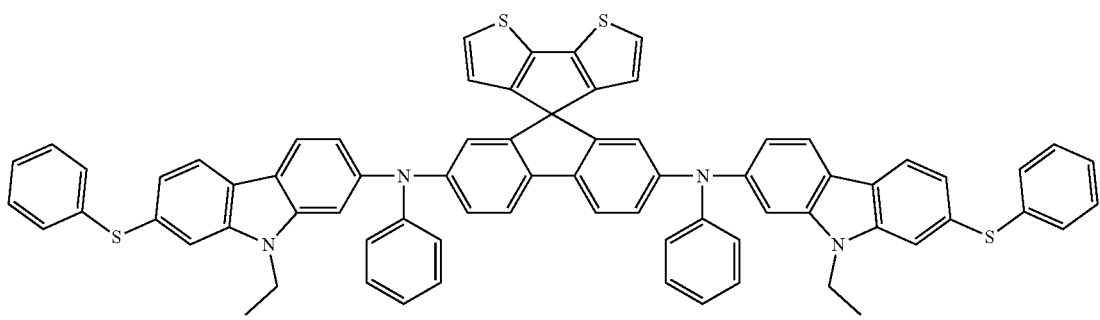

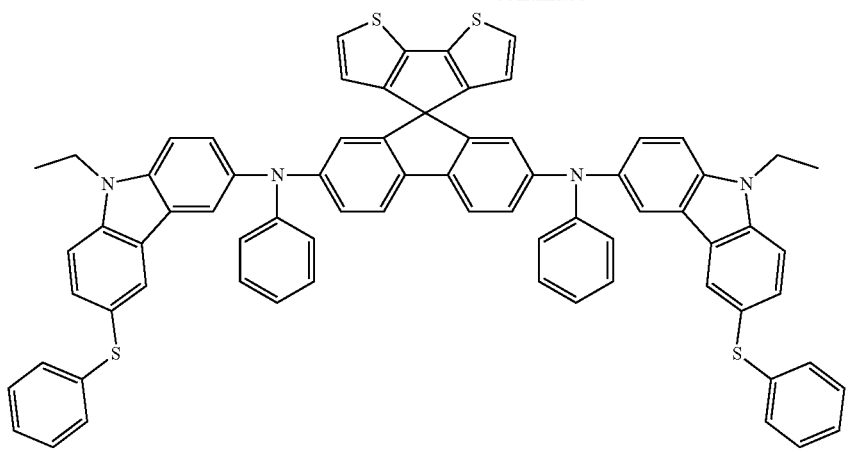
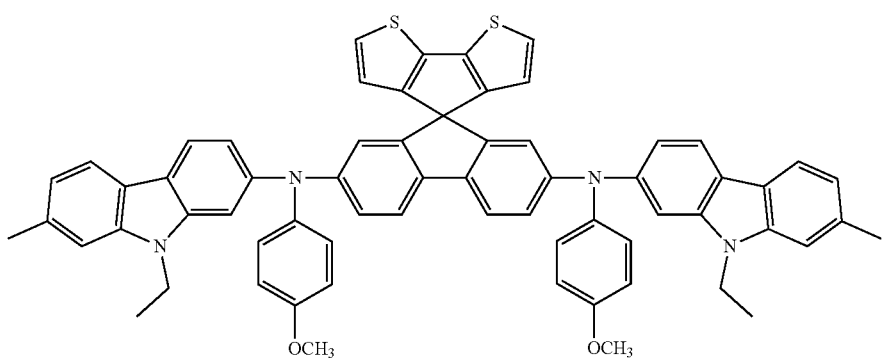
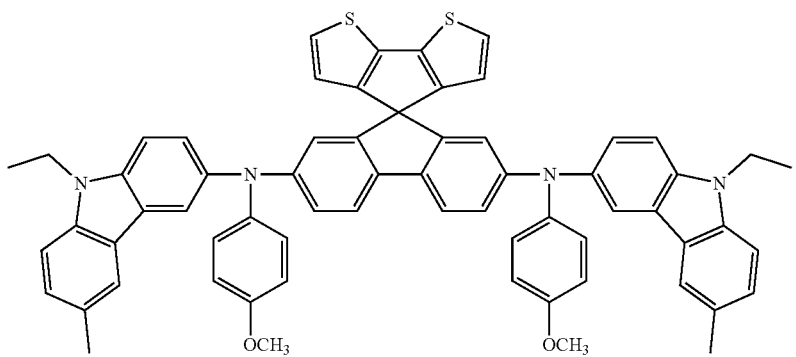
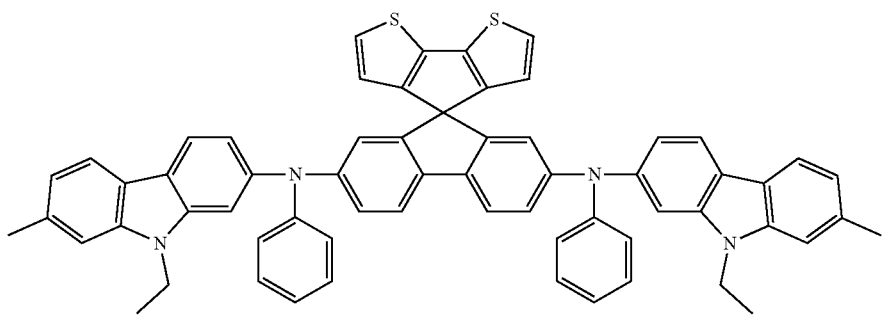

-continued
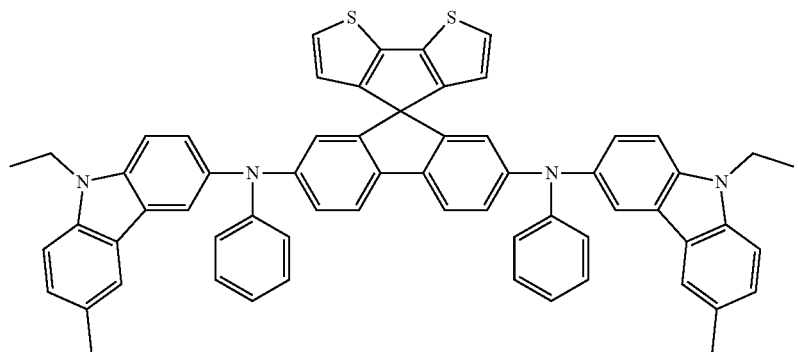
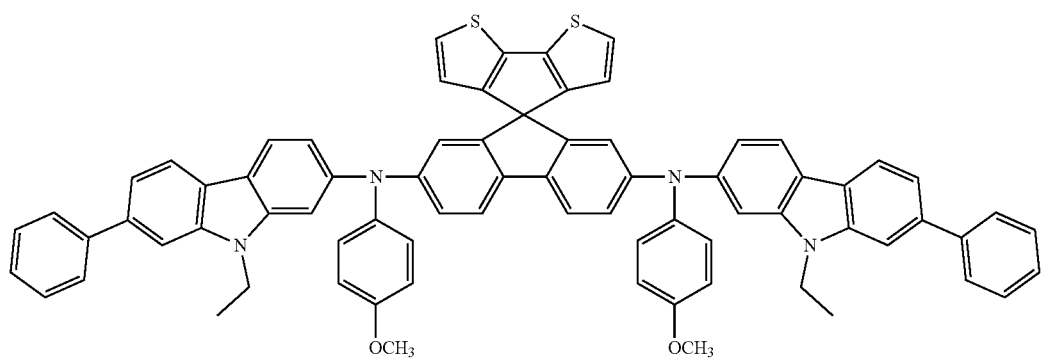
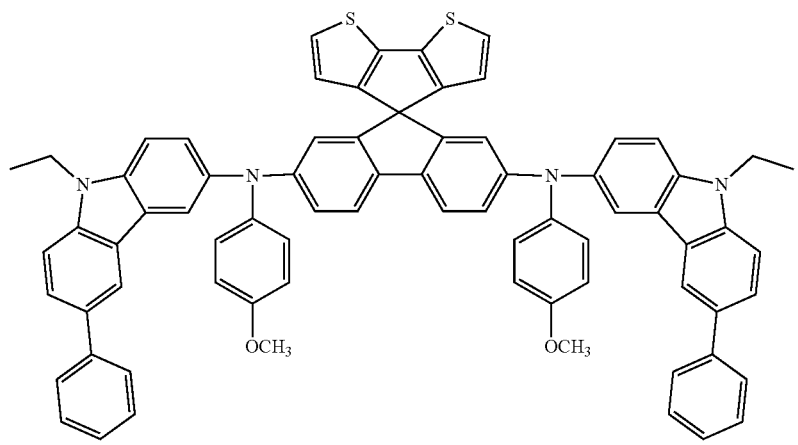
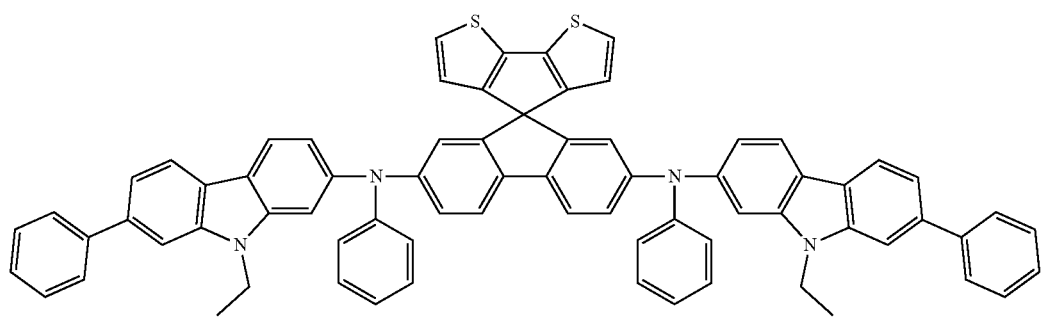

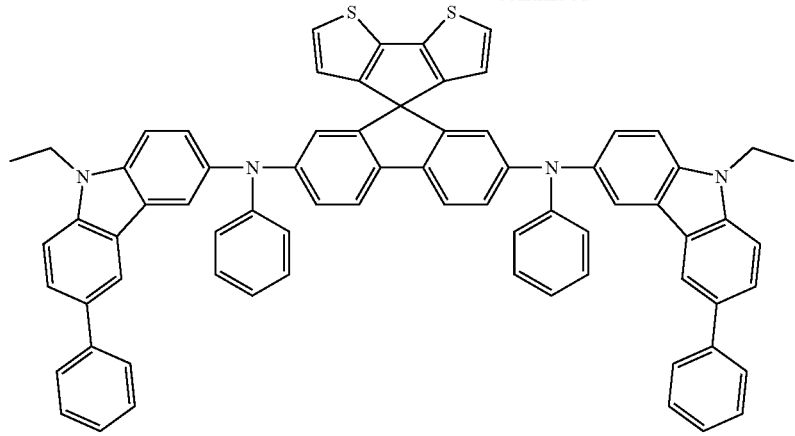
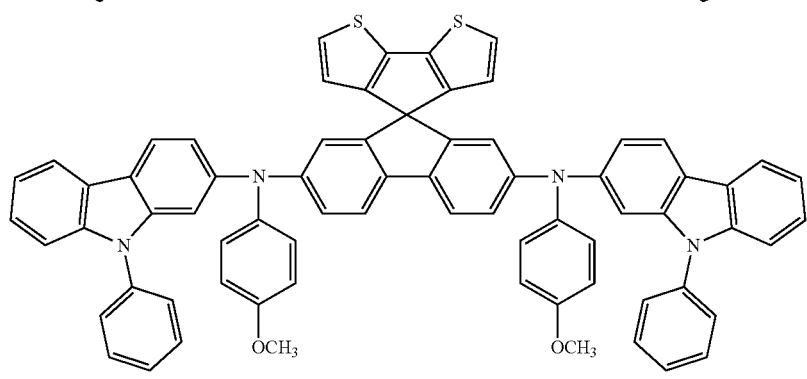
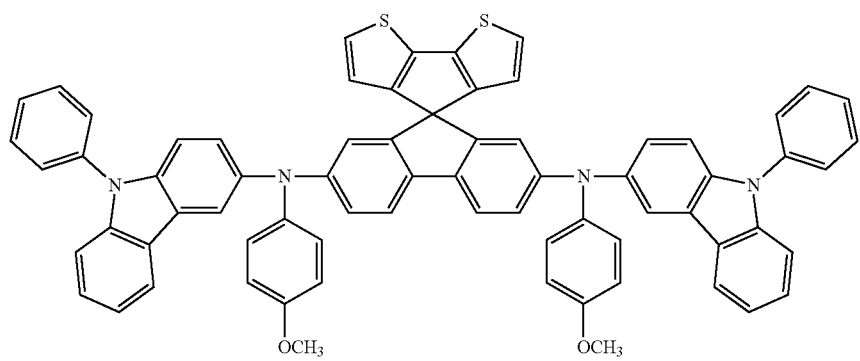
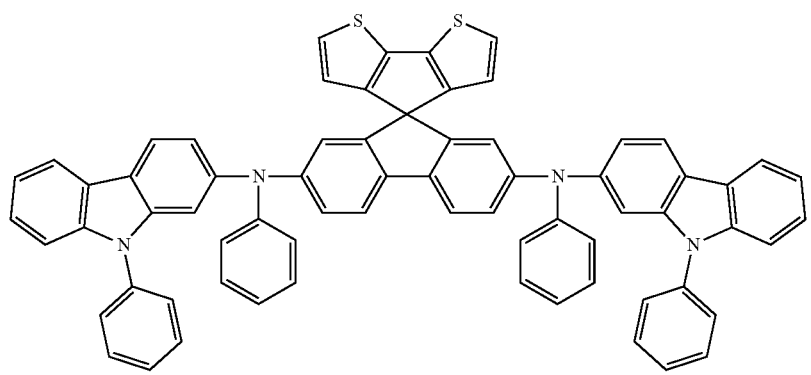

-continued
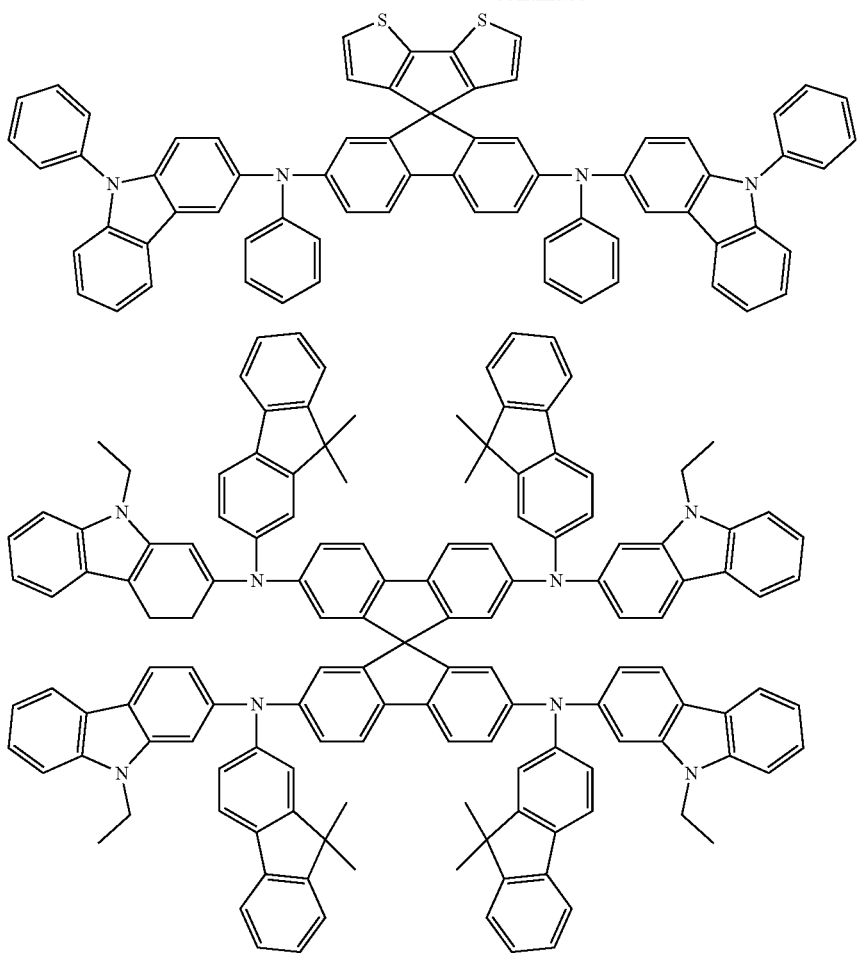
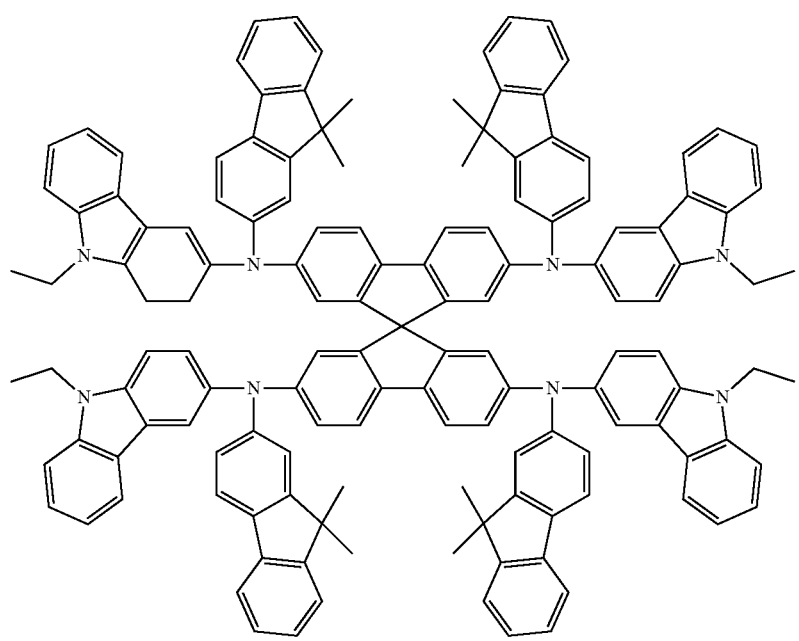

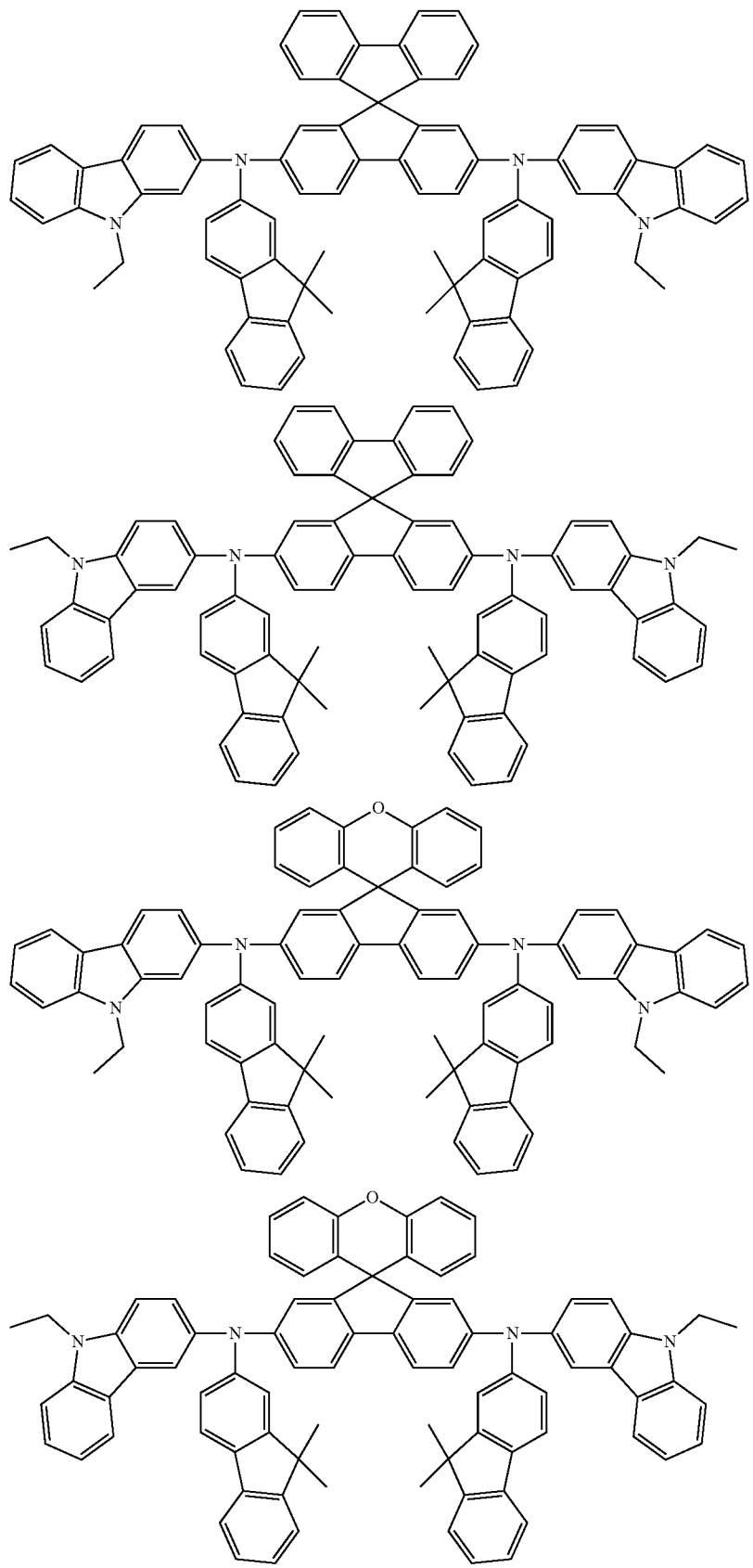

-continued
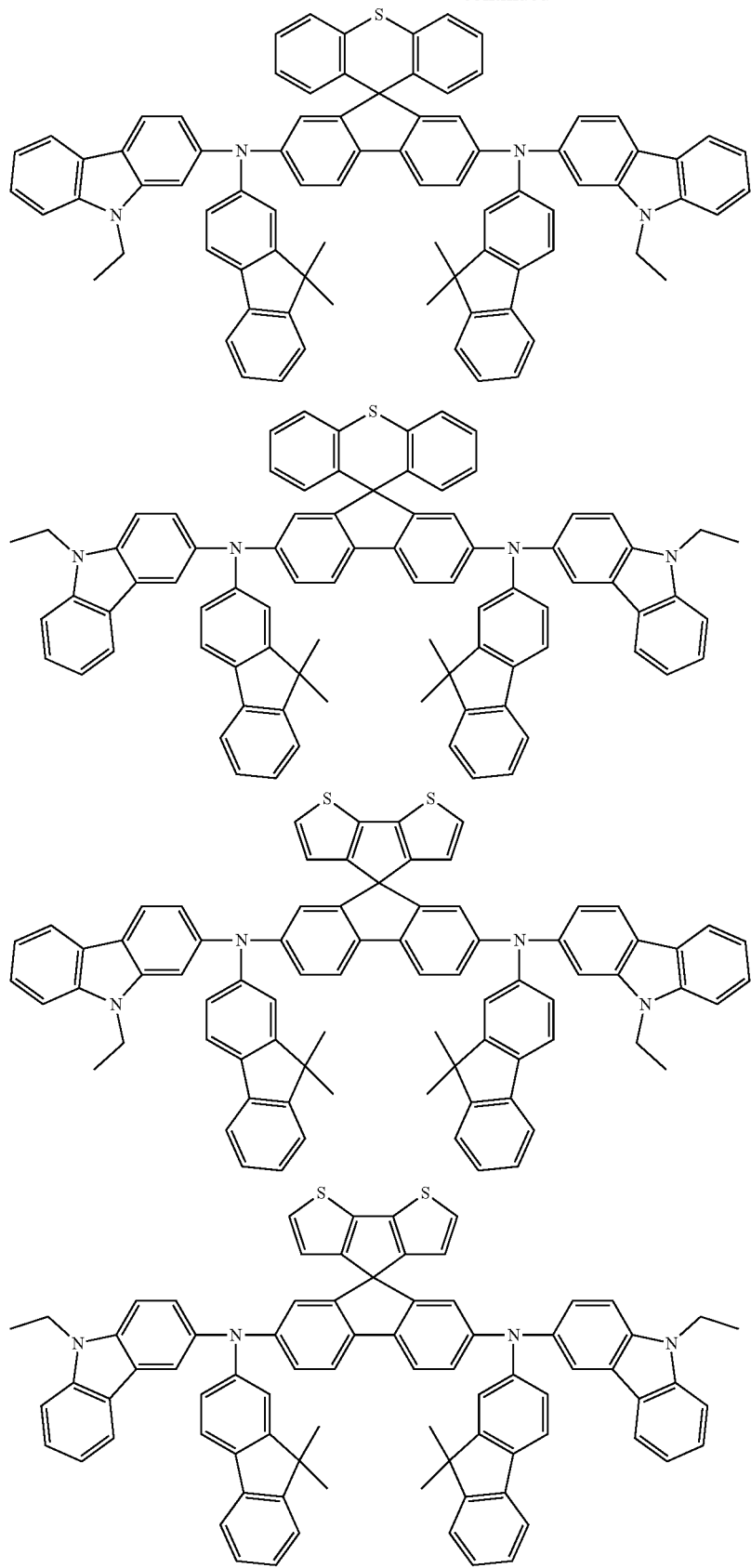

As an example, a hole transport compound represented by Formula 1 and having a carbazolylamino group as a substituent of the present invention may be prepared according to the following reaction scheme, but the present invention is not limited thereto.

[Reaction Scheme 1]

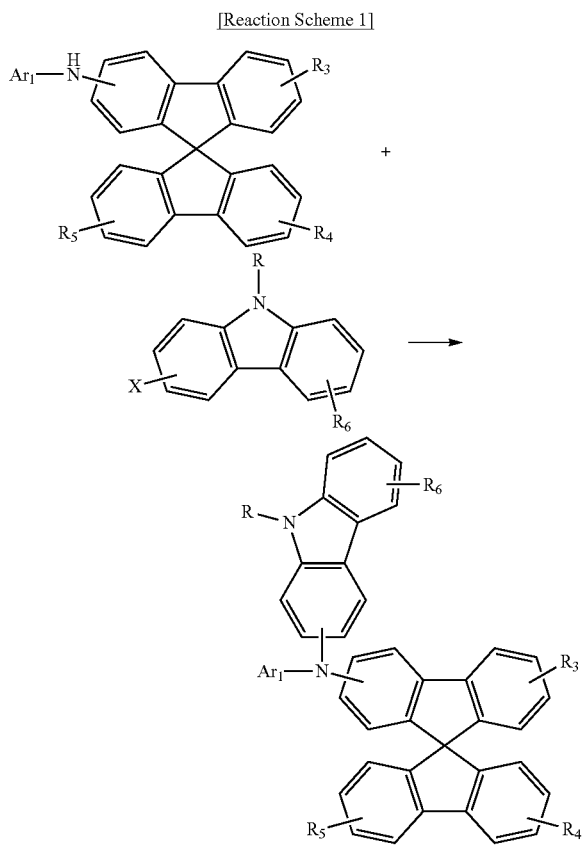

[In Reaction Scheme 1, $Ar_1$, R, and $R_3$ to $R_6$ are as defined in Formula 2, and X is halogen.]

The compound represented by Formula 1 according to an exemplary embodiment of the present invention may interact with a hole transport layer and a light absorption layer including a compound having a perovskite structure of the perovskite solar cell to be used as a buffer layer, but preferably may be used as a hole transport material of the perovskite solar cell.

The perovskite solar cell according to an exemplary embodiment of the present invention may include a first electrode, an electron transport layer formed on the first electrode, a light absorption layer formed on the electron transport layer and including a compound having a perovskite structure, a hole transport layer formed on the light absorption layer and including a compound represented by Formula 1, and a second electrode formed on the hole transport layer.

The parts corresponding to the respective components of the perovskite solar cell according to an exemplary embodiment of the present invention include the descriptions of International Patent Application No. PCT-KR$_{2014}$-C12727, except that the hole transport layer necessarily includes the compound represented by Formula 1.

Specifically, the first electrode according to an exemplary embodiment of the present invention may be any conductive electrode as long as it is ohmic-bonded to the electron transport layer, and the second electrode may be any conductive electrode as long as it is ohmic-bonded to the hole transport layer.

In addition, the first and second electrodes may be any material as long as it is generally used as an electrode material of a front electrode or a back electrode in a solar cell. As a non-limiting example, in a case where the first and second electrodes are the electrode materials of a back electrode, the first and second electrodes may be one or more materials selected from the group consisting of gold, silver, platinum, palladium, copper, aluminum, carbon, cobalt sulfide, copper sulfide, nickel oxide, and a composite thereof. As a non-limiting example, in a case where the first and second electrodes are transparent electrodes, the first and second electrodes may be an inorganic-based conductive electrode such as a fluorine doped tin oxide (FTO), indium doped tin oxide (TIO), ZnO, carbon nanotube (CNT), or graphene, or an organic-based conductive electrode such as PEDOT:PSS. In case of providing a transparent solar cell, it is preferable that the first and second electrodes are transparent electrodes, and in case of providing a flexible solar cell or a transparent solar cell, it is more preferable that the first and second electrodes are organic-based conductive electrodes.

The first electrode may be formed on a rigid substrate or a flexible substrate by deposition or coating. Deposition may be physical vapor deposition or chemical vapor deposition, and may be performed by thermal evaporation. Coating may be performed by coating a solution or dispersion of an electrode material on a substrate and performing drying, or by selectively performing heat treatment on a dried film. However, it is a matter of course that the first and second electrodes may be formed by a method used for forming a front electrode or a back electrode in a general solar cell.

The electron transport layer formed on the first electrode of the present invention may be an electron conductive organic layer or inorganic layer. The electron conductive organic material may be an organic material used as an n-type semiconductor in a general organic solar cell. As a specific and non-limiting example, the electron conductive organic material may include fullerene (C60, C70, C74, C76, C78, C82, C95), fullerene-derivatives including [6,6]-phenyl-C61butyric acid methyl ester (PCBM), C71-PCBM, C84-PCBM, and [6,6]-phenyl $C_{70}$-butyric acid methyl ester ($PC_{70}BM$), polybenzimidazole (PBI), 3,4,9,10-perylenetetracarboxylic bisbenzimidazole (PTCBI), tetra uorotetracyanoquinodimethane (F4-TCNQ), or a mixture thereof. The electron conductive inorganic material may be an electron conductive metal oxide used for electron transportation in a general quantum dot-based solar cell or dye-sensitized solar cell. As a specific example, the electron conductive metal oxide may be an n-type metal oxide semiconductor. A non-limiting example of the n-type metal oxide semiconductor may include one or two or more materials selected from the group consisting of Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide, and SrTi oxide, and may include a mixture or composite thereof.

The light absorption layer formed on the electron transport layer of the perovskite solar cell according to an exemplary embodiment of the present invention includes a compound having a perovskite structure, and all compounds included in a range recognized by those skilled in the art to which the present invention pertains may be used as the compound having a perovskite structure.

As an example, the compound refers to a compound containing a monovalent organic cation, a divalent metal cation, and a halogen anion, and having a perovskite structure.

As a specific example, the compound having a perovskite structure of the present invention may be one or two or more materials selected from perovskite compounds satisfying the following Formulas 11 and 12.

$$AMX_3 \quad \text{[Formula 11]}$$

(In Formula 11, A is a monovalent organic ammonium ion or $Cs^+$, M is a divalent metal ion, and X is a halogen ion.)

$$A_2MX_4 \quad \text{[Formula 12]}$$

(In Formula 12, A is a monovalent organic ammonium ion or $Cs^+$, M is a divalent metal ion, and X is a halogen ion.)

Here, M may be positioned at a center of a unit cell in the perovskite structure, X may be positioned at a center of each face of the unit cell and forms an octahedron structure with M as the center, and A may be positioned at each corner of the unit cell.

Specifically, a compound of the light absorption layer may be each independently selected from one or two or more compounds satisfying the following Formulas 13 to 16.

$$(R_1\text{---}NH_3^+)MX_3 \quad \text{[Formula 13]}$$

(In Formula 13, $R_1$ is (C1-C24)alkyl, (C3-C20)cycloalkyl, or (C6-C20)aryl, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $Cl^-$, $Br^-$, and $I^-$.)

$$(R_1\text{---}NH_3^+)_2MX_4 \quad \text{[Formula 14]}$$

(In Formula 14, $R_1$ is (C1-C24)alkyl, (C3-C20)cycloalkyl, or (C6-C20)aryl, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $Cl^-$, $Br^-$, and $I^-$.)

$$(R_2\text{---}C_3H_3N_2^+\text{---}R_3)MX_3 \quad \text{[Formula 15]}$$

(In Formula 15, $R_2$ is (C1-C24)alkyl, (C3-C20)cycloalkyl, or (C6-C20)aryl, $R_3$ is hydrogen or (C1-C24)alkyl, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $Cl^-$, $Br^-$, and $I^-$.)

$$(R_2\text{---}C_3H_3N_2^+\text{---}R_3)_2MX_4 \quad \text{[Formula 16]}$$

(In Formula 16, $R_2$ is (C1-C24)alkyl, (C3-C20)cycloalkyl, or (C6-C20)aryl, $R_3$ is hydrogen or (C1-C24)alkyl, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $Cl^-$, $Br^-$, and $I^-$.)

As an example, the compound having a perovskite structure may be $AMX^a_xX^b_y$ or $A_2MX^a_xX^b_y$ (x is a real number of $0<x<3$, y is a real number of $0<y<3$, $x+y=3$, and $X^a$ and $X^b$ are halogen ions that are different from each other).

As an example, in Formula 13 or Formula 14, $R_1$ may be (C1-C24)alkyl, preferably (C1-C7)alkyl, and more preferably methyl. As a specific example, the compound having a perovskite structure may be one or two or more selected from $CH_3NH_3PbI_xCl_y$ (x is a real number of $0=x\le3$, y is a real number of $0=y\le3$, and $x+y=3$), $CH_3NH_3PbI_xBr_y$ (x is a real number of $0=x\le3$, y is a real number of $0=y\le3$, and $x+y=3$), $CH_3NH_3PbCl_xBr_y$ (x is a real number of $0=x\le3$, y is a real number of $0=y\le3$, and $x+y=3$), and $CH_3NH_3PbI_xF_y$ (x is a real number of $0=x\le3$, y is a real number of $0=y\le3$, and $x+y=3$), and may be one or two or more selected from $(CH_3NH_3)_2PbI_xCl_y$ (x is a real number of $0=x\le4$, y is a real number of $0=y\le4$, and $x+y=4$), $CH_3NH_3PbI_xBr_y$ (x is a real number of $0=x\le4$, y is a real number of $0=y\le4$, and $x+y=4$), $CH_3NH_3PbCl_xBr_y$ (x is a real number of $0=x\le4$, y is a real number of $0=y\le4$, and $x+y=4$), and $CH_3NH_3PbI_xF_y$ (x is a real number of $0=x\le4$, y is a real number of $0=y\le4$, and $x+y=4$).

As an example, in Formula 15 or Formula 16, $R_2$ may be (C1-C24)alkyl and $R_3$ may be hydrogen or (C1-C24)alkyl, more preferably, $R_2$ may be (C1-C7)alkyl and $R_3$ may be hydrogen or (C1-C7)alkyl, and still more preferably, $R_2$ may be methyl and $R_3$ may be hydrogen.

Preferably, the compound having a perovskite structure according to an exemplary embodiment of the present invention may be represented by the following Formula 17.

[Formula 17]

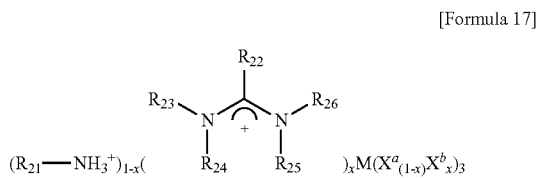

(In Formula 17, $R_{21}$ is (C1-C24)alkyl, (C3-C20)cycloalkyl, or (C6-C20)aryl, $R_{22}$ to $R_{26}$ are each independently hydrogen, (C1-C24)alkyl, (C3-C20)cycloalkyl, or (C6-C20) aryl, M is a divalent metal ion, $X^a$ is an iodine ion, $X^b$ is a bromine ion, and x is a real number of $0.01=x\le0.3$.)

As an example, the photoelectric conversion efficiency may be improved by adjusting a ratio of x in the compound represented by Formula 17 and having a perovskite structure.

As an example, in Formula 17, x may be a real number of $0.01=x\le0.2$.

As an example, in Formula 17, x may be a real number of $0.05=x\le0.1$.

Preferably, the light adsorption layer according to an exemplary embodiment of the present invention may be a compound having a perovskite structure containing lead.

The hole transport layer of the perovskite solar cell according to an exemplary embodiment of the present invention necessarily includes a compound represented by Formula 1 and having a carbazolylamino group as a substituent.

Specifically, the hole transport layer of the present invention necessarily includes a compound, as a hole transport material, represented by Formula 1 and having a carbazolylamino group as a substituent, may include a carbazolylamino group alone, and may further include an organic hole transport material, an inorganic hole transport material, or a mixture thereof, in addition to the compound represented by Formula 1 and having a carbazolylamino group as a substituent. In a case where the hole transport material is an inorganic hole transport material, the inorganic hole transport material may be an oxide semiconductor, a sulfide semiconductor, a halide semiconductor, or a mixture thereof, that has hole conductivity, that is, a p-type semiconductor. Examples of the oxide semiconductor may include NiO, CuO, $CuAlO_2$, and $CuGaO_2$, an example of the sulfide semiconductor may include PbS, and an example of the halide semiconductor may include $PBI_2$, but the present invention is not limited thereto.

In a case where the hole transport material is an organic hole transport material, a monomolecular or high molecular organic hole transport material (hole conductive organic material) may be included. The organic hole transport material may be any material used in a general inorganic semiconductor-based solar cell using an inorganic semiconductor quantum dot as a dye. A non-limiting example of a monomolecular or low molecular organic hole transport material may include, but is not limited to, one or two or more materials selected from the group consisting of pentacene, coumarin 6, 3-(2-benzothiazolyl)-7-(diethylamino)coumarin), zinc phthalocyanine (ZnPC), copper phthalocyanine (CuPC), titanium oxide phthalocyanine (TiOPC), 2,2',7,7'-tetrakis(N,N-p-dimethoxyphenylamino)-9,9'-spirobifluorene (Spiro-MeOTAD), copper(II) 1,2,3,4,8,9,10,11,15,16,17,18,22,23,24,25-hexadecafluoro-29H,31H-phthalocyanine (F16CuPC), boron subphthalocyanine chloride (SubPc), and N3(cis-di(thiocyanato)-bis(2,2'-bipyridyl-4,4'-dicarboxylic acid)-ruthenium(II)). The present invention is not limited to these materials.

The hole transport layer according to an exemplary embodiment of the present invention may be formed of a hole transport material including a compound represented by Formula 1 and having a carbazolylamino group as a substituent by a solution process. The solution process performed by an exemplary embodiment of the present invention may be, as an example, screen printing, spin coating, bar coating, gravure coating, blade coating, roll coating, or the like, but the present invention is not limited thereto.

Hereinafter, the present invention will be described in detail with reference to specific examples of the present invention, but the examples does not limit the scope of the claims of the present invention.

EXAMPLE 1

Preparation of Compound 1

Preparation of Compound 1-1

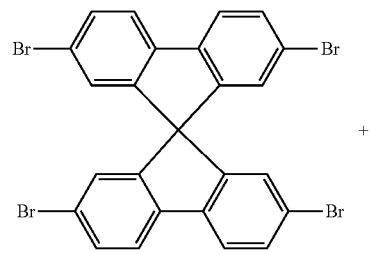

+

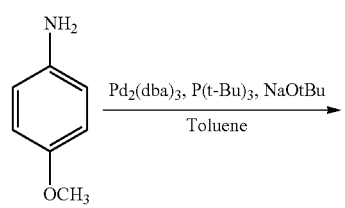

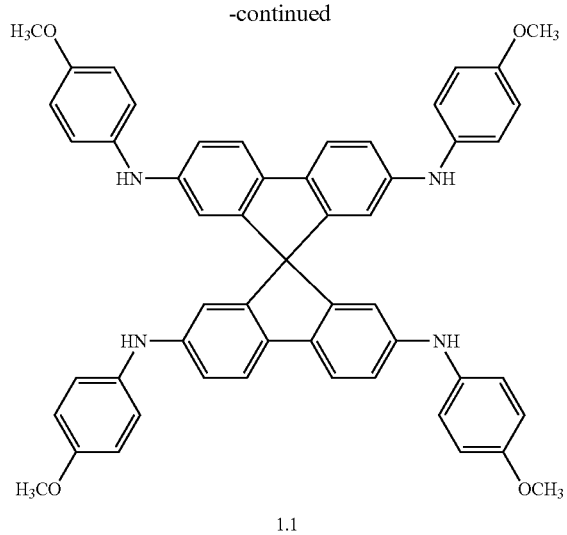

1-1

Tris(dibenzylideneacetone)dipalladium(0) (1.30 g, 1.4240 mmol), tri-tert-butylphosphine (0.58 g, 2.8480 mmol), and toluene (20 mL) were added to a 250 mL two-necked flask, and the solution was stirred in a nitrogen atmosphere for 10 minutes.
2,2',7,7'-Tetrabromo-9,9'-spirobi[9H-fluorene] (3 g, 4.7468 mmol) and toluene (20 mL) were added thereto and the solution was stirred for 10 minutes, sodium tert-butoxide (3.65 g, 37.9744 mmol), p-Anisidine (5.85 g, 47.468 mmol), and toluene (30 mL) were added, and then a reaction was performed at 130° C. for 30 hours. After completing the reaction, the reactant was extracted using ethyl acetate and NaCl water, and then moisture was removed with MgSO4. Purification was performed by column chromatography (ethyl acetate/hexane=40%), and recrystallization was performed using methylene chloride and hexane, thereby obtaining Compound 1-1 (2.16 g, 58%) in a powder form.

Preparation of Compound 1-2

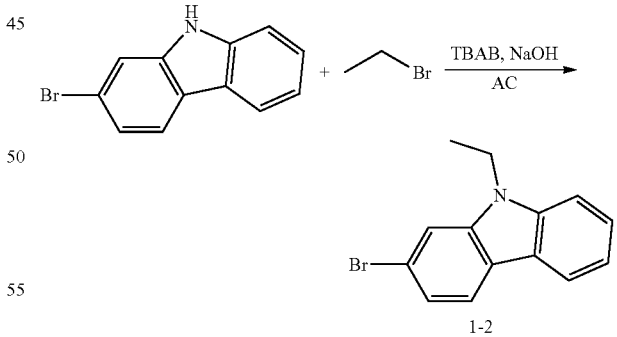

2-Bromocarbazole (5 g, 20.3161 mmol), tetrabutylammonium bromide (0.13 g, 0.4063 mmol), sodium hydroxide (1.22 g, 30.4742 mmol), and acetone (20 mL) were added to a 500 mL two-necked flask, and the solution was stirred in a nitrogen atmosphere for 10 minutes. Thereafter, when the solution became transparent, bromoethane (4.43 g, 40.6322 mmol) was slowly added dropwise to the solution, and a reaction was performed at 60° C. for 1 hour. After completing the reaction, the reactant was extracted using ethyl acetate and NaCl water, and then moisture was removed with MgSO₄. Purification was performed by column chromatography (ethyl acetate/hexane=20%), thereby obtaining a product (4.5 g, 80%) in a powder form.

¹H-NMR (CDCl₃, 400 MHz) δ=8.05 (d, 1H), 7.93 (d, 1H), 7.55 (s, 1H), 7.47 (t, 1H), 7.40 (s, 1H), 7.32 (s, 1H), 7.23 (d, 1H), 4.30 (q, 2H), 1.42 (t, 3H).

Preparation of Compound 1

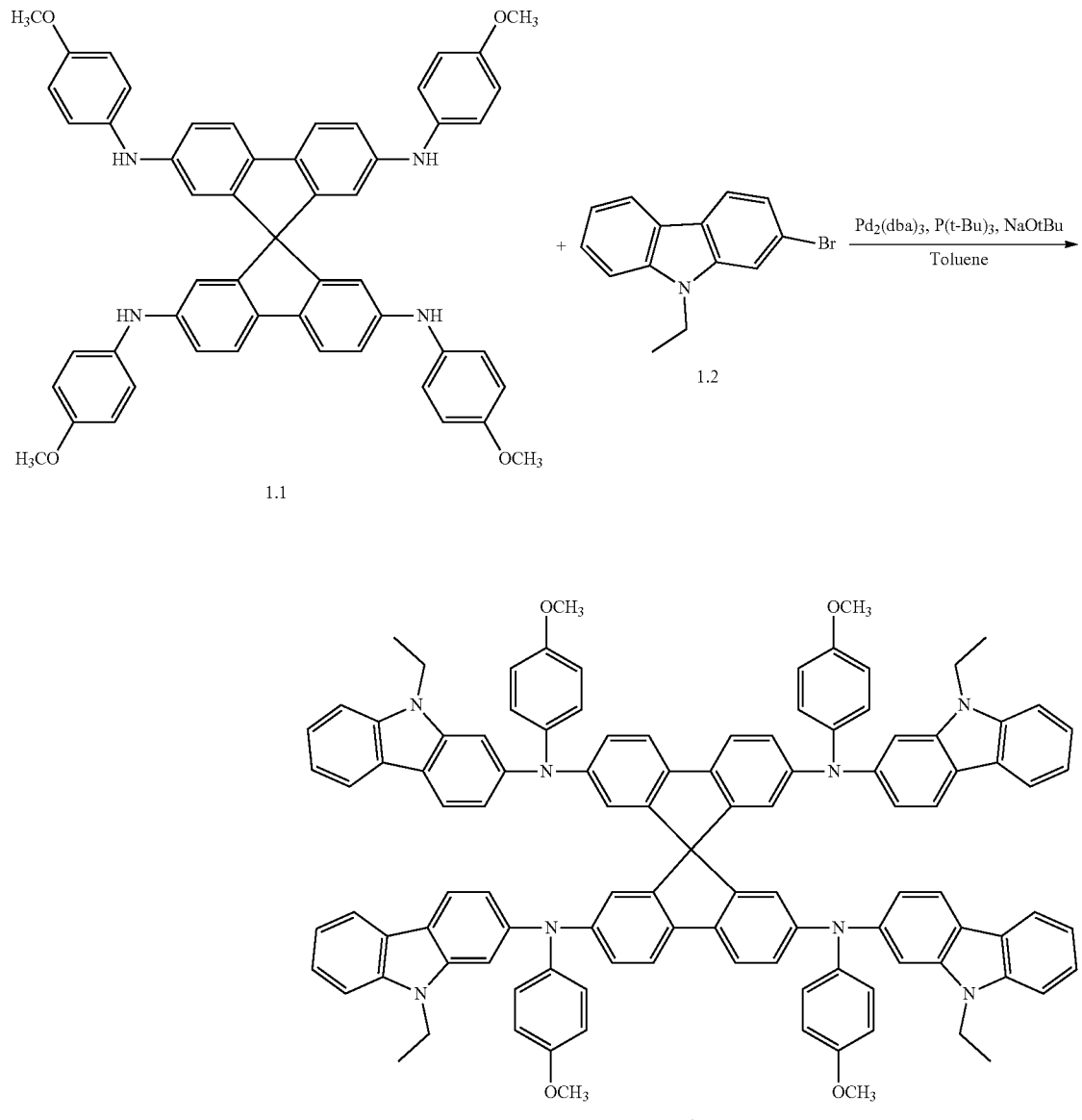

Tris(dibenzylideneacetone)dipalladium(0) (0.34 g, 0.3746 mmol), tri-tert-butylphosphine (0.15 g, 0.7492 mmol), and toluene (10 mL) were added to a 250 mL two-necked flask, and the solution was stirred in a nitrogen atmosphere for 10 minutes. Compound 1-2 (1.71 g, 6.2425 mmol) and toluene (10 mL) were added thereto and the solution was stirred for 10 minutes, sodium tert-butoxide (1.08 g, 11.2365 mmol), Compound 1-1 (1 g, 1.2485 mmol), and toluene (15 mL) were added, and a reaction was performed at 130° C. for 30 hours. After completing the reaction, the reactant was extracted using ethyl acetate and NaCl water, and then moisture was removed with MgSO₄. Purification was performed by column chromatography (ethyl acetate/hexane=20%), and reprecipitation was performed using methylene chloride and hexane, thereby obtaining Compound 1 (1.57 g, 80%) in a powder form.

¹H-NMR (Acetone-d6, 300 MHz) δ=8.01 (d, 4H), 7.93 (d, 4H), 7.50-7.30 (m, 12H), 7.19 (t, 4H), 7.07 (m, 12H), 6.87 (m, 16H), 6.71 (d, 4H), 4.12 (q, 8H), 3.79 (s, 12H), 1.23 (t, 12H).

m/z 1573 (M+).

EXAMPLE 2
Preparation of Compound 2
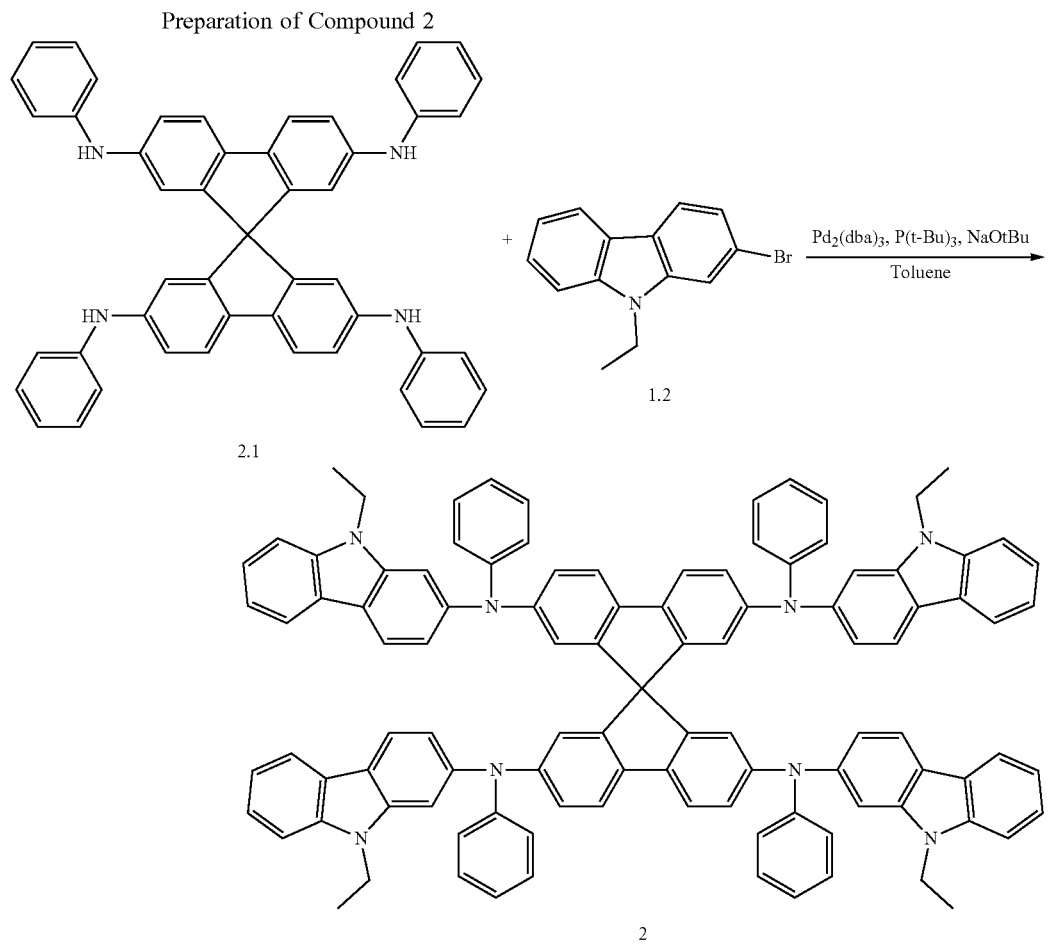
Compound 2 was prepared in the same manner as that of Example 1 except that Compound 2-1 was used instead of Compound 1-1 of Example 1.
m/z 1453 (M+).
EXAMPLE 3
Preparation of Compound 3
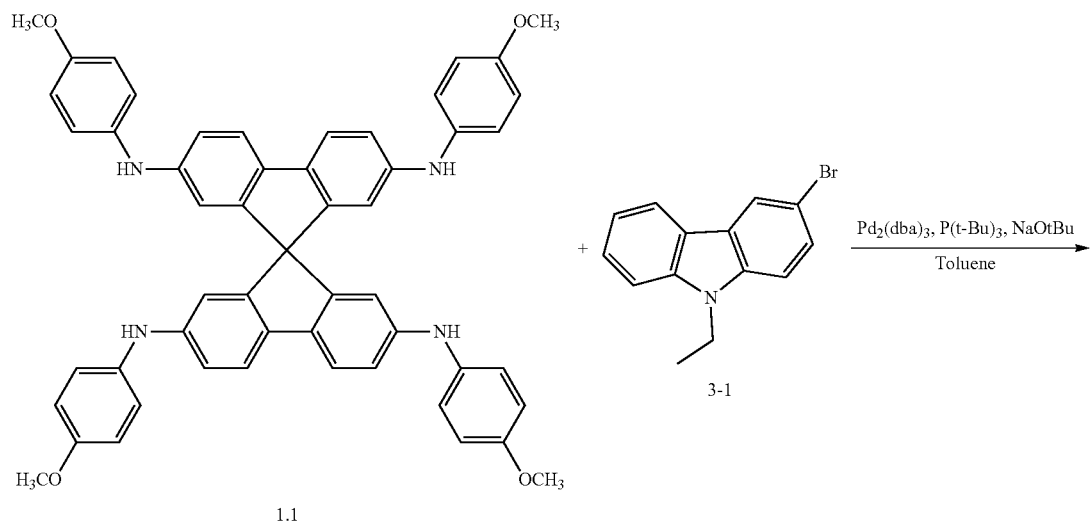

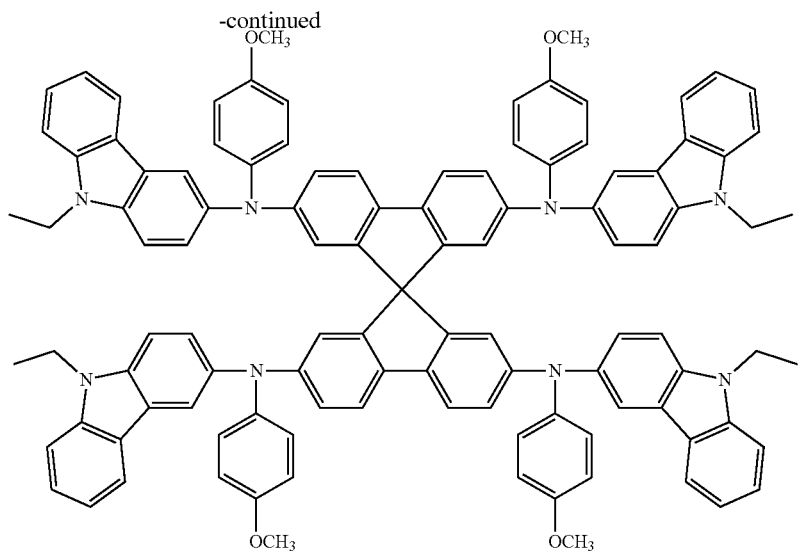
3
Compound 3 was prepared in the same manner as that of Example 1 except that Compound 3-1 was used instead of Compound 1-2 of Example 1.
$^1$H-NMR (Acetone-d6, 300 MHz) δ=8.00 (d, 4H), 7.87 (s, 4H), 7.60-7.40 (m, 12H), 7.27 (d, 4H), 7.11 (m, 8H), 7.01 (d, 8H), 6.87 (d, 8H), 6.72 (m, 4H), 6.61 (s, 4H), 4.43 (q, 8H), 3.77 (s, 12H), 1.39 (t, 12H).
m/z 1573 (M+).
EXAMPLE 4
Preparation of Compound 4
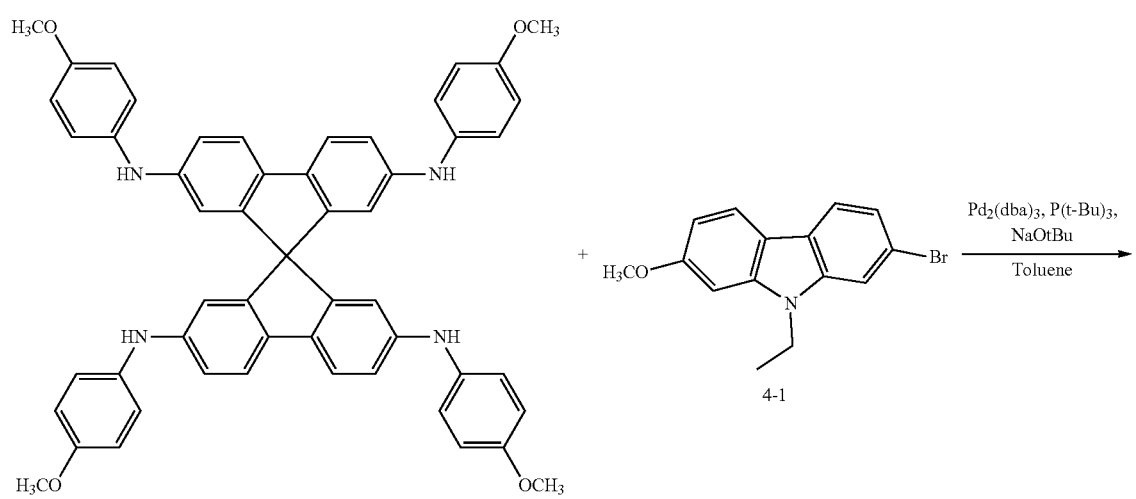

-continued

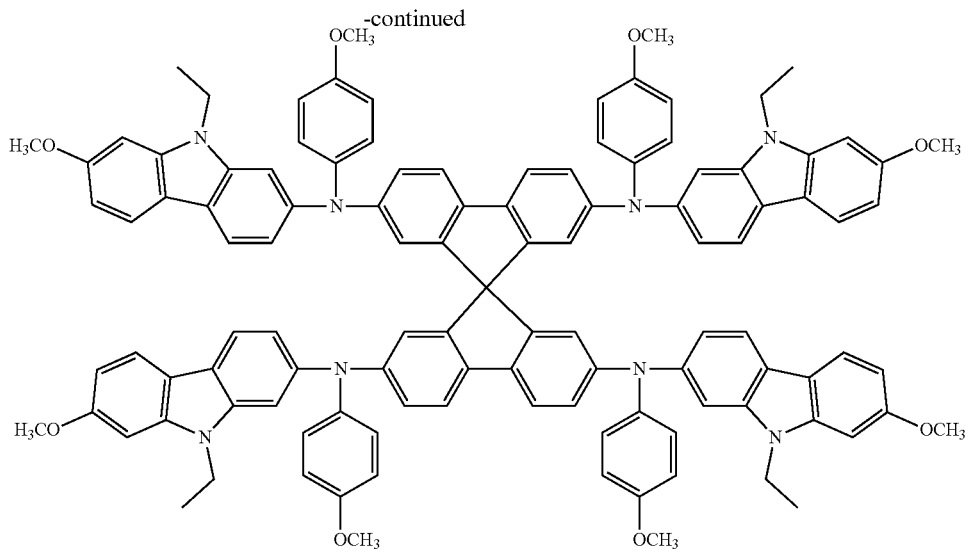

4

Preparation of Compound 4-1

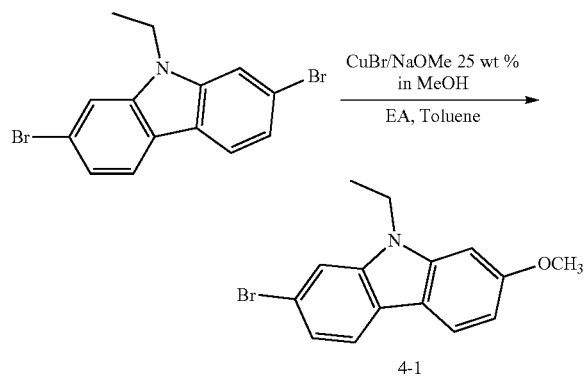

2,7-Dibromo-N-ethylcarbazole (3.14 g, 8.8937 mmol), copper bromide (0.64 g, 4.4469 mmol), ethyl acetate (5 mL), and toluene (5 mL) were added to a 500 mL two-necked flask, and the solution was stirred in a nitrogen atmosphere for 10 minutes, 2,7-dibromo-N-ethylcarbazole being synthesized in the same manner as that of the preparation process of Compound 1-2 of Example 1, except that 2,7-dibromocarbazole was used instead of 2-bromocarbazole in the preparation process of Compound 1-2 of Example 1. Thereafter, sodium methoxide solution (200 mL) was added and a reaction was performed at 80° C. for 3 hours. After completing the reaction, the reactant was extracted using methylene chloride and NaCl water, and then moisture was removed with MgSO4. Purification was performed by column chromatography (methylene chloride/hexane=25%), thereby obtaining a product (1.22 g, 45%) in a powder form.

Preparation of Compound 4

Compound 4 was prepared in the same manner as that of Example 1 except that Compound 4-1 was used instead of Compound 1-2 of Example 1.

m/z 1693 (M+).

EXAMPLE 5

Preparation of Compound 5

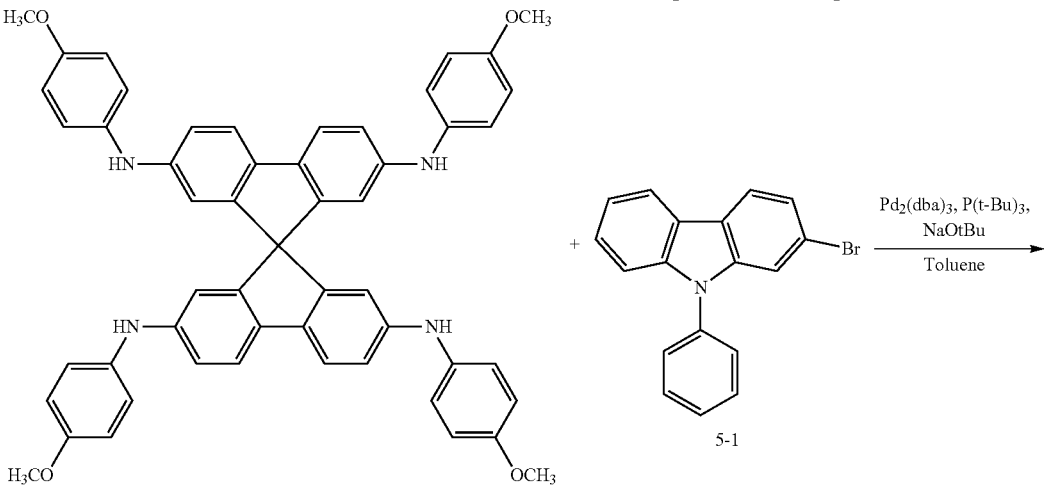

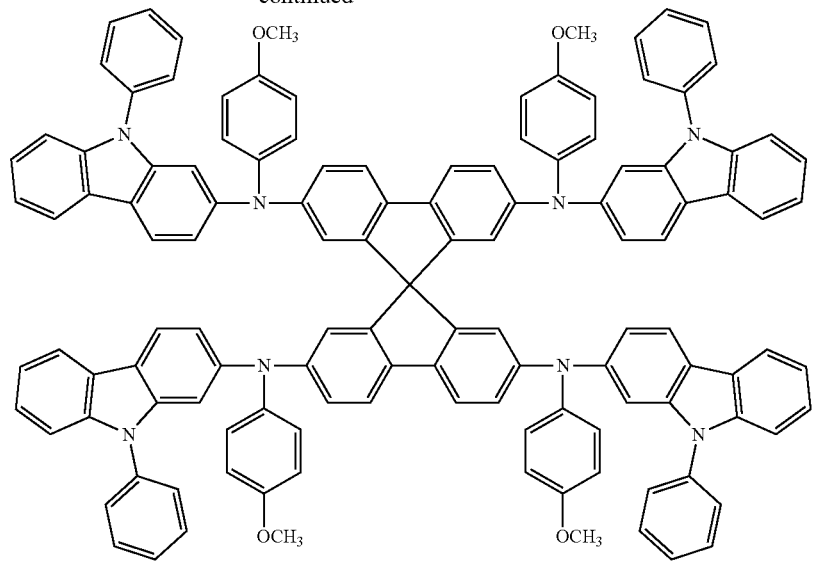
5
Compound 3 was prepared in the same manner as that of Example 1 except that Compound 5-1 was used instead of Compound 1-2 of Example 1.
m/z 1765 (M+).
EXAMPLE 6
Preparation of Compound 6
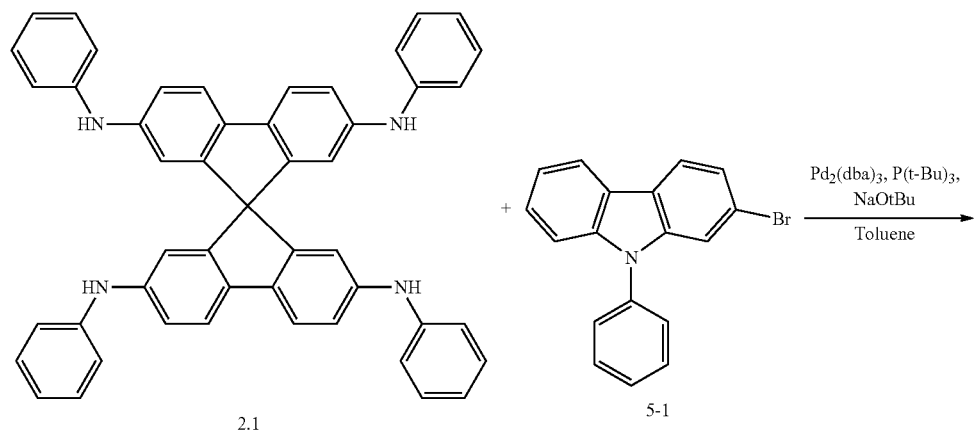

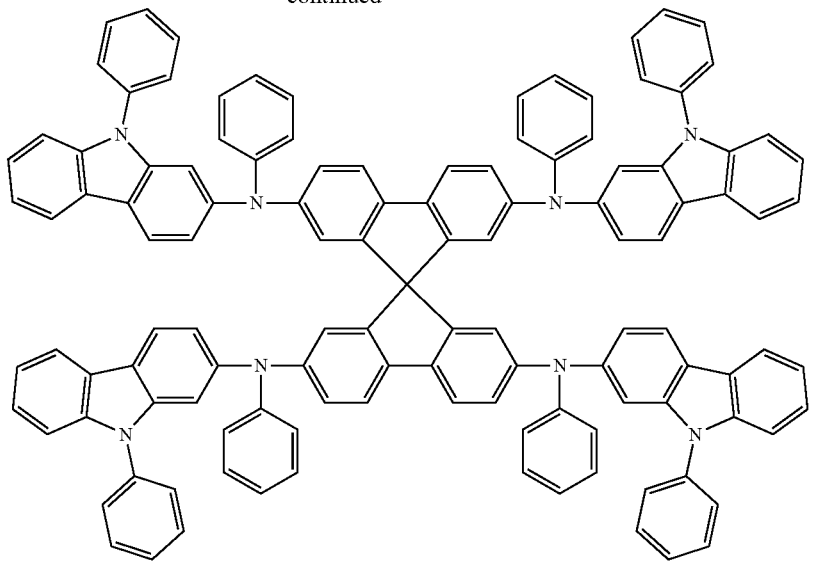

6

Compound 6 was prepared in the same manner as that of Example 1, except that Compound 2-1 was used instead of Compound 1-1 and Compound 5-1 was used instead of Compound 1-2 of Example 1.

m/z 1645 (M+).

EXAMPLE 7

Preparation of Compound 7

Preparation of Compound 7-1

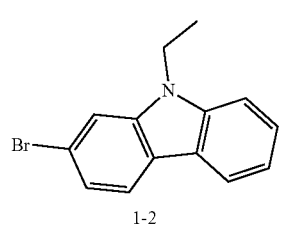

1-2

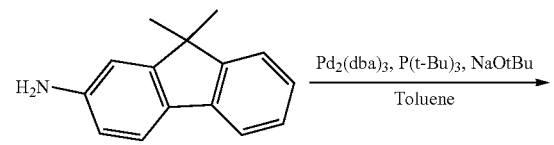

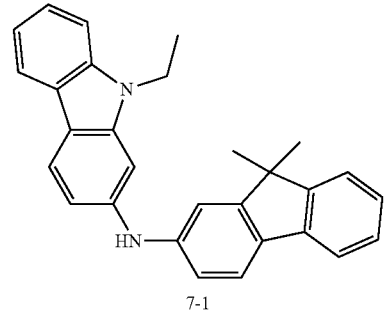

7-1

Tris(dibenzylideneacetone)dipalladium(0) (0.91 g, 0.9958 mmol), tri-tert-butylphosphine (0.40 g, 1.9916 mmol), and toluene (10 mL) were added to a 250 mL two-necked flask, and the solution was stirred in a nitrogen atmosphere for 10 minutes. Compound 1-2 (2.73 g, 9.9577 mmol) and toluene (10 mL) were added thereto and the solution was stirred for 10 minutes, sodium tert-butoxide (3.80 g, 39.8308 mmol), 2-amino-9,9-dimethylfluorene (2.5 g, 11.9492 mmol), and toluene (15 mL) were added, and a reaction was performed at 130° C. for 30 hours. After completing the reaction, the reactant was extracted using ethyl acetate and NaCl water, and then moisture was removed with MgSO4. Purification was performed by column chromatography (ethyl acetate/hexane=20%), and reprecipitation was performed using methylene chloride and hexane, thereby obtaining a product (2.08 g, 52%) in a powder form.

$^1$H-NMR (CDCl$_3$, 400 MHz) δ=7.99 (d, 2H), 7.74 (s, 1H), 7.68 (m, 2H), 7.45 (t, 3H), 7.28 (m, 3H), 7.13 (m, 3H), 7.03 (d, 1H), 4.35 (q, 2H), 1.48 (s, 6H), 1.37 (t, 3H).

Preparation of Compound 7

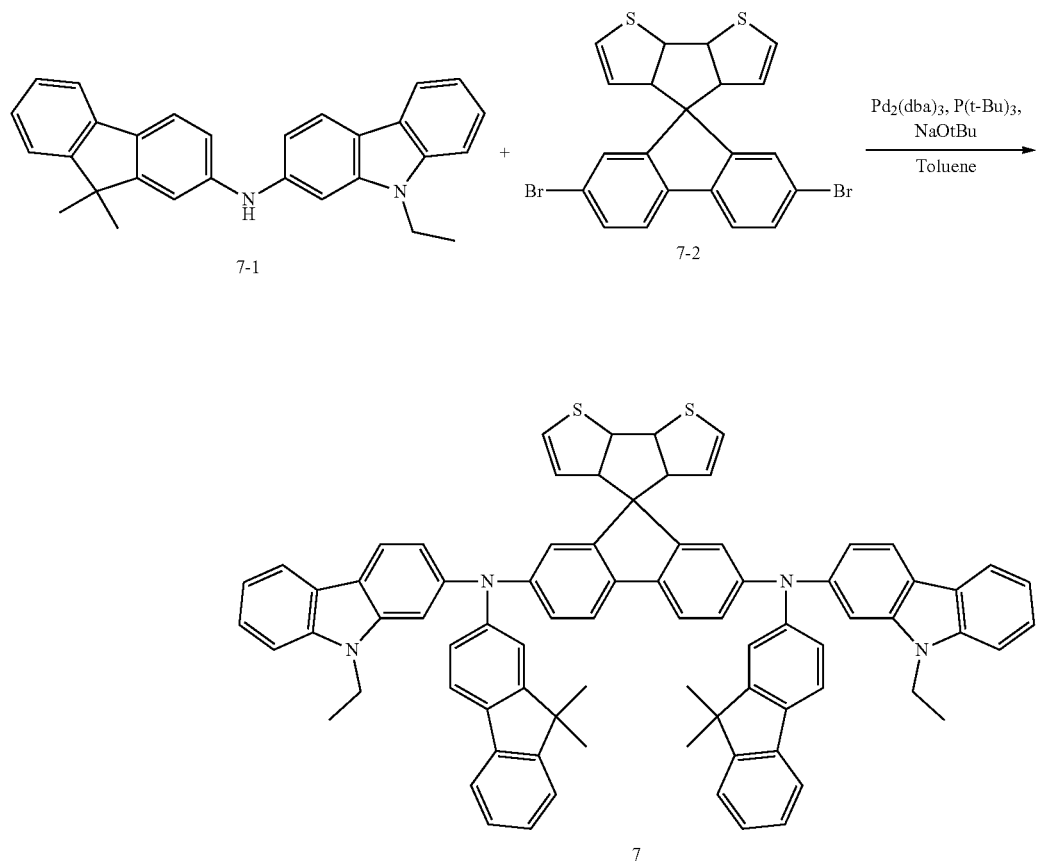 [SMILES: CCn1c2ccccc2c2ccc(Nc3ccc4c(c3)C(C)(C)c3ccccc3-4)cc21 ; Brc1ccc2c(c1)C1(c3cc(Br)ccc3-2)C2C=CSC2C2SC=CC21 ; CCn1c2ccccc2c2ccc(N(c3ccc4c(c3)C(C)(C)c3ccccc3-4)c3ccc4c(c3)C3(c5cc(N(c6ccc7c(c6)C(C)(C)c6ccccc6-7)c6ccc7c8ccccc8n(CC)c7c6)ccc5-4)C4C=CSC4C4SC=CC43)cc21]

Tris(dibenzylideneacetone)dipalladium(0) (0.34 g, 0.3726 mmol), tri-tert-butylphosphine (0.15 g, 0.7452 mmol), and toluene (10 mL) were added to a 250 mL two-necked flask, and the solution was stirred in a nitrogen atmosphere for 10 minutes. Compound 7-2 (1.52 g, 3.105 mmol) and toluene (10 mL) were added thereto and the solution was stirred for 10 minutes, sodium tert-butoxide (1.07 g, 11.179 mmol), Compound 7-1 (2 g, 4.968 mmol), and toluene (15 mL) were added, and a reaction was performed at 130° C. for 30 hours. After completing the reaction, the reactant was extracted using ethyl acetate and NaCl water, and then moisture was removed with MgSO$_4$. Purification was performed by column chromatography (ethyl acetate/hexane=20%), and reprecipitation was performed using methylene chloride and hexane, thereby obtaining Compound 7 (2.92 g, 52%) in a powder form.

m/z 1134 (M+).

EXAMPLE 8

Preparation of Compound 8

Preparation of Compound 8-1

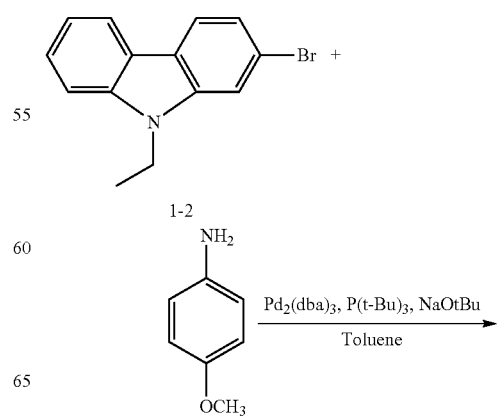

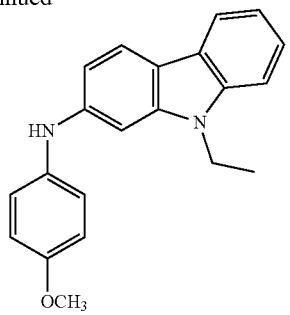

8-1

Compound 8-1 was prepared in the same manner as that of the preparation process of Compound 7-1 of Example 7, except that p-anisidine was used instead of 2-amino-9,9-dimethylfluorene in the preparation process of Compound 7-1 of Example 7.

m/z 316 (M+).

Preparation of Compound 8

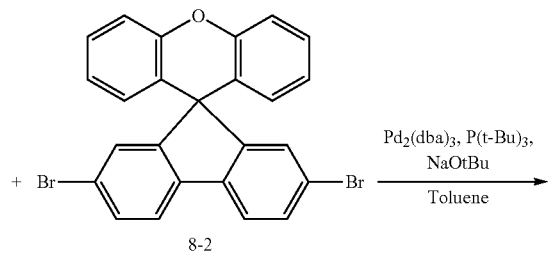

Compound 8 was prepared in the same manner as that of the preparation process of Compound 7 of Example 7, except that Compound 8-1 was used instead of Compound 7-1 and Compound 8-2 (Ark Pharm, Inc.) was used instead of Compound 7-2 in the preparation process of Compound 7 of Example 7.

m/z 960 (M+).

EXAMPLE 9

Preparation of Compound 9

Preparation of Compound 9-1

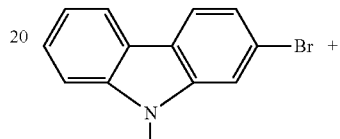

1-2

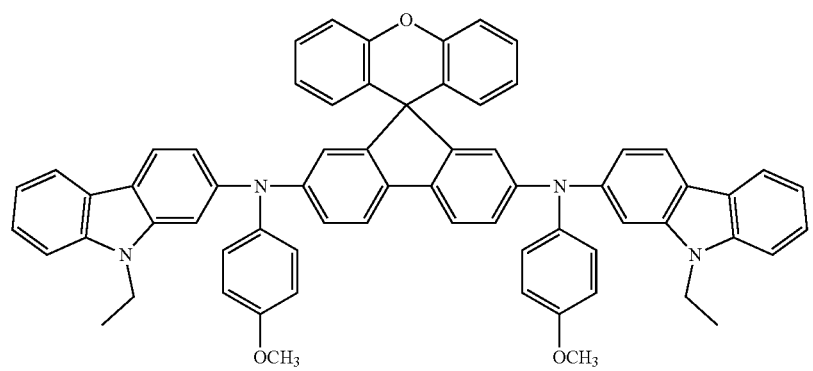

8

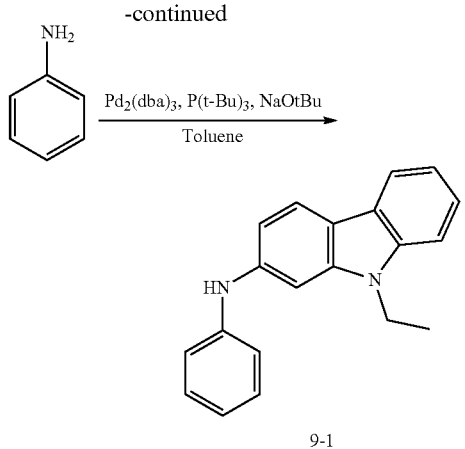

Compound 9-1 was prepared in the same manner as that of the preparation process of Compound 7-1 of Example 7, except that p-aniline was used instead of 2-amino-9,9-dimethylfluorene in the preparation process of Compound 7-1 of Example 7.

m/z 286 (M+).

Preparation of Compound 9

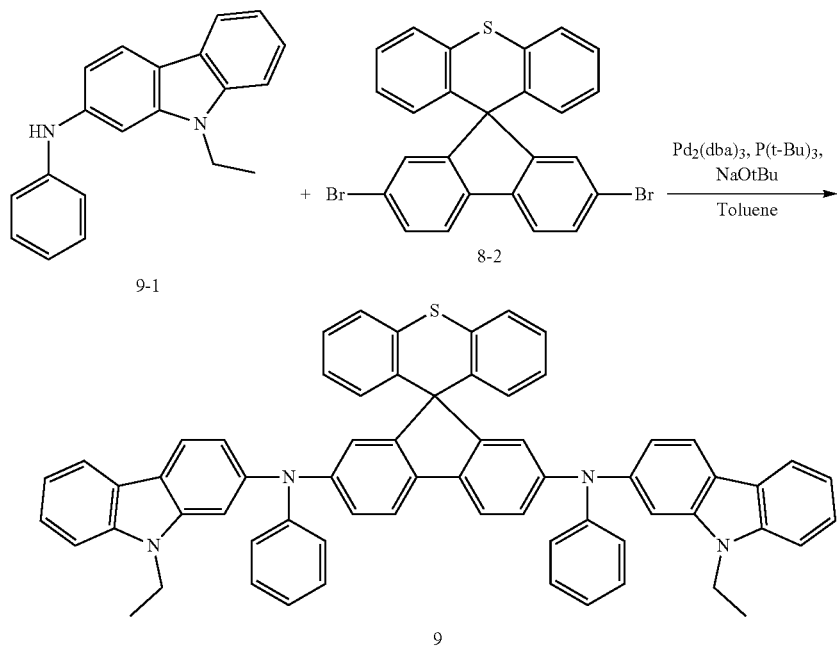

Compound 9 was prepared in the same manner as that of the preparation process of Compound 7 of Example 7, except that Compound 9-1 was used instead of Compound 7-1 and Compound 9-2 was used instead of Compound 7-2 in the preparation process of Compound 7 of Example 7.

m/z 916 (M+).

Comparative Example 1

Preparation of N2, N2, N2', N2', N7, N7, N7', N7'-octakis(4-methoxyphenyl)-9,9'spirobi[fluorene]-2,2'7,7'tetraamine (spiro-OMeTAD)

In nitrogen gas, 4,4'dimethoxydiphenylamine (2.00 g, 8.72 mmol), 2,2'7,7'tetrabromo-9,9'spirobi[9H-fluorene] (1.23 g, 1.94 mmol), sodium tertbutoxide (1.12 g, 11.6 mmol), tris(dibenzylideneacetone)dipalladium(0) (0.071 g, 0.078 mmol), and tri-tert-butylphosphine (0.025 g, 0.12 mmol) were added to a 50 mL two-necked flask, 15 mL of anhydrous toluene was added thereto, and the solution was stirred at 110° C. for 12 hours. The reaction mixture was cooled to room temperature, ethyl acetate was extracted, washing was performed with salt water, drying was performed with MgSO4 to remove a solvent, and separation and purification was performed by column chromatography (ethyl acetate/hexane=1/2), thereby obtaining a beige solid title compound (45%, 1.07 g).

$^1$H-NMR (CDCl$_3$, 500 MHz) δ=7.36 (d, 4H), 6.91 (d, 16H), 6.80 (br d, 4H), 6.76 (d, 16H), 6.56 (s, 4H), 3.77 (s, 24H).

$^{13}$C-NMR (CDCl$_3$, 125 MHz) δ=154.95, 149.93, 147.11, 141.45, 135.46, 124.96, 122.67, 119.72, 118.03, 114.31, 65.45, 55.42.

m/z 1124 (M+).

EXAMPLE 10

Manufacture of Perovskite Solar Cell

Manufacture of Porous TiO$_2$ Thin Film Substrate

A glass substrate coated with a fluorine-containing tin oxide (F-doped SnO$_2$ (FTO), 8 ohms/cm$^2$, Pilkington, hereinafter, referred to as FTO substrate (first electrode)) was cut into a size of 25×25 mm, and then an end portion thereof was etched to partially remove the FTO substrate.

On the cut and partially etched FTO substrate, a $TiO_2$ dense film having a thickness of 50 nm was prepared by a spray pyrolysis method, as a metal oxide thin film. The spray pyrolysis method was carried out using a 20 mM titanium diisopropoxide bis(acetylacetonate) solution (Aldrich), and the thickness of the film was adjusted in a manner of repeating the process of spraying the solution for 3 seconds and stopping spraying for 10 seconds, on the FTO substrate placed on a hot-plate maintained at 450° C.

An ethyl cellulose solution in which 10 wt % of ethyl cellulose was dissolved in ethyl alcohol was added to $TiO_2$ powder having an average particle size (diameter) of 50 nm (prepared by hydrothermal treatment of an aqueous titanium peroxocomplex solution in which 1 wt % is dissolved based on $TiO_2$ at 250° C. for 12 hours), at 5 ml per 1 g of $TiO_2$ powder, terpinol was added thereto and mixed at 5 g per 1 g of $TiO_2$ powder, and then ethyl alcohol was removed therefrom by distillation under reduced pressure, thereby preparing a $TiO_2$ paste.

2-Methoxyethanol was added to the prepared $TiO_2$ powder paste to prepare $TiO_2$ slurry for spin coating. $TiO_2$ slurry for spin coating was coated on a $TiO_2$ thin film of the FTO substrate by a spin coating method, heat treatment was performed at 500° C. for 60 minutes, the heat-treated substrate was immersed in a 30 mM $TiCl_4$ aqueous solution at 60° C. and left for 30 minutes, and then the substrate was washed with deionized water and ethanol, dried, and heat-treated again at 500° C. for 30 minutes, thereby preparing a porous $TiO_2$ thin film (porous electron transporter, thickness: 100 nm).

Preparation of Light Absorber Solution

In a 250 mL two-neck round flask, $NH_2CH=NH_2I$ (=FAI) and $CH_3NH_3Br$(=MABr) were mixed with $PbI_2$ and $PbBr_2$ dissolved in a mixed solution of DMF:DMSO (8:1, v/v), thereby preparing a $(FAPbI_3)_{0.90}(MAPbBr_3)_{0.10}$ perovskite solution having a concentration of 1.05 M.

Preparation of Perovskite Light Absorber

The porous $TiO_2$ thin film substrate (mp-$TiO_2$/bl-$TiO_2$/FTO) prepared above was coated with the light absorber solution ($(FAPbI_3)_{0.90}(MAPbBr_3)_{0.10}$ perovskite solution) prepared above at 1000 rpm for 5 seconds and coating was performed again at 5000 rpm for 1 second, and then drying was performed at 150° C. for 10 minutes, thereby preparing a light absorber. Here, 1 mL of diethyl ether was added dropwise to the substrate in the second spin coating step.

Preparation of Hole Conductive Layer Solution For Forming Hole Conductive Layer

In order to form a hole conductive layer, Compound 1, Compound 2, Compound 5, and Compound 6 of the present invention each were dissolved in chlorobenzene to prepare a hole conductive layer solution having a concentration of 30 mg/ml, and 21.5 μl of Li-bis(trifluoromethanesulfonyl) imide (Li-TFSI)/acetonitrile (170 mg/1 ml) and 21.5 μl of 4-tert-butylpyridine (TBP) were added thereto as an additive, thereby preparing a hole conductive layer solution.

Manufacture of Inorganic/Organic Hybrid Perovskite Solar Cell

On the composite layer on which the light absorber prepared above was formed on the porous electrode manufactured above, the hole conductive layer solution prepared above was spin-coated at 2000 rpm for 30 seconds, thereby forming a hole conductive layer. Thereafter, on the hole conductive layer, Au was vacuum-deposited by a thermal evaporator under high vacuum ($5 \times 10^{-6}$ torr or less) to form an Au electrode (second electrode) having a thickness of 70 nm, thereby manufacturing a solar cell in a form of Au/(HTM)/$(FAPbI_3)_{0.90}(MAPbBr_3)_{0.10}$/mp-$TiO_2$/bl-$TiO_2$/FTO. An active area of the electrode was 0.16 $cm^2$.

The characteristics of the manufactured solar cell are shown in Table 1.

EXAMPLE 11

A solar cell in a form of Au/(HTM)/$(FAPbI_3)_{0.95}(MAPbBr_3)_{0.05}$/mp-$TiO_2$/bl-$TiO_2$/FTO was manufactured in the same manner as that of Example 10, except that a $(FAPbI_3)_{0.95}(MAPbBr_3)_{0.15}$ perovskite solution was used instead of the $(FAPbI_3)_{0.90}(MAPbBr_3)_{0.10}$ perovskite solution in the preparation of the light absorber solution, and Compound 1 and Compound 3 each were used in the preparation of the hole conductive layer solution to form a hole conductive layer.

The characteristics of the manufactured solar cell are shown in Table 2.

Comparative Example 2

A solar cell was manufactured in the same manner as that of Example 10 except that spiro-OMeTAD was used instead of Compound 1 of the hole conductive layer solution, the characteristics of the manufactured solar cell are shown in Table 1.

In addition, in order to measure the stability of the perovskite solar cells of Example 10 and Comparative Example 2 of the present invention, the solar cells were left at a temperature of 60° C. and an average relative humidity of 20% for 500 hours, and then the photoelectric conversion efficiency was measured. The process was performed twice in total. That is, the stability each of the perovskite solar cells adopting Compound 1, Compound 2, Compound 5, Compound 6, and Spiro-OMeTAD Compound of Comparative Example 1 of the present invention is shown in Table 1 by comparing an initial value of the photoelectric conversion efficiency with a value after a certain period of time.

Comparative Example 3

A solar cell was manufactured in the same manner as that of Example 11 except that spiro-OMeTAD was used instead of Compound 1 of the hole conductive layer solution, and the characteristics of the manufactured solar cell are shown in Table 2.

In addition, in order to measure the stability of the perovskite solar cells of Example 11 and Comparative Example 3 of the present invention, the solar cells were left at a temperature of 60° C. and an average relative humidity of 20% for 500 hours, and then the photoelectric conversion efficiency was measured. The process was performed twice in total. That is, the stability each of the perovskite solar cells adopting Compound 1, Compound 3, and Spiro-OMeTAD Compound of Comparative Example 1 of the present invention is shown in Table 2 by comparing an initial value of the photoelectric conversion efficiency with a value after a certain period of time.

TABLE 1

| | Hole transport material | Jsc (mA/cm$^2$) | Voc (V) | FF (%) | PCE (%) | Photoelectric conversion efficiency after 500 hours/Initial photoelectric conversion efficiency (%) |
|---|---|---|---|---|---|---|
| Example 10 | Compound 1 | 24.7 | 1.00 | 78.9 | 19.7 | 90 |
| | Compound 2 | 24.6 | 0.98 | 77.1 | 18.6 | 88 |
| | Compound 5 | 24.6 | 0.96 | 76.3 | 17.5 | 82 |
| | Compound 6 | 24.7 | 0.92 | 78.5 | 16.9 | 78 |
| Comparative Example 2 | Spiro-OMeTAD | 24.7 | 0.932 | 79.9 | 18.5 | 50 |

*Solar cell in form of Au/(HTM)/(FAPbI$_3$)$_{0.90}$(MAPbBr$_3$)$_{0.10}$/mp-TiO$_2$/bl-TiO$_2$/FTO

TABLE 2

| | Hole transport material | Jsc (mA/cm$^2$) | Voc (V) | FF (%) | PCE (%) | Photoelectric conversion efficiency after 500 hours/Initial photoelectric conversion efficiency (%) |
|---|---|---|---|---|---|---|
| Example 11 | Compound 1 | 24.7 | 1.11 | 79.6 | 21.82 | 95 |
| | Compound 3 | 24.5 | 1.04 | 82.7 | 21.07 | 80 |
| Comparative Example 3 | Spiro-OMeTAD | 24.6 | 0.987 | 82.5 | 20.03 | 60 |

*Solar cell in form of Au/(HTM)/(FAPbI$_3$)$_{0.90}$(MAPbBr$_3$)$_{0.10}$/mp-TiO$_2$/bl-TiO$_2$/FTO As shown in Table 1 and Table 2, the solar cell adopting the compound represented by Formula 1 of the present invention as a hole transport compound had a very high efficiency as compared with the solar cell adopting the conventional hole transport compound.

Specifically, it could be seen that the solar cell adopting the spirobifluorene compound, as a hole transport compound, having an amino group substituted with cabazol and phenyl of the present invention as a substituent has increased open-circuit voltage (Voc) as compared with the solar cell adopting the spirobifluorene compound having an amino group substituted with only phenyl as the hole transport compound, thereby significantly increasing the photoelectric conversion efficiency.

In addition, as shown in Table 1 and Table 2, it could be seen that the stability of the perovskite solar cell adopting the compound of Examples of the present invention was excellent, and thus a high photoelectric conversion efficiency of the perovskite solar cell was maintained as compared with the initial value without a significant change over time. On the other hand, the photoelectric conversion efficiency in Comparative Example was significantly decreased.

The invention claimed is:

1. A perovskite solar cell comprising a compound represented by Formula 3 or Formula 4:

[Formula 3]

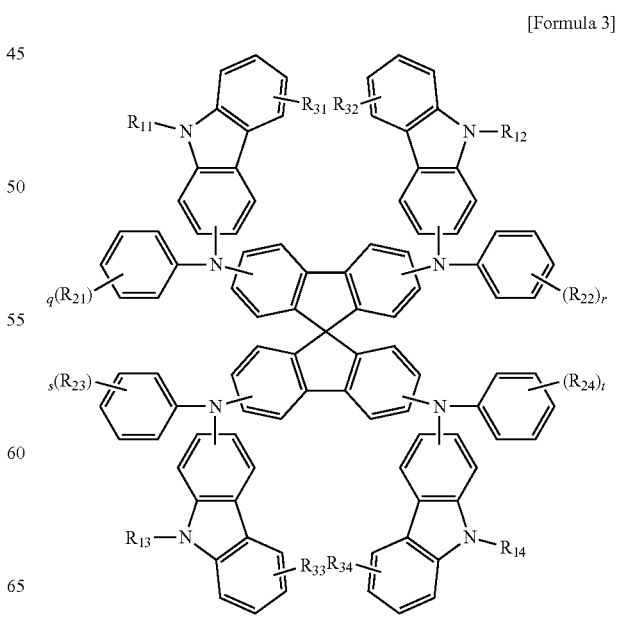

-continued

[Formula 4]

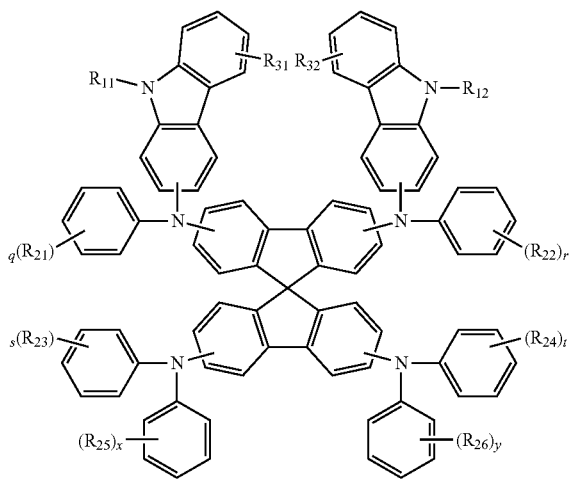

in Formula 3 and Formula 4, $R_{11}$ to $R_{14}$ are each independently hydrogen, (C1-C10) alkyl, or (C6-C12)aryl;

$R_{21}$ to $R_{26}$ are each independently (C1-C10)alkoxy, (C1-C20)alkylthio, (C6-C12)arylthio, or (C6-C12)aryloxy; q, r, s, t, x, and y are each independently an integer of 1 to 5, and when q, r, s, t, x, and y are 2 or more, $R_{21}$ to $R_{26}$ may be each independently the same as or different from each other; and $R_{31}$ to $R_{34}$ are each independently (C1-C10)alkoxy, (C6-C12)arylthio, (C6-C12)aryloxy, or (C1-C10)alkylthio.

2. The perovskite solar cell of claim 1, wherein $R_{11}$ to $R_{14}$ are each independently (C1-C5)alkyl or (C6-C12)aryl;

$R_{21}$ to $R_{26}$ are each independently (C1-C5)alkoxy; and q, r, s, t, x, and y are each independently an integer of 1 or 2.

3. The perovskite solar cell of claim 1, wherein the compound is used as a hole transport material.

4. The perovskite solar cell of claim 3, further comprising:
a first electrode;
an electron transport layer formed on the first electrode;
a light absorption layer formed on the electron transport layer and including a compound having a perovskite structure;
a hole transport layer including a compound represented by Formula 3 or Formula 4; and
a second electrode formed on the hole transport layer.

5. A compound represented by the following Formula 5:

[Formula 5]

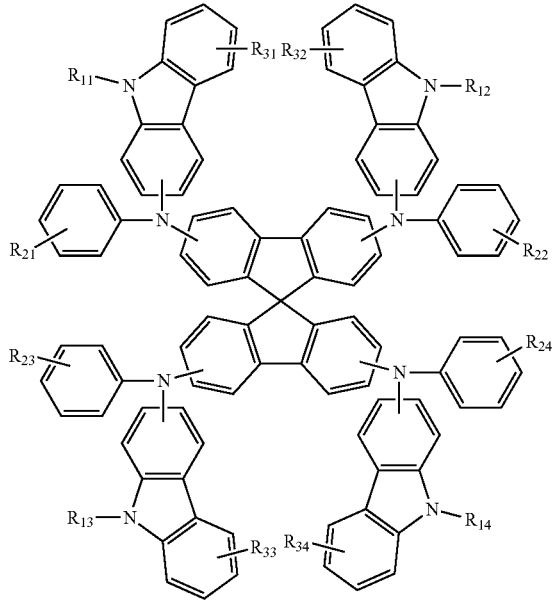

in Formula 5,
$R_{11}$ to $R_{14}$ are (C1-C10)alkyl;
$R_{21}$ to $R_{24}$ are each independently (C1-C10)alkoxy; and
$R_{31}$ to $R_{34}$ are each independently, (C1-C10)alkyl, (C1-C10)alkoxy, (C6-C12)aryl, (C6-C12)arylthio, (C6-C12)aryloxy, or (C1-C10)alkylthio.

* * * * *

UNITED STATES PATENT AND TRADEMARK OFFICE
CERTIFICATE OF CORRECTION

PATENT NO. : 11,177,403 B2
APPLICATION NO. : 16/627123
DATED : November 16, 2021
INVENTOR(S) : Jaemin Lee et al.

Page 1 of 2

It is certified that error appears in the above-identified patent and that said Letters Patent is hereby corrected as shown below:

In the Specification

In Column 5, Line 34 (Approx.), delete "(In" and insert --In--.

In Columns 15-16, Line 1, delete " 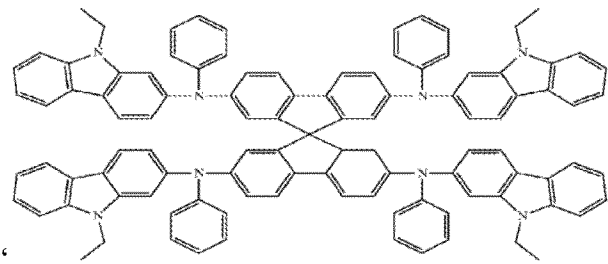 " and insert 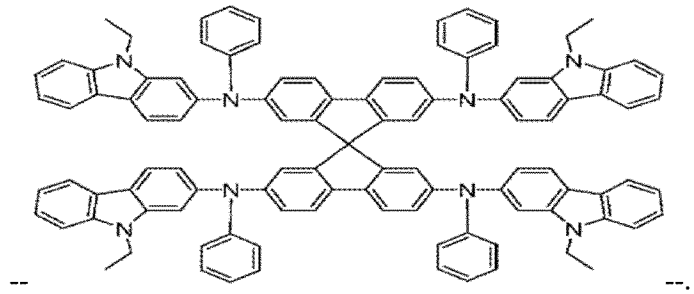 --.

In Column 99, Line 63, delete "PCT-KR$_{2014}$-C12727" and insert --PCT-KR2014-012727--.

In Column 100, Lines 47-48, delete "uorotetracyanoquinodimethane" and insert --fluorotetracyanoquinodimethane--.

In Column 103, Lines 9-10 (Approx.), delete "coumarin)" and insert --coumarin--.

In Column 104, Line 35, delete "MgSO4" and insert --MgSO$_4$--.

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,177,403 B2

In Column 122, Line 3, delete "tertbutoxide" and insert --tert-butoxide--.

In Column 124, Line 19, delete "$(MAPbBr_3)_{0.15}$" and insert --$(MAPbBr_3)_{0.05}$--.

In Column 126, Line 11, delete "cabazol" and insert --cabazole--.